United States Patent [19]
Yamauchi et al.

[11] Patent Number: 6,088,286
[45] Date of Patent: Jul. 11, 2000

[54] WORD LINE NON-BOOSTED DYNAMIC SEMICONDUCTOR MEMORY DEVICE

[75] Inventors: Tadaaki Yamauchi; Kazutami Arimoto, both of Hyogo, Japan

[73] Assignee: Mitsubishi Denki Kabushiki Kaisha, Tokyo, Japan

[21] Appl. No.: 09/159,617

[22] Filed: Sep. 24, 1998

[30] Foreign Application Priority Data

Jan. 8, 1998 [JP] Japan ................................. 10-002150
Mar. 25, 1998 [JP] Japan ................................. 10-077664

[51] Int. Cl.$^7$ ...................................................... G11C 8/00
[52] U.S. Cl. ................................. 365/230.06; 365/230.03
[58] Field of Search ........................ 365/230.06, 230.03, 365/210, 63, 69

[56] References Cited

U.S. PATENT DOCUMENTS 5,898,608  4/1999  Hirano ..................................... 365/145
5,905,685  5/1999  Nakamura ............................... 365/207

FOREIGN PATENT DOCUMENTS 6-103759  4/1994  Japan.

OTHER PUBLICATIONS

"A Storage–Node–Boosted RAM with Word Line Delay Compensation", K. Fujishima et al., 1982 IEEE International Solid–State Circuits Conference, pp. 66–67.

Primary Examiner—A Zarabian
Attorney, Agent, or Firm—McDermott, Will & Emery

[57] ABSTRACT

A memory array is divided into memory blocks each including a predetermined number of rows, and voltages on storage nodes are boosted by changing cell plate voltages in the memory block including a selected word line. An unselected word line is held at a negative voltage level when the selected word line is driven to a power supply voltage level. Thereby, it is possible to prevent movement of charges due to connection of a bit line with the storage node at the time of change in cell plate voltage of an unselected memory cell, and destruction of data in the unselected memory cell can be prevented. A dynamic semiconductor memory device not requiring a boosted voltage is provided.

20 Claims, 38 Drawing Sheets

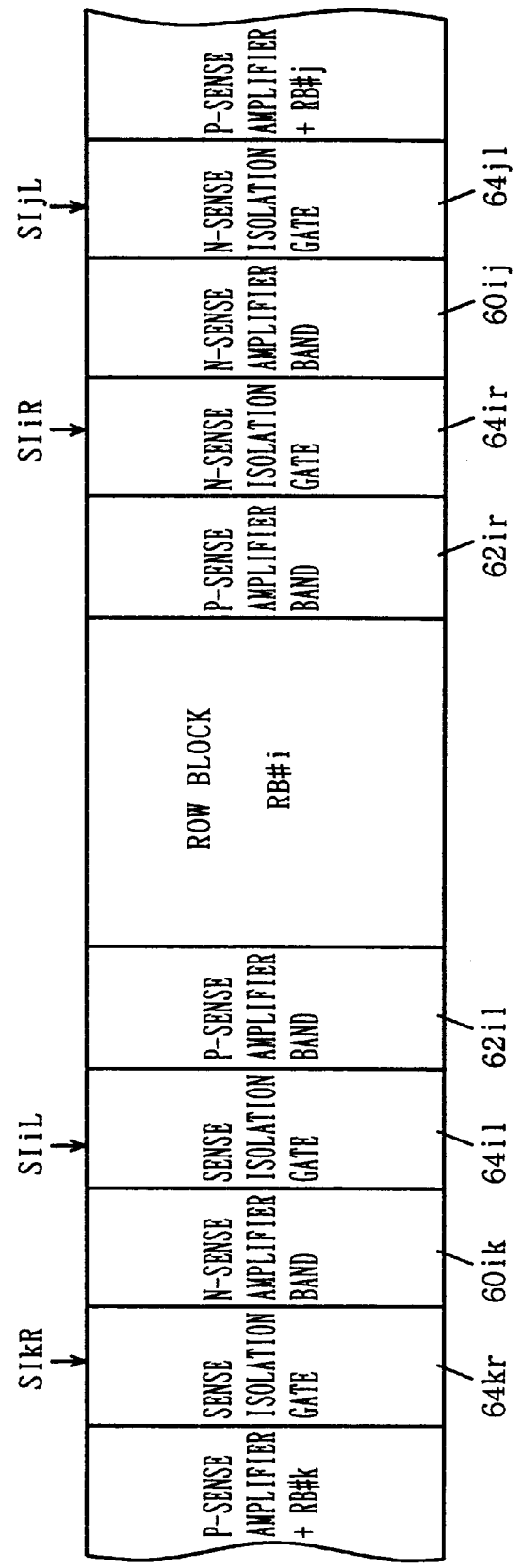
F I G. 23

TO MAIN WORD DRIVER

FIG. 57
| SELECTED SUB-WORD LINE SWL | SELECTED DUMMY SUB-WORD LINE |
|---|---|
| A0 OR C1 | DSWL0 |
| B0 OR D1 | DSWL1 |
| C0 OR A1 | DSWL2 |
| D0 OR B1 | DSWL3 |
FIG. 58
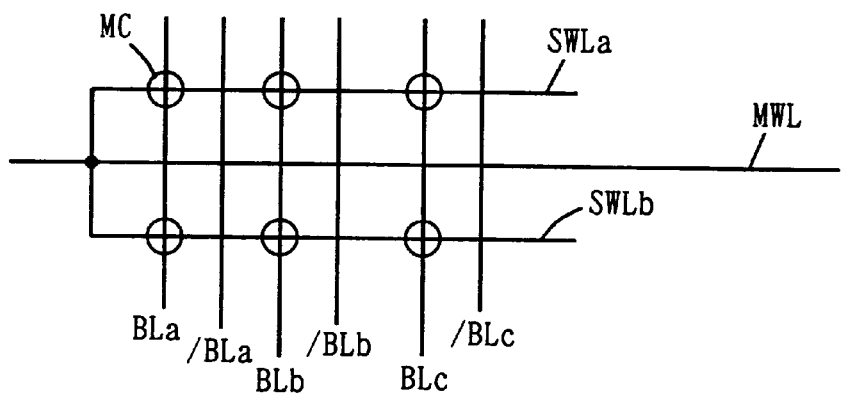
FIG. 59
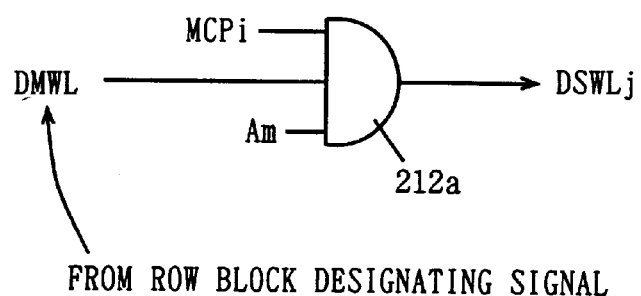
FROM ROW BLOCK DESIGNATING SIGNAL

WORD LINE NON-BOOSTED DYNAMIC SEMICONDUCTOR MEMORY DEVICE

BACKGROUND OF THE INVENTION

1. Field of the Invention

The present invention relates to a dynamic semiconductor memory device in which memory cells include capacitors, and in particular to a dynamic semiconductor memory device of a non-boosted word line type.

2. Description of the Background Art

FIG. 65 shows a structure of a main portion of a conventional dynamic semiconductor memory device, which will be referred to as a DRAM (dynamic random access memory). The structure of the conventional DRAM shown in FIG. 65 is disclosed by Fujishima et al, "A Storage-Node-Boosted RAM with Word Line Delay Compensation", 1982 IEEE International Solid-State Circuits Conference, pp. 66–67, for example.

FIG. 65 shows a structure related to one word line WL. Bit lines BL0–BLn are arranged in a direction crossing word line WL, and memory cells MC0–MCn are arranged corresponding to the crossings between word line WL and bit lines BL0–BLn. Each of memory cells MC0–MCn includes a capacitor CM for storing information and an access transistor MQ formed of an n-channel MOS transistor and turned on in response to a signal potential on word line WL connect one electrode (i.e., storage node) of capacitor CM to the corresponding one of bit lines BL0–BLn. In each of memory cells MC0–MCn, the other electrode (cell plate electrode node) of capacitor CM is connected to a common cell plate line CPL. Cell plate line CPL is connected to only the cell plate electrode nodes of capacitors CM of memory cells MC0–MCn connected to word line WL.

For adjusting the voltage level on cell plate line CPL, there is arranged a cell plate controller CVC which selectively controls a voltage Vg on cell plate line CPL in response to the signal potential on word line WL. Cell plate controller CVC includes a decoupling n-channel MOS transistor Q1 which receives on its gate a power supply voltage VDD, an n-channel MOS transistor Q2 which transmits power supply voltage VDD onto cell plate line CPL in response to activation of a precharge signal φP, and an n-channel MOS transistor Q3 which has a gate coupled to word line WL through MOS transistor Q1 and transmits a control signal φG onto cell plate line CPL.

When control signal φG rises to H-level and the gate potential of MOS transistor Q3 is raised by a self-boot strap effect, MOS transistor Q1 for decoupling prevents transmission of the voltage thus raised onto word line WL.

Word line WL is provided at its other end with a word line driver WDR for driving word line WL to a selected state at the power supply voltage VDD level in accordance with an address signal (not shown). Bit lines BL0–BLn are precharged to the power supply voltage VDD level. The cell plate controller CVC is provided for each word line, and controls only cell plate voltages Vg of the memory cells connected to the selected word line. An operation of the DRAM shown in FIG. 65 will now be described below with reference to a timing chart of FIG. 66.

In a standby cycle before time Ta, word line WL is at L-level (ground voltage level) and in the unselected state. Precharge instructing signal φP is at H-level, and MOS transistor Q2 in cell plate controller CVC is on so that cell plate voltage Vg on cell plate line CPL is at power supply voltage VDD level. Control signal φG is at H-level, but word line WL is at L-level of ground voltage level so that MOS transistor Q3 is off.

At time Ta, an active cycle starts in response to activation (i.e., L-level) of a row address strobe signal /RAS (not shown). In this active cycle, signal φG falls to L-level, and precharge instruction signal φP also falls to L-level. Thereby, MOS transistor Q2 is turned off. Then, word line driver WDR drives the word line arranged corresponding to the addressed row to the selected state in accordance with the address signal. If word line WL is selected, word line driver WDR drives word line WL to H-level of power supply voltage VDD level. Thereby, access transistors MQ in memory cells MC0–MCn are turned on to couple memory cell capacitors CM to corresponding bit lines BL0–BLn , respectively. In response to rising of the potential on word line WL, MOS transistor Q3 is turned on so that cell plate voltage Vg on cell plate line CPL lowers to the ground voltage level (signal φG is at L-level). As a result of this falling of cell plate voltage Vg, the potential on storage node of each memory cell capacitor CM is lowered by the capacitive coupling, and all charges accumulated in capacitor CM are transmitted onto corresponding one of bit lines BL0–BLn. In this manner, all the accumulated charges in each memory cell capacitor CM are transmitted onto corresponding one of bit lines BL0–BLn in response to the falling of cell plate voltage Vg, whereby the memory cell data is rapidly read onto corresponding one of bit lines BL0–BLn without an influence of delay in signal transmission on word line WL.

Then, sense amplifiers (not shown) operate to sense, amplify and latch the memory cell data. The potential on the bit line onto which the data at H-level is read attains power supply voltage VDD level, and the potential on the bit line onto which the data at L-level is read attains ground voltage VSS level at time Tc. The potential on the storage node (i.e., the electrode connected to the access transistor) of the capacitor of the memory cell storing H-level attains the voltage level of (VDD–VT) due to threshold voltage loss of access transistor MQ, where VT represents a threshold voltage of access transistor MQ.

Then, data is written into or read from the selected memory cell, and one memory cycle is completed. This completion of the memory cycle is implemented, e.g., by rising of row address strobe signal /RAS. In this operation, control signal φG first rises to H-level at time Td. Word line WL is at power supply voltage VDD level, and control signal φG is transmitted onto cell plate line CPL via MOS transistor Q3. When the voltage level of control signal φG rises, MOS transistor Q3 has its gate potential boosted to a voltage level higher than power supply voltage VDD through the self-boot strap effect, and MOS transistor Q3 transmits control signal φG at power supply voltage VDD level onto cell plate line CPL.

In response to rising of control signal φG, cell plate voltage Vg rises to power supply voltage VDD level. When cell plate voltage Vg rises from the ground voltage level to the power supply voltage level, capacitive coupling in capacitors CM of memory cells MC0–MCn raises the voltage levels on their storage nodes. In the memory cell storing H-level data, the voltage level on the storage node of the capacitor further rises from the level of (VDD–VT) by α·VDD, where α represents a coefficient of capacitive coupling. Word line WL is at power supply voltage VDD level, and the bit line connecting to the memory cell storing the H-level data likewise has the potential at power supply voltage VDD level. Therefore, access transistor MQ is turned off in accordance with the rising of voltage on the storage node caused by this capacitive coupling, and the storage node of the capacitor of the memory cell storing H-level data is raised to and held at a voltage level higher than power supply voltage VDD.

In the memory cells storing L-level data, the potentials on the storage nodes of the capacitors likewise rise. However, the sense amplifiers clamp the potentials on the bit lines for these memory cells, respectively. Therefore, the potential rising of these storage nodes are clamped by the corresponding sense amplifiers to the ground voltage level, respectively. Then, word line WL is driven to the unselected state, and subsequently precharge instructing signal φP attains H-level so that cell plate voltage Vg on cell plate line CPL is held at power supply voltage VDD level.

In the standby cycle (precharged state) at time Te, cell plate voltage Vg is held at the power supply voltage level, and the storage node of the memory cell storing H-level data is at the voltage level higher than power supply voltage VDD.

When word line WL is unselected, word line WL is at the ground voltage level, and MOS transistor Q3 maintains the off state. Even when control signal φG rises to H-level, MOS transistor Q1 maintains the on state so that the gate potential of MOS transistor Q3 is held at the ground voltage level by word line driver WDR, and cell plate voltage Vg is held at the power supply voltage VDD level. Therefore, the amount of charges accumulated in the memory cell do not change.

BY using the control signal as described above, the data at the voltage level higher than power supply voltage VDD can be held without setting the voltage level on the selected word line WL to a level higher than power supply voltage VDD. Therefore, it is not necessary to raise the voltage level on the word line WL to a level higher than power supply voltage VDD, and it is possible to prevent failure of the word lines and breakdown of the gate insulating films of the access transistors.

Such a case will now be considered that, in FIG. 65, word line WL is in the unselected state, and the cell plate controller CVC is operated. It is also assumed that the memory cell has stored data at L-level. Word line WL is in the unselected state and is at the ground voltage level. In this state, cell plate controller CVC lowers cell plate voltage Vg from power supply voltage VDD level to the ground voltage level. In this operation, as shown in FIG. 67, the capacitive coupling of the capacitor of the memory cell storing L-level data lowers the voltage level on storage node SN from the ground voltage level to a negative voltage level. Although word line WL is at the ground voltage level, storage node SN is at the negative voltage level, and the access transistor MQ is turned on so that charges flow from the corresponding bit line to this storage node at the negative voltage level, and the voltage level on storage node SN rises.

When the word line is selected, the sense amplifier does not yet operate so that the bit line is in the electrically floating state, and the voltage level on the bit line lowers as a result of flow of the charges into the memory cell storing the L-level data. Therefore, if the selected memory cell stores the data at H-level, the level of the read voltage of this selected memory cell lowers. This reduces a difference in voltage level between the H-level data and the L-level data upon operation of the sense amplifier, and therefore the sensing operation cannot be performed accurately. Even when cell plate voltage Vg is lowered after completion of the operation of the sense amplifier, the potential on the storage node likewise rises as a result of inflow of charges.

After the sensing operation is completed and reading/writing of data is completed, cell plate voltage Vg is raised from the ground voltage level to power supply voltage VDD level. As a result of this rising of voltage level on cell plate voltage Vg, the potential on storage node SN of the unselected memory cell is raised by the capacitive coupling. Therefore, the voltage level on storage node SN of the unselected memory cell which stores the L-level data rises, and the L-level data changes into the H-level data.

In this conventional word line non-boosting scheme, it is necessary to provide the cell plate controller corresponding to the respective word lines, and to isolate cell plate line CPL for each word line from those for the other word lines.

FIG. 68 schematically shows a structure of a DRAM cell in the prior art, and more specifically shows a cross sectional structure of memory cells of two bits.

In FIG. 68, P-type semiconductor substrate region 900 is provided at its surface with heavily doped N-type impurity regions 901a, 901b and 901c which are spaced from each other. Cell isolation insulating films 902a and 902b are formed around impurity regions 901a and 901c, respectively. A gate electrode layer 903a is arranged on a channel region between impurity regions 901a and 901b with a gate insulating film (not shown) thereunder. A gate electrode layer 903b is arranged on a channel region between impurity regions 901b and 901c with a gate insulating film (not shown) thereunder. Gate electrode layers 903c and 903d which form word lines connected to memory cells in other rows are arranged above cell isolation insulating films 902a and 902b, respectively. Impurity region 901b is connected to a conductive layer 904 forming a bit line. Conductive layer 904 is formed of, e.g., a first level aluminum interconnection layer, and is located at a layer higher than gate electrode layers 903a–903d forming the word lines.

A conductive layer 905a forming a storage node is connected to impurity region 901a, and a conductive layer 905b forming a storage node is connected to impurity region 901c. Each of conductive layers 905a and 905b has, for example, a T-shaped cross sectional structure, of which flat top portion is located above conductive layer 904 forming the bit line. Conductive layers 906 are faced to the top and side surfaces of conductive layers 905a and 905b. Conductive layer 906a and conductive layer 905a facing to each other form a memory cell capacitor. Conductive layer 906b and conductive layer 905b facing to each other form another memory cell capacitor.

As shown in FIG. 68, the capacitors are formed at a layer higher than gate electrode layers 903a–903c forming the word lines, whereby an area occupied by the capacitors in a plan view as well as the memory cell size are reduced, and the word line pitch is also reduced so that the degree of integration of the memory cells can be increased.

FIG. 69 shows a positional relationship between storage nodes of the memory cells and the word lines. FIG. 69 representatively shows four word lines WL0–WL3 and six memory cells. Bit lines BL and /BL are arranged perpendicularly to word lines WL0–WL3. Storage nodes SN0–SN5 of the memory cells have extended portions located above the corresponding word lines and the neighboring word lines, respectively. Each storage node is connected to the impurity region represented by a circle in FIG. 69. These storage nodes SN0–SN5 correspond to the conductive layer 905a or 905b in FIG. 68. The memory cells having storage nodes SN0 and SN1 are connected to bit line BL through a bit line contact BLC0.

The memory cells having storage nodes SN4 and SN5 are connected to bit line BL through a bit line contact BLC1. The memory cells having storage nodes SN2 and SN3 are connected to bit line /BL (not shown). Word line WL0 selects the memory cell having storage node SN2, and word line WL1 selects the memory cells having storage nodes SN0 and SN4. Word line WL2 selects the memory cells having storage nodes SN1 and SN5, and word line WL3 selects the memory cell having storage node SN3.

In the arrangement shown in FIG. 69, it is now assumed that the cell plate line for each row is to be isolated from those for the other rows. As shown in FIG. 69, the storage nodes are arranged along the direction of extension of the word lines. Therefore, it is impossible to employ such a structure that the electrode layer (906a, 906b) forming the cell plate node extends linearly in the row direction for each row. A cell plate line parallel with the word line may be arranged above the word line, and may be electrically connected to the cell plate nodes facing to the storage nodes. However, the word line is made of polycrystalline silicon and, usually, is electrically connected to an aluminum interconnection layer having a low resistance and formed at a higher level in a predetermined region (word line shunt region). The above arrangement of the cell plate lines parallel with word lines (WL0–WL3) complicates the layout of the cell plate lines in the word line shunt regions.

As another structure, the cell plate line may be disposed between the word lines, and may be electrically connected to the cell plate node serving as the capacitor electrode facing to the corresponding storage node. In this case, however, the cell plate line must have a larger line width than the word line for rapidly changing the cell plate voltage because the cell plate layer (906a, 906b) is made of polycrystalline silicon and has a large resistance value. Therefore, the condition on the pitch of the cell plate lines becomes extremely severe if the wide cell plate lines are to be arranged between the submicronized word lines. This results in problems such as increase in parasitic capacitance and defective insulation. Therefore, in the memory cell structure achieving a high density of, e.g., stacked capacitor cells as shown in FIG. 68, it is extremely difficult to divide the cell plate corresponding to the respective word lines.

If the word line is increased in length and connects an increased number of memory cells thereto, the cell plate lines divided corresponding to the word lines also increase in length, and the resistance thereof increases so that it is impossible to change rapidly the cell plate voltage, resulting in a problem that the times required for reading and writing data increase.

If the voltage level on the selected word line is to be raised to a level higher than the power supply voltage, it is necessary to increase the thickness of the gate insulating film of the memory cell transistor for ensuring intended breakdown voltage characteristics thereof. If a DRAM and a logic such as a processor are to be integrated on a common semiconductor chip, it is necessary that MOS transistors (insulated gate type field effect transistors) which are components of the logic have insulating films different in thickness from those of the memory cell transistors of the DRAM. In this case, therefore, the gate insulating films of the MOS transistors of the logic must be produced in manufacturing steps different from those of forming the gate insulating films of the memory cell transistors, resulting in increase in number of the manufacturing steps. If the peripheral transistor and the memory cell transistor have the gate insulating films of the same thickness, the operation speed of the peripheral transistor decreases.

SUMMARY OF THE INVENTION

An object of the invention is to provide a dynamic semiconductor memory device of a non-boosted word line scheme which allows writing of a sufficient amount of charges.

Another object of the invention is to provide a dynamic semiconductor memory device of a non-boosted word line scheme which is suitable to high integration.

Still another object of the invention is to provide a dynamic semiconductor memory device of a non-boosted word line in which change in cell plate voltage of an unselected memory cell does not cause malfunction.

Yet another object of the invention is to provide a semiconductor memory device of a non-boosted scheme which allows fast change in cell plate voltage.

A dynamic semiconductor memory device according to the invention includes a memory cell array having a plurality of memory cells arranged in rows and columns. Each of the plurality of memory cells includes a capacitor having a storage node for storing information and a cell plate electrode node for receiving a cell plate voltage.

The dynamic semiconductor memory device according to the invention further includes a plurality of word lines provided corresponding to the rows of the memory cells and each connected to the memory cells in the corresponding row; a row select circuit for driving the word line arranged corresponding to the addressed row to a first voltage level for the power supply voltage level for setting into a selected state, and for holding the unselected word lines at a second voltage level different in polarity from the first voltage; and cell plate drive circuits each provided corresponding to a set of the memory cells arranged in a predetermined number of rows for changing the voltage on the cell plate electrode nodes of capacitors of the memory cells in the corresponding set into a pulse form when the corresponding set includes the addressed row.

The cell plate voltages of the capacitors of the memory cells in the predetermined number of rows including the selected row are changed in a pulse form. Therefore, when the cell plate voltage changes, the voltage level exceeds the first voltage level through the capacitive coupling of the capacitor so that the memory cell connected to the selected row can store data at a voltage level greater in absolute value than the first voltage level even when the word line is in the first voltage level.

Meanwhile, the word line for the unselected memory cell is held at the second voltage level, and this second voltage level differs in polarity from the first voltage. Therefore, even when the voltage on the storage node of the memory cell capacitor changes in response to change in the cell plate voltage, the absolute value of the voltage on the storage node is smaller than that of the second voltage so that the memory cell transistor maintains the off state, and therefore destruction of data of the unselected memory cell can be prevented. The voltage level on the storage node changed by the capacitive coupling returns to the initial voltage level when the cell plate voltage changes to the predetermined value.

Since each cell plate drive circuit is provided corresponding to the predetermined number of rows, it is not necessary to provide for each row an independent circuit for changing the cell plate voltage, and therefore an area occupied by the circuit can be reduced. Further, it is not necessary to arrange an independent cell plate line corresponding to each row, and therefore the cell plate lines can be arranged easily with a margin.

The row select circuit may utilize an insulated gate field effect transistor receiving on its gate the first voltage and transmitting a word line select signal. In this structure, a voltage drop effect of this insulated gate field effect transistor can prevent transmission of a high voltage to the corresponding insulated gate field effect transistor. This ensures a reliability of the gate insulating film of the insulated gate field effect transistor which is a component of the row select circuit.

A dummy cell may be employed, whereby a voltage level on a reference bit line can be set accurately and selectively to H- and L-levels. Therefore, it is possible to increase not only a sense margin for the H-level data by increasing an amount of stored charges but also a sense margin for the L-level data so that a stable sensing operation can be ensured.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 23 schematically shows a structure of an array of a semiconductor memory device according to an embodiment 7 of the invention;

FIG. 57 is a table showing a correlation between sub-word lines are dummy sub-word lines in the selected state shown in FIG. 56;

FIG. 58 shows an example of arrangement of memory cells for sub-word lines;

FIG. 59 schematically shows a structure of a dummy sub-word line selection control portion for the arrangement of memory cell shown in FIG. 58;

DESCRIPTION OF THE PREFERRED EMBODIMENTS

[Embodiment 1]

Figure 1:
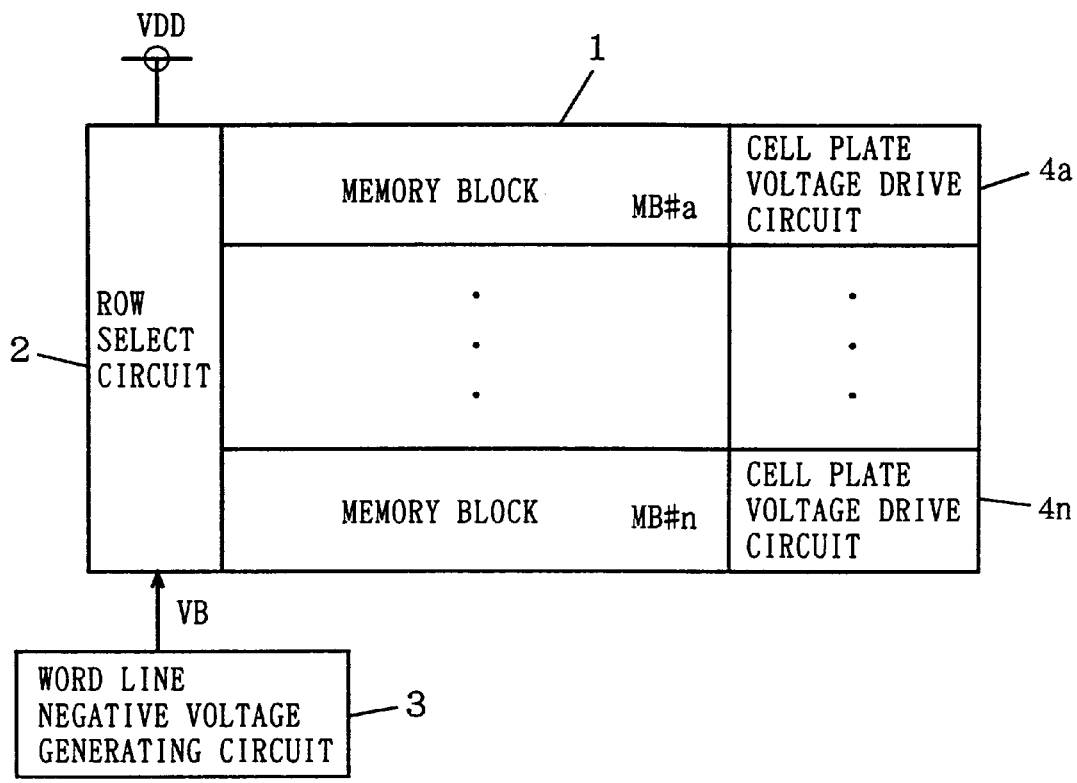
FIG. 1 schematically shows a whole structure of a semiconductor memory device according to an embodiment 1 of the invention.

FIG. 1 schematically shows a structure of a main portion of a semiconductor memory device according to an embodiment 1 of the invention. In FIG. 1, a memory cell array 1 is divided into a plurality of memory blocks MB#a–MB#n in a column direction. Each of memory blocks MB#a–MB#n includes a plurality of dynamic memory cells arranged in rows and columns. The dynamic memory cell is of a one transistor and one capacitor type. The capacitor may take any form such as a T-shaped, fin-like or a cylindrical form provided that it has a storage node (i.e., node connected to access transistor) for storing information and a cell plate electrode node forming the other electrode node.

A row select circuit 2 for selecting an addressed row in accordance with an address signal (not shown) is provided for memory cell array 1. Row select circuit 2 transmits a power supply voltage VDD onto a word line which is arranged corresponding to the addressed row, and also transmits a negative voltage VB, which is supplied from a word line negative voltage generating circuit 3, onto an unselected word line.

Cell plate voltage drive circuits 4a–4n are provided for memory blocks MB#a–MB#n, respectively. Each of cell plate voltage drive circuits 4a–4n changes the cell plate voltages of memory cell capacitors included in the corresponding memory block when the corresponding memory block includes a selected row. The cell plate voltage drive circuits for the unselected memory blocks (i.e., memory blocks not including the selected row) hold the cell plate voltages at a predetermined level of a voltage VCP.

According to the structure in which cell plate voltage drive circuits 4a–4n are arranged corresponding to memory blocks MB#a–MB#n each including a predetermined number of rows (word lines), respectively, only one cell plate voltage line is required for changing the cell plate voltages for a predetermined number of rows, and therefore the cell plate voltage line can be arranged with a margin.

In this case, memory blocks MB#a–MB#n are grouped on a unit of the plurality of rows (word lines). Therefore, the cell plate electrode layer can be arranged extending within each of memory blocks MB#a–MB#n, and the cell plate electrode layer itself can be utilized as the cell plate voltage line. Thereby, it is not necessary to provide an extra interconnection layer for transmitting the cell plate voltage so that the interconnection layout can be simplified.

Figure 2:
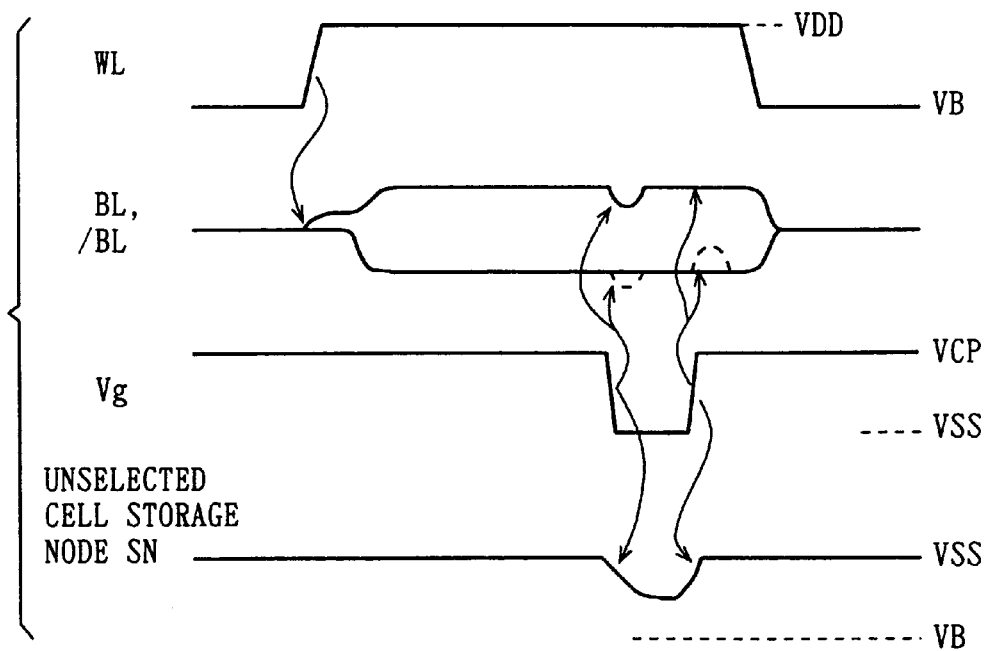
FIG. 2 a signal waveform diagram representing an operation of the semiconductor memory device shown in FIG. 1.

FIG. 2 is a signal waveform diagram representing an operation of the semiconductor memory device shown in FIG. 1. The operation of the semiconductor memory device shown in FIG. 1 will now be described below with reference to FIG. 2.

Row select circuit 2 drives word line WL, which corresponds to the addressed row, to power supply voltage VDD level in accordance with a received address signal (not shown). The unselected word lines are held at the voltage level of negative voltage VB. In accordance with this selection of the word line, charges corresponding to data stored in the memory cell are transmitted onto corresponding bit line BL or /BL. FIG. 2 shows by way of example a read waveform in the case where the selected memory cell holds the data at H-level.

Cell plate voltage drive circuits 4a–4n hold corresponding cell plate voltages Vg at a constant level of voltage VCP. It is now assumed that the unselected memory cell stores data at L-level, and storage node SN thereof is at a ground voltage VSS level.

When a difference in potential between bit lines BL and /BL increases sufficiently, a sense amplifier is activated to drive bit lines BL and /BL to H-level of power supply voltage VDD and a level of ground voltage VSS.

A precharge instruction, for example, is then applied, and a cell plate voltage drive circuit which is provided for the memory block including the selected row operates to drive the cell plate voltage Vg from a predetermined voltage VCP level to ground voltage VSS level. In accordance with this change in cell plate voltage Vg, the voltage levels on bit lines BL and /BL lower in accordance with the change in voltage on the storage node of the corresponding memory cell. However, the voltage levels on bit lines BL and /BL are clamped again at power supply voltage VDD level and ground voltage VSS level by the sense amplifier, respectively. Meanwhile, storage node SN of the unselected memory cell lowers from the level of ground voltage VSS to the negative voltage level. The voltage level on storage node SN is higher than the level of negative voltage VB generated by word line negative voltage generating circuit 3. Therefore, the gate voltage of the access transistor is lower than the source voltage thereof so that the access transistor maintains the off state. Accordingly, storage node SN of the unselected memory cell is prevented from being electrically connected to the corresponding bit line, and the voltage level on storage node SN of the unselected memory cell maintains the negative voltage level.

After elapsing of a. predetermined time, cell plate voltage Vg rises and returns to initial voltage VCP level. In response to the rising of cell plate voltage Vg, the voltage level on storage node SN of the unselected cell returns to ground voltage VSS level so that destruction of data is prevented. Meanwhile, the potentials of bit lines BL and /BL change in response to the rising of cell plate voltage Vg. It is now assumed that bit line BL is connected to the memory cell and data at H-level is read onto bit line BL. In this case, complementary bit line /BL is not connected to the memory cell. Therefore, the complementary bit line /BL is not affected by the rising of cell plate voltage Vg, and the voltage level thereof is held at L-level by the sense amplifier. Meanwhile, the voltage level on storage node of the memory cell storing H-level data rises to a level higher than power supply voltage VDD in accordance with rising of the level of cell plate voltage Vg. In this case, the gate voltage of the access transistor is at power supply voltage VDD level, and the access transistor is turned off to prevent transmission of charges on the boosted storage node onto corresponding bit line BL, and bit line BL is held by the sense amplifier at H-level. Meanwhile, when L-level data is read onto bit line /BL, the voltage level on bit line /BL lowers in accordance with lowering of the level of cell plate voltage Vg as shown by broken line in FIG. 2. In this case, however, the N-sense amplifier clamps the negative voltage on bit line /BL at the ground voltage level. Although the voltage level on bit line /BL receiving the read data at L-level rises at the time of rising of cell plate voltage Vg, it is clamped again at the ground voltage level by the N-sense amplifier because the bit line BL is at H-level, and an NMOS transistor connected to bit line /BL in the sense amplifier is on.

As described above, destruction of data of the unselected memory cells is prevented even if the cell plate voltages of capacitors of the memory cells in a plurality of rows are collectively driven at a time. Therefore, it is not necessary to apply a boosted voltage onto the selected word line. Accordingly, the gate insulating film of the peripheral MOS transistor can be made equal in thickness to the gate insulating film of the access transistor, and the manufacturing process can be simplified.

In a conventional structure wherein a logic and a DRAM are integrated on the same semiconductor chip, all the MOS transistors, i.e., components thereof may have the gate insulating films of the same thickness, in which case the thickness of the gate insulating films of these MOS transistors is determined by the film thickness of the gate insulating films of the memory cell transistors. Therefore, by driving the word line to the power supply voltage level, as is done in the invention, it is possible to reduce a film thickness of the gate insulating film of the access transistor, and thereby it is possible to reduce the film thickness of the gate insulating films of the peripheral MOS transistors and logics. Accordingly, the thickness of the gate insulating film can be reduced in accordance with a scaling rule, and operation characteristics of the MOS transistors can be improved.

[Magnitude of Negative Voltage VB]

Figure 3A:
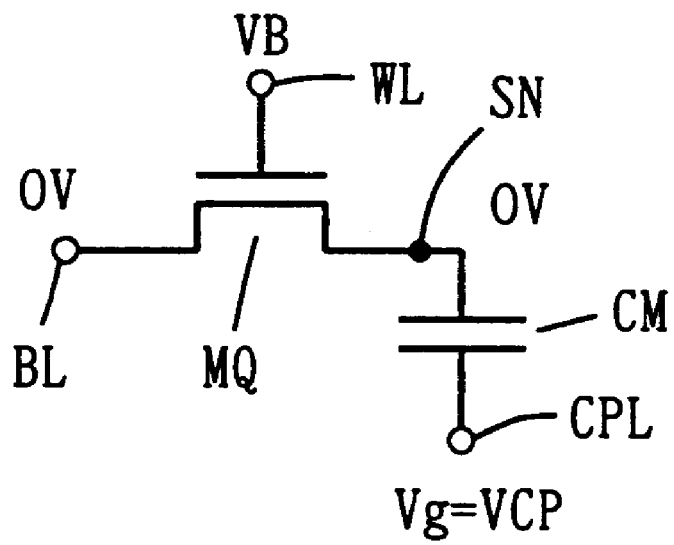
FIGS. 3A and 3B show voltages the respective nodes of memory cell in accordance with change in cell plate voltage.

FIG. 3A shows a voltage applied to the unselected memory cell. In this unselected memory cell, word line WL is at negative voltage VB level, and bit line BL is at the level of ground voltage VSS (0 V) because the sensing operation is already completed. Storage node SN holds L-level data (ground voltage 0 V). Cell plate voltage Vg does not yet changed, and is at the level of constant reference voltage VCP.

Figure 3B:
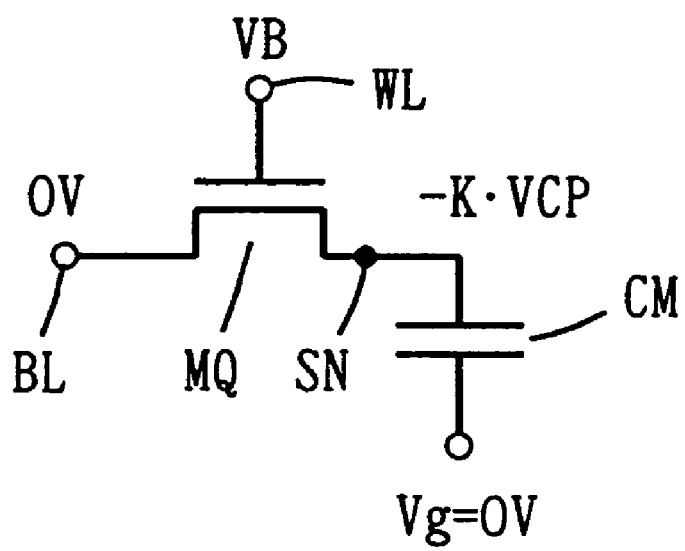

As shown in FIG. 3B, cell plate voltage Vg is lowered to the ground voltage level. The capacitive coupling of memory cell capacitor CM sets the voltage level on storage node SN to $-K \cdot VCP$, where K represents a coupling coefficient and its maximum value is 1. In access transistor MQ, since the voltage level on storage node SN is lower than that on bit line BL, storage node SN serves as a source. Therefore, access transistor MQ maintains the off state if a voltage difference between the gate and the source is not higher than the threshold voltage. Thus, negative voltage VB and reference voltage VCP must satisfy the following condition.

$$VB + K \cdot VCP < VTH$$

where VTH represents the threshold voltage of access transistor MQ. The following relation can be derived from the above relation.

$$|VB| + VTH > K \cdot VCP$$

If a substrate bias voltage VSUB which is applied to the substrate region of the memory array is used as negative voltage VB, precharge voltage VCP of the cell plate may be determined to satisfy the above relation. If a dedicated word line negative voltage generating circuit is utilized for driving the word line, word line negative voltage VB and cell plate precharge voltage VCP may be set to appropriate values satisfying the above relation in view of a reliability of the MOS transistor elements.

According to an embodiment 1 of the invention, as described above, the negative voltage is transmitted onto the unselected word line. Therefore, destruction of data of the unselected memory cells can be prevented even if the cell plate voltages of the memory cell capacitors belonging to a plurality of rows are entirely controlled at a time. Therefore, it is not necessary to boost the voltage on the word line, and failure of the word line, gate insulating film and others can be prevented, resulting in increase in derive reliability.

Since the cell plate voltages of each group including a plurality of rows are entirely controlled or collectively at a time, the cell plate lines for transmitting the cell plate voltages can be easily arranged with a margin.

[Embodiment 2]

Figure 4:
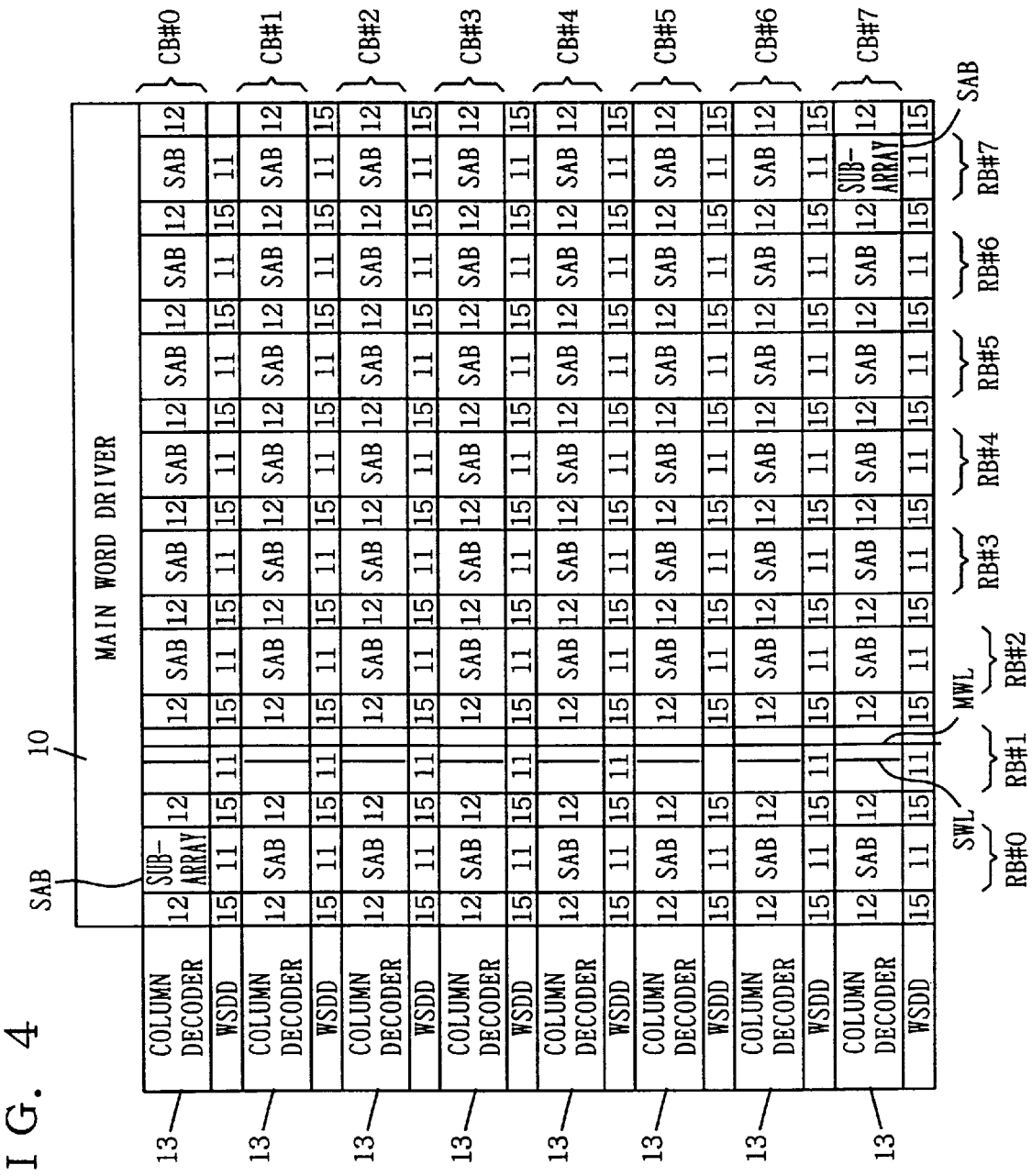
FIG. 4 schematically shows a structure of a main portion of a semiconductor memory device according to an embodiment 2 of the invention.

FIG. 4 schematically shows a structure of an array of a semiconductor memory device according to an embodiment 2 of the invention. In FIG. 4, memory cell array 1 is divided into a plurality of sub-arrays SAB in the row and column directions. FIG. 4 shows, by way of example, sub-arrays SAB arranged in 8 rows and 8 columns. Sub-arrays SAB arranged in the same row form a row block. Therefore, the structure shown in FIG. 4 includes eight row blocks RB#0–RB#7. Sub-arrays SAB arranged in the same column form a column block. Therefore, the structure shown in FIG. 4 includes eight column blocks CB#0–CB#7. Each sub-array SAB has a plurality of memory cells arranged in rows and columns.

In each sub-array SAB, a sub-word line SWL is arranged corresponding to each row. Each sub-word line SWL is connected to the memory cells in the corresponding row in the corresponding sub-array. Main word lines MWL are arranged extending in the row direction. Each main word line MWL is arranged commonly to all the sub-arrays included in the corresponding one row block. Each main word line MWL is arranged commonly to a predetermined number of sub-word lines in each sub-array included in the corresponding row block. Main word line MWL is selectively driven to the selected and unselected states by a main word driver 10.

For selecting one sub-word line from the predetermined number of sub-word lines arranged for each main word line MWL, there are arranged word line sub-decode signal line drivers WSDD. Word line sub-decode signal line driver WSDD generates a word line sub-decode signal transmitted in the column direction for selecting sub-word lines in the corresponding column block. Between the sub-arrays SAB neighboring to each other in the row direction, there is arranged a sub-word driver 11 which drives the sub-word line to the selected state in accordance with the word line sub-decode signal received from the word line sub-decode signal line driver and the signal on the main word line. Sub-word drivers 11 are provided corresponding to the sub-arrays SAB, respectively, and each can selectively drive the sub-word lines in the corresponding sub-array to the selected and unselected states in accordance with the received word line sub-decode signal and the signal on the main word line.

Sense amplifier bands 12 are arranged in areas between the sub-arrays neighboring to each other in the column direction, respectively. Each sense amplifier band 12 in this embodiment 2 is provided only for corresponding one sub-array, and does not have a shared sense amplifier structure. However, as will be described later, sense amplifier band 12 may have a shared sense amplifier arrangement.

Column decoders 13 are provided for column blocks CB#0—CB#7, respectively. Each column decoder 13 selects a predetermined number of columns in the corresponding column block.

In the array arrangement shown in FIG. 4, such a structure may be employed that one of main word lines MWL is driven to the selected state, and column decoder 13 selects a predetermined number of memory cells from each of sub-arrays SAB included in row block RB#i (i=0–7) including selected main word line MWL. Data lines may have a hierarchical data line structure including global and local lines, and a plurality of main word lines may be simultaneously driven to the selected state. Such a structure may be employed that, when one of main word lines MWL is selected, the sub-word lines are driven to the selected state in a predetermined number of sub-arrays in row block RB#i including the selected main word line. In this case, the word line sub-decode signal line driver selects the column block, and the column decoder provided for the column block thus selected is activated. No problem arises if a predetermined number of bits of the row address signal bits are used for selecting a column block. This merely relates to address allocation, and can be deemed as selection of the addressed memory cell. If a predetermined number of sub-arrays are selected in one row block, all column decoders 13 may perform the decoding operation. This is because the bit lines of the unselected sub-array hold the precharge voltage level, and destruction of the data does not occur even if the column selection is performed. Although any one of the foregoing structures may be employed, the following description will be given, for simplicity reason, of the structure wherein one of main word lines MWL is selected, and all sub-arrays SAB in the row block including selected main word line MWL are driven to the selected state (all sub-word lines SWL are selected).

In the arrangement shown in FIG. 4, a cell plate voltage drive circuit 15 is arranged at each of regions between sense amplifier bands 12 and between sub-word drivers 11. The cell plate voltage drive circuit 15 drives the cell plate voltages of the memory cells included in the corresponding sub-array SAB When a main word line is selected, all the sub-arrays in the row block including the selected main word line are driven to the selected state in accordance with the select signal from the word line sub-decode signal line driver (all the sub-word lines are driven to the selected state). Then, writing or reading of the data is performed. Thereafter, cell plate voltage drive circuits 15 provided corresponding to the sub-arrays included in the row block including selected main word line MWL operate to change the cell plate voltages of the memory cell capacitors of the corresponding sub-arrays, respectively. In the remaining unselected row blocks, cell plate voltage drive circuits 15 generates the cell plate voltage at the level of predetermined precharge voltage VCP. In each of sub-arrays SAB included in the selected row block (i.e., row block including the selected main word line), there are memory cells connected to the selected sub-word line and memory cells connected to the unselected sub-word lines. However, by holding the unselected sub-word lines at negative voltage VB level as described above, no destruction of the data occurs. By collectively controlling the cell plate voltages in the sub-array at a time, the cell plate voltage transmission line can be arranged commonly to the capacitors in the sub-array, and the cell plate voltage can be transmitted easily. The cell plate voltage is transmitted only to the corresponding sub-array SAB, and it is not necessary to transmit the cell plate voltage to all the sub-arrays included in the row block. Therefore, the capacitance of the cell plate voltage transmission line can be made small, and the cell plate voltage can be changed rapidly. Description will now be given on structures of the respective portions.

Figure 5:
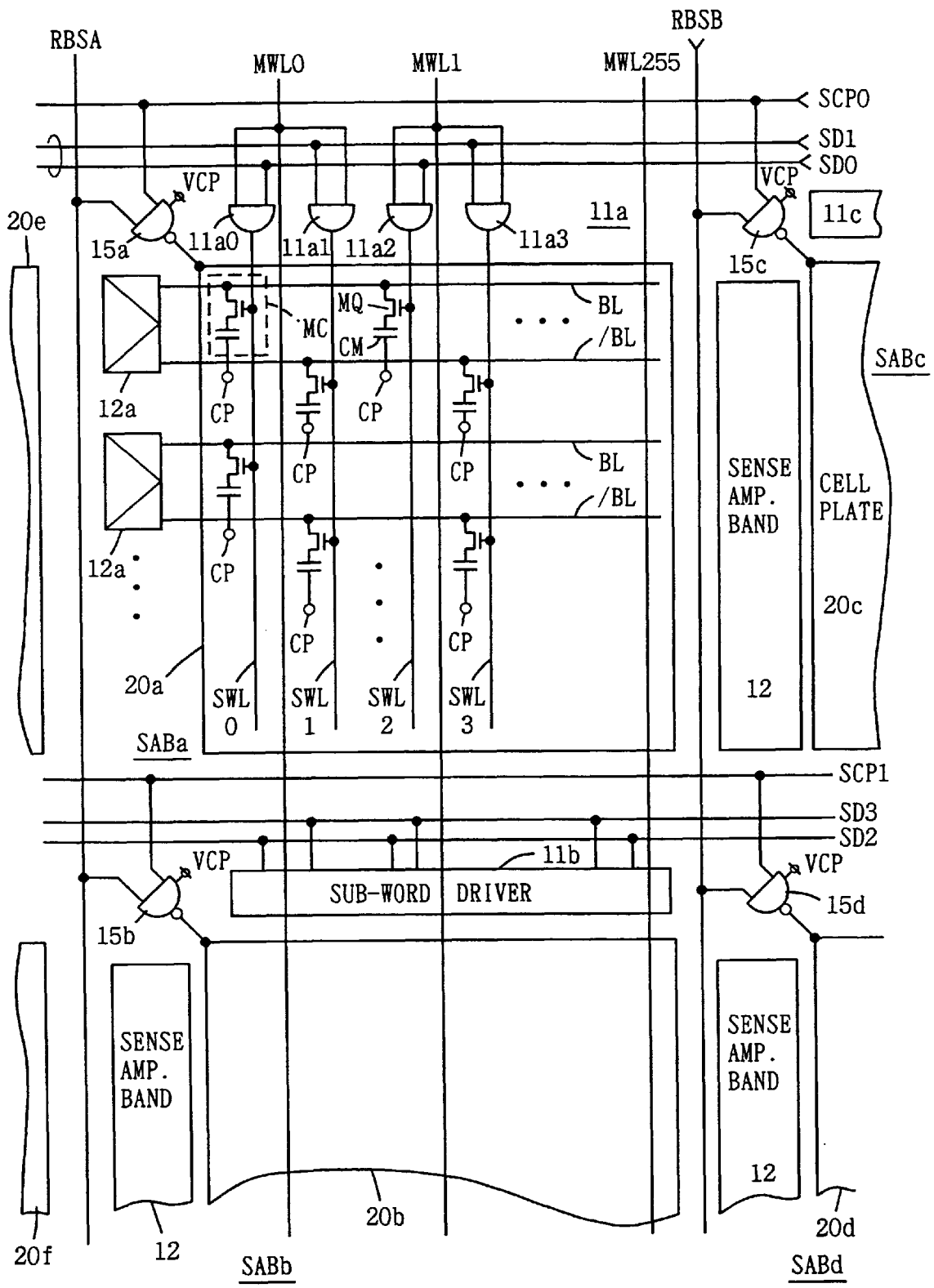
FIG. 5 shows, on an enlarged scale, a structure of a sub-array forming a memory cell array in the semiconductor memory device shown in FIG. 4.

FIG. 5 schematically shows a structure of the sub-array portion shown in FIG. 4. FIG. 5 shows sub-array SABa as well as sub-arrays SABb, SABc and SABd neighboring thereto.

In sub-array SABa, memory cells MC are arranged in rows and columns. Each of these memory cells MC includes capacitor CM and access transistor MQ formed of an n-channel MOS transistor.

Bit lines pairs BL and /BL are arranged corresponding to the columns of memory cells, respectively, and each bit line pair is connected to the memory cells in the corresponding column. Sub-word lines SWL are arranged corresponding to the rows of memory cells MC, respectively, and each of sub-word lines SWL is connected to the memory cells in the corresponding row. FIG. 5 representatively shows four sub-word lines SWL0–SWL3. A sense amplifier 12a is provided for each bit line pair BL and /BL. Sense amplifiers 12a are arranged along the row direction and are located on one side of sub-array SABa. Each of sense amplifiers 12a differentially amplifies and latches the signals on the corresponding bit line pair.

Each main word line is arranged commonly to sub-arrays SABa, SABb, . . . aligned along the row direction. In the structure shown in FIG. 5, 256 main word lines MWL0–MWL255 are arranged for one row block (i.e., block including sub-arrays SABa and SABb). Each of main word lines MWL0–MWL255 is provided corresponding to a predetermined number of sub-word lines in each sub-array included in the corresponding row block. In the structure shown in FIG. 5, one main word line is arranged for the two sub-word lines in sub-array SABa. Therefore, 512 sub-word lines are arranged in sub-array SABa. The same arrangement is employed in the other sub-arrays. By arranging one main word line for a plurality of sub-word lines, the pitch condition of the main word lines can be relaxed, and it is possible to use a wide interconnection line for fast transmission of the word line drive signal with a reduced resistance.

Sub-word driver 11a drives sub-word lines SWL0–SWL3, selectively to the selected and unselected states in accordance with the signal potentials on the main word line and the word line sub-decode signals SD1 and SD0. Sub-word driver 11a includes sub-word line drive circuits 11a0–11a3, . . . provided corresponding to the sub-word lines, respectively. Sub-word line drive circuit 11a0 drives corresponding sub-word line SWL0 selectively to the selected and unselected states in accordance with the signal potentials on main word line MWL0 and word line sub-decode signal SD0. Sub-word line drive circuit 11a1 drives corresponding sub-word line SWL1 selectively to the selected and unselected states in accordance with the signal potentials on main word line MWL0 and word line sub-decode signal SD1. Sub-word line drive circuit 11a2 drives corresponding sub-word line SWL2 selectively to the selected and unselected states in accordance with the signal potentials on main word line MWL1 and word line sub-decode signal SD0. Sub-word line drive circuit 11a3 drives corresponding sub-word line SWL3 selectively to the selected and unselected states in accordance with the signal potentials on main word line MWL1 and word line sub-decode signal SD1. Each of these sub-word line drive circuits 11a0–11a3 is formed of an AND circuit, and drives the corresponding sub-word line to the selected state when both the signals applied thereto are at L-level of the selected state. Each of word line sub-decode signals SD0 and SD1 designates one of the two sub-word lines provided corresponding to one main word line. One sub-word line is selected in sub-array SABa when one of main word lines MWL0–MWL255 is selected. Word line sub-decode signals SD0 and SD1 are produced by decoding the address signal bits for row selection.

A cell plate electrode layer is arranged corresponding to memory cells MC included in sub-array SABa. Cell plate electrode layer 20a is connected commonly to cell plate electrode nodes CP of capacitors CM of memory cells MC included in sub-array SABa. For controlling the cell plate voltage on cell plate electrode layer 20a, there is arranged a cell plate voltage control circuit 15a formed of an NAND circuit. Cell plate voltage control circuit 15a receives a row block select signal RBSA and a cell plate voltage control signal SCP0. Row block select signal RBSA is driven to the active state of H-level when the main word line is selected in the row block. Cell plate voltage control signal SCP0 changes in a pulse form when a precharge instruction is applied. Cell plate voltage control circuit 15a receives cell plate precharge voltage Vcp as one operation power supply voltage.

Sub-array SABb is likewise provided with a sub-word driver 11b for driving a sub-word line to the selected state in accordance with the signal potentials on main word lines MWL0–MWL255 and word line sub-decode signals SD2 and SD3, and a cell plate voltage control circuit 15b for controlling the voltage level on cell plate electrode layer 20b in accordance with row block select signal RBSA and cell plate voltage control signal SCP1.

Sub-array SABc is likewise provided with a sub-word driver 11c, a cell plate voltage control circuit 15c and a cell plate electrode layer 20c. Sub-array SABd is likewise provided with a cell plate voltage control circuit 15d. Cell plate voltage control circuits 15c and 15d of sub-arrays SABc and SABd are enabled in accordance with row block select signal RBSB.

Cell plate voltage control signals SCP0 and SCP1 are applied commonly to the sub-arrays aligned along the column direction and included in the corresponding column blocks, respectively. Word line sub-decode signals SD0 and SD1 as well as word line sub-decode signals SD2 and SD3 are applied commonly to the sub-arrays aligned along the column direction and included in the corresponding column blocks, respectively. Cell plate voltage control signals SCP0 and SCP1 may be simultaneously activated and deactivated. Alternatively, only a cell plate voltage control signal for the selected column block may be changed. This is true also for word line sub-decode signals SD0–SD3. By using the row address signal bits for selecting a column block, activation and deactivation of these signals can be controlled in a unit of a column block.

As shown in FIG. 5, cell plate electrode layers 20a–20f are arranged for the sub-arrays, respectively, so that the cell plate voltages for each sub-array are controlled independently of the other sub-arrays. Each of cell plate electrode layers 20a–20f supplies the cell plate voltage only to the memory cells connected to the sub-word line SWL (SWL0–SWL3, . . . ). Therefore, each of cell plate electrode layers 20a–20f can be made short and has a small interconnection resistance even if main word lines MWL0–MWL255 are long. Accordingly, the cell plate voltage can be changed rapidly. The cell plate electrode layer is required only to be arranged commonly to all the memory cells included in the sub-array, and can be arranged easily. Also, it is not necessary to arrange the cell plate voltage line in another layer. Now, an operation of the semiconductor memory device shown in FIG. 5 will be described below with reference to an operation waveform diagram shown in FIG. 6.

The following description will be given on the case where sub-word line SWL0 is selected in sub-array SABa. An operation is performed similarly in a case where a memory cell is selected in sub-array SABb.

Figure 6:
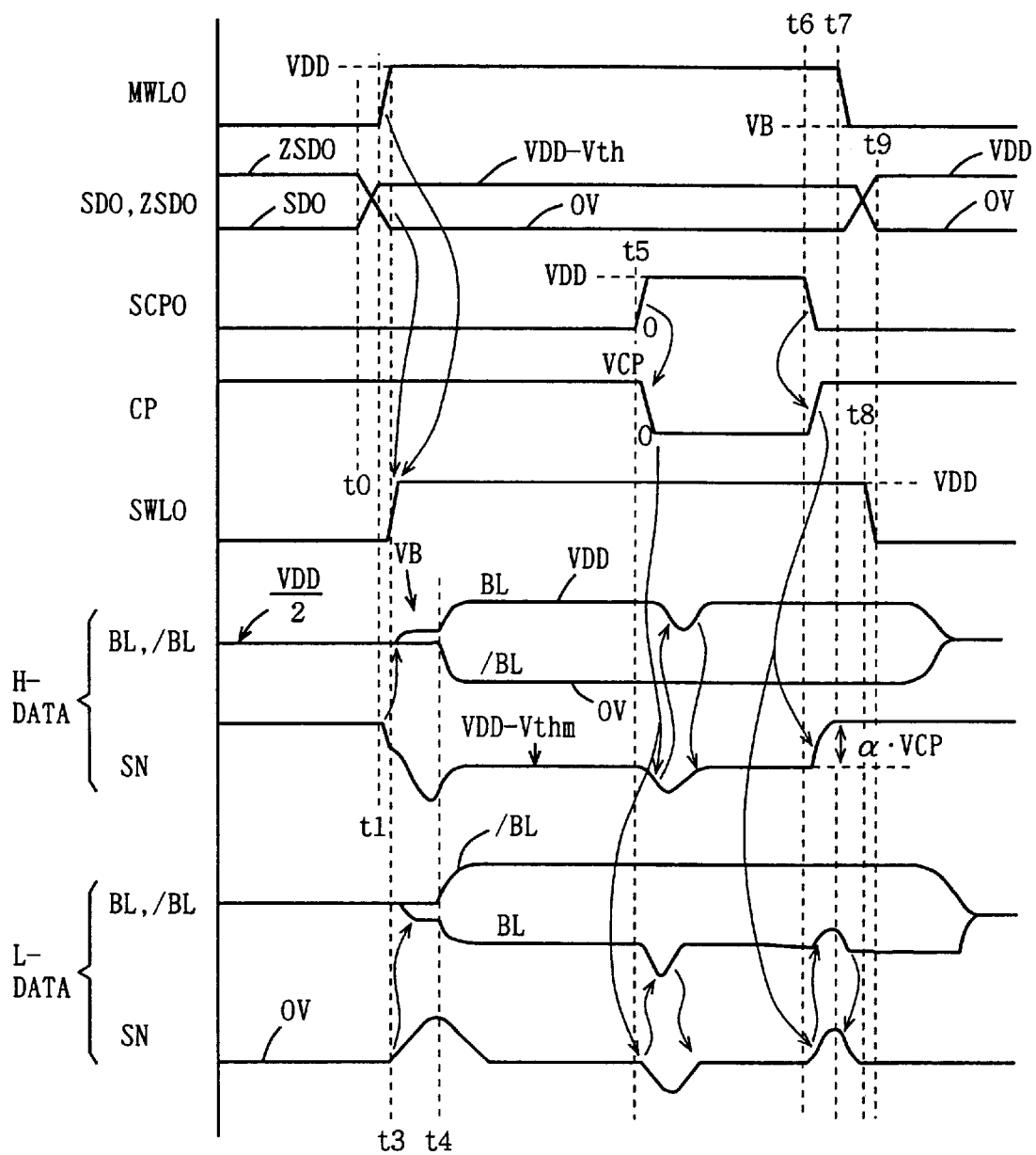
FIG. 6 is a signal waveform diagram representing an operation of the semiconductor memory device according to the embodiment 2 of the invention.

In the standby state (precharged state), all the main word lines are held at negative voltage VB level in the unselected state. Word line sub-decode signals SD0–SD3 are all held at ground voltage VSS (0 V) in the unselected state. In FIG. 6, the word line sub-decode signal is applied in a complementary signal form and are represented by the characters SD0 and ZSD0. Cell plate voltage Vg is held at the predetermined level of voltage VCP, and cell plate electrode node CP of the memory cell capacitor is held at this reference voltage VCP level. Bit lines BL and /BL are held at the level of an intermediate voltage VDD/2.

When row address strobe signal /RAS falls to the active state of L-level, an active cycle starts, and the operation for memory cell selection starts.

At time t0, word line sub-decode signal SD0 is driven to the active state in accordance with the applied address signal. The H-level of word line sub-decode signal SD0 is set to the voltage level of (VDD−Vth). This is because the unselected sub-word line is held at the negative voltage VB level, and it is necessary to prevent application of a voltage of a large difference between power supply voltage VDD and negative voltage VB in the sub-word driver (sub-word drive circuit). The complementary word line sub-decode signal ZSD0 is driven to the ground voltage level.

Then, a decode circuit (not shown) performs the decoding operation, and the voltage level on selected main word line MWL0 is driven to the power supply VDD level by main word driver 10 shown in FIG. 4 (time t1).

When word line sub-decode signal SD0 and main word line MWL0 attain H-level, the output signal of sub-word drive circuit 11a0 attains H-level at time t3, and the voltage level on sub-word line SWL0 rises from negative voltage VB to power supply voltage VDD level. When the voltage level on sub-word line SWL0 rises to power supply voltage VDD level, the voltage level on bit line BL or /BL changes in accordance with the data stored in the memory cell MC connected to sub-word line SWL0. In the memory cell storing data at H-level, storage node SN thereof has been held at the voltage level higher than power supply voltage VDD, and the voltage level on bit line BL rises from precharged voltage VDD/2. In the memory cell storing the L-level data, the voltage level on storage node SN is equal to the ground voltage level, and the voltage level on bit line BL lowers.

At time t4, sense amplifier 12a is activated to amplify differentially the voltages on bit lines BL and /BL. Thereby, the voltage levels on bit lines BL and /BL are driven to and latched at the level of power supply voltage VDD or ground voltage VSS (0 V) in accordance with the data stored in the memory cell. Under this state, column-related circuits such as a column decoder (not shown) perform the memory cell selection for writing/reading data.

When the memory cycle is completed, cell plate voltage control signal SCP0 rises to H-level (power supply voltage VDD level) at time t5 in response to the rising of row address strobe signal /RAS, and the output signal of cell plate voltage control circuit 15a lowers from reference voltage VCP level to the ground voltage level. When main word line MWL0 is in the selected state, row block select signal RBSA shown in FIG. 5 is at H-level. Cell plate electrode layer 20a is connected to cell plate electrode nodes CP of memory cells MC included in sub-array SABa, and the voltage of each cell plate electrode node CP lowers to the ground voltage level. As a result of this lowering of the voltage on cell plate electrode node CP, the voltage levels on storage nodes SN of memory cells MC included in sub-array SABa lower through the capacitive coupling of the capacitors.

In the memory cell storing H-level data, the voltage level on storage node SN slightly lowers from (VDD−Vthm), where Vthm represents a threshold voltage of access transistor MQ, and sub-word line SWL0 is at power supply voltage VDD level. As a result of lowering of the voltage level on storage node SN, the voltage level on bit line BL lowers (because all the memory cells connected to sub-word line SWL0 are connected to bit lines BL). Even after the voltage level on bit line BL lowers from power supply voltage VDD, the voltage level on this bit line BL will be clamped at power supply voltage VDD level by the clamping operation of a P-sense amplifier (sense amplifier formed of P-channel MOS transistors) included in the corresponding sense amplifier 12a, and the voltage on storage node SN will return to (VDD−Vthm) level. Even if the voltage on bit line BL at L-level further lowers from the ground voltage level, an N-sense amplifier (sense amplifier formed of N-channel MOS transistors) included in corresponding sense amplifier 12a clamps bit line BL at the ground voltage level so that storage node SN will return to the ground voltage level.

When a predetermined time elapses, cell plate voltage control signal SCP0 falls to L-level at time t6, and the output signal of cell plate voltage control circuit 15a returns from the ground voltage level to the initial reference voltage VCP level so that the voltage levels on cell plate electrode nodes CP of memory cells MC included in sub-array SABa return to reference voltage VCP level (cell plate voltage control circuit 15a receives reference voltage VCP as one operation power supply voltage). This rising of the voltage level on cell plate electrode nodes CP cause rising of the voltage levels on storage nodes SN of the memory cells included in sub-array SABa.

Sub-word line SWL still maintains the selected state, and memory cells MC are still connected to corresponding bit lines BL, respectively. In the memory cell storing the H-level data, the voltage level on storage node SN is raised by α·VCP from (VDD−Vthm). As a result of this voltage rising on storage node SN, the access transistor is turned off so that charges on storage node SN of the memory cell storing the H-level data are prevented from flowing to corresponding bit line BL. In memory cell MC storing the L-level data, the access transistor maintains the on state even when the voltage level on storage node SN rises, and charges on storage node SN flow to bit line BL. Even when the voltage level on bit line BL rises, the N-sense amplifier of the corresponding sense amplifier performs discharging, and bit line BL is clamped at the ground voltage level so that storage node SN is driven to the ground voltage level.

Thereafter, main word line MWL0 changes into the unselected state and attains negative voltage VB level at time t7, and sub-word line SWL0 is unselected and attains negative voltage VB level. Simultaneously, word line sub-decode signal SD0 returns from H-level to L-level (ground voltage level) at time t9, and complementary sub-decode signal ZSD0 returns from the ground voltage level to power supply voltage VDD level. Thereafter, the sense amplifier is deactivated, and a precharge/equalize circuit (not shown) precharges bit lines BL and /BL to the level of intermediate voltage VDD/2.

In the remaining sub-arrays, cell plate voltage control signal SCP may be driven to the active state, and an operation of selecting the memory cells may be performed in all the sub-arrays included in the row block that includes the selected main word line. In this case, all word line decode signals SD (SD0–SD3) are activated and deactivated at the common timings. Cell plate voltage control signals SCP (SCP0, SCP1) are also activated and deactivated at the common timings. A predetermined number of sub-arrays may further be selected from the sub-arrays included in the row block that includes the selected main word line, and selection of the memory cells (selection of the sub-word lines) may be performed only in the predetermined number of sub-arrays in the selected row block. In this case, cell plate voltage control signal SCP and the word line sub-decode signal for the selected sub-array are activated and deactivated. Description will now be given on structures of the respective portions.

[Main Word Driver]

Figure 7:
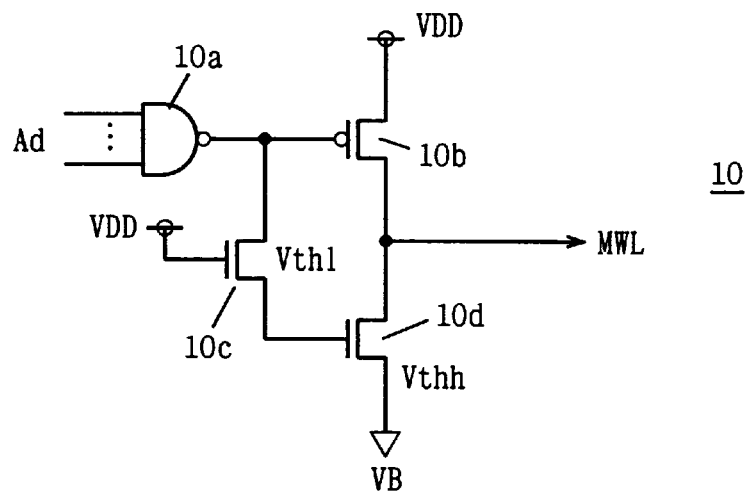
FIG. 7 shows an example of a structure of a main word driver shown in FIG. 4.

FIG. 7 shows an example of a structure of main word driver 10. More specifically, FIG. 7 shows the structure of the main word line drive circuit provided for one main word line MWL. In FIG. 7, the main word line drive circuit includes an NAND decode circuit 10a receiving a predetermined set of address signal bits (or predecode signal) Ad, a p-channel MOS transistor 10b which is connected between a node receiving power supply voltage VDD and main word line MWL, and receives on its gate the output signal of decode circuit 10a, an n-channel MOS transistor 10c which receives power supply voltage VDD on its gate and transmits the output signal of decode circuit 10a, and n-channel MOS transistor 10d which is connected between main word line MWL and the node receiving negative voltage VB, and receives on its gate the output signal of decode circuit 10a transmitted through n-channel MOS transistor 10c. N-channel MOS transistor 10c is a low threshold voltage MOS transistor having a very low threshold voltage Vthl. N-channel MOS transistor 10d has a relatively high threshold voltage Vthh. Decode circuit 10a generates a signal varying between the ground voltage and power supply voltage VDD. An operation will now be described below.

Decode circuit 10a generates the signal at L-level of the ground voltage level when received address signal bits Ad designate the corresponding main word line. P-channel MOS transistor 10b is turned on and transmits power supply voltage VDD onto main word line MWL. Since n-channel MOS transistor 10d has threshold voltage Vthh higher than the absolute value of negative voltage VB, it maintains the off state even if the gate voltage attains L-level of the ground voltage level. Therefore, power supply voltage VDD is transmitted onto main word line MWL.

When address signal bits Ad represent the unselected state, the output signal of decode circuit 10a attains power supply voltage VDD level, and p-channel MOS transistor 10b is turned off. N-channel MOS transistor 10d receives on its gate the voltage at the level of (VDD−Vthl) through n-channel MOS transistor 10c. Therefore, n-channel MOS transistor 10d is turned on, and main word line MWL is driven to and held at negative voltage VB level.

A gate-to-source voltage of n-channel MOS transistor 10d goes to (VDD−Vthl+|VB|). By setting the gate voltage applied to n-channel MOS transistor 10d to a voltage level lower than power supply voltage VDD, it is possible to prevent application of a large voltage (VDD+|VB|) across the gate and the source/drain of n-channel MOS transistor 10d when main word line MWL is in the unselected state, and reliability of the gate insulating film of n-channel MOS transistor 10a can be ensured.

Employment of n-channel MOS transistor 10c for lowering the voltage can also provide the following advantage. The main word line(s) driven to the selected state are small in number. Therefore, almost all the main word line drive circuits in the main word driver are held in the unselected state so that voltage at H-level is applied to the gates of discharging MOS transistors 10d. A time period in which the corresponding main word line is driven to the selected state is relatively short compared with the whole operation time. Therefore, almost all MOS transistors 10d in the main word driver receive the voltage at H-level on their gates. When power supply voltage VDD is raised, for example, in a "burn-in" test and a large voltage is applied across the gate and source of discharging MOS transistor 10d nearly throughout the burn-in period, an accelerated stress may be applied for a long time period so that the wafer burn-in test may destruct the gate insulating film of the discharging MOS transistor in the word line drive circuit. However, the stress applied to the gate insulating film of this discharging MOS transistor can be relaxed by provision of n-channel MOS transistor 10c for lowering the voltage, and the burn-in test can be performed accurately. As for the memory cell, power supply voltage VDD is applied onto the corresponding sub-word line, and power supply voltage VDD is raised. However, the corresponding sub-word line is driven to the selected state for an extremely short period compared with the whole burn-in period, and the burn-in test can be performed accurately for the memory cell.

The main word line drive circuit shown in FIG. 7 is used for driving main word line MWL to power supply voltage VDD level according to the present invention. However, it may be utilized in a conventional DRAM as a drive circuit for driving a word line to boosted voltage VPP and ground voltage VSS.

Threshold voltages Vthl and Vthh satisfy the following relationship so that n-channel MOS transistor 10d for discharging can be reliably turned on.

$$VDD-Vthl+|VB|>Vthh>|VB|$$

[Sub-Word Driver]

Figure 8:
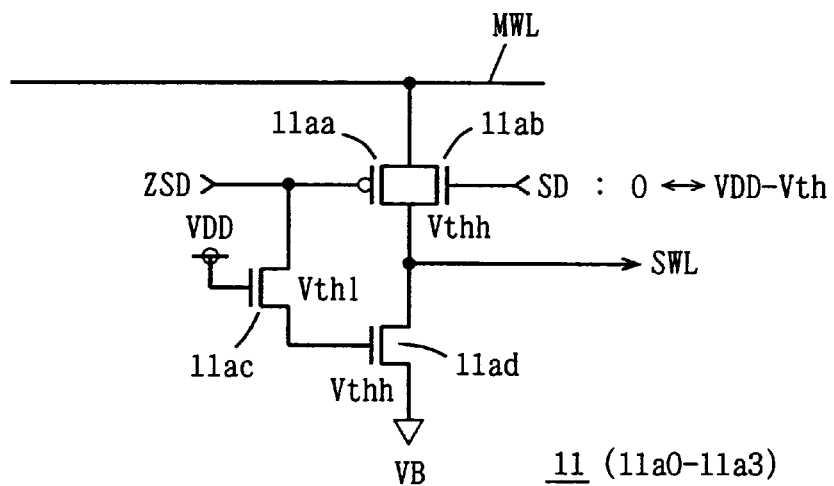
FIG. 8 shows an example of a structure of a sub-word line drive circuit shown in FIG. 5.

FIG. 8 shows a structure of the sub-word driver. More specifically, FIG. 8 shows a structure of sub-word line drive circuit 11 (11a0–11a3) disposed between one main word line MWL and one sub-word line SWL.

In FIG. 8, sub-word line drive circuit 11a includes: an n-channel MOS transistor 11ab which is connected between main word line MWL and sub-word line SWL, and receives word line sub-decode signal SD on its gate; a p-channel MOS transistor 11aa which is connected between main word line MWL and sub-word line SWL, and receives complementary word line sub-decode signal ZSD on its gate; an n-channel MOS transistor 11ac which receives power supply voltage VDD on its gate and transmits complementary word line sub-decode signal ZSD; and an n-channel MOS transistor Had which is connected between sub-word line SWL and a node receiving negative voltage VB, and receives complementary word line sub-decode signal ZSD on its gate through MOS transistor 11ac. MOS transistor 11ac has a low threshold voltage, and MOS transistor 11ad has a relatively high threshold voltage Vthh. Word line sub-decode signal SD varies between the ground voltage (0 V) and the voltage (VDD−Vth). An operation will now be described below.

When sub-word line SWL is in the unselected state, word line sub-decode signal SD is at L-level, complementary word line sub-decode signal ZSD is at power supply voltage VDD level, and both MOS transistors 11aa and 11ab are off. Meanwhile, n-channel MOS transistor 11ad receives on its gate the voltage at the level of (VDD−Vthl) through MOS transistor 11ac, and is turned on to hold sub-word line SWL at negative voltage VB level. In MOS transistor 11ad, a voltage difference between the gate and the source is equal to (VDD−Vthl+|VB|) similarly to that in the main word line drive circuit, and the gate insulating film is protected against application of an excessively large voltage.

When word line sub-decode signal SD attains H-level and complementary word line sub-decode signal ZSD attains L-level, MOS transistors 11aa and 11ab are turned on, and the voltage on main word line MWL is transmitted onto sub-word line SWL. MOS transistor 11ad receives on its gate the signal at L-level of ground voltage level (Vthh>|VB|). The H-level of word line sub-decode signal SD is equal to the level of (VDD−Vth). Therefore, MOS transistor 11ab cannot transmit the signal at power supply voltage VDD level from main word line MWL to sub-word line SWL even when made conductive. However, P-channel MOS transistor 11aa is turned on by word line sub-decode signal ZSD at the ground voltage level, and transmits the signal at power supply voltage VDD level to sub-word line SWL.

N-channel MOS transistor 11ab has threshold voltage Vthh, and is reliably turned off even if word line sub-decode signal SD applied to its gate is at the ground voltage level, because sub-word line SWL is at negative voltage VB level.

In a standby state, p-channel MOS transistor 11aa has a large voltage applied across the gate and source thereof when word line sub-decode signal ZSD is at H-level and main word line MWL is at negative voltage VB. In this case, word line sub-decode signal ZSD may be varied between the ground voltage (0 V) and the voltage of (VDD−Vth), and the absolute value of the threshold voltage of p-channel MOS transistor 11aa may be set to Vthh. When main word line MWL is at power supply voltage VDD, p-channel MOS transistor 11aa is off even when word line sub-decode signal ZSD is driven to the H-level of (VDD−Vth), if the absolute value Vthh of its threshold voltage is larger than Vth. When word line sub-decode signal ZSD is at H-level and sub-word line SWL is at negative voltage VB, it is likewise possible to prevent application of an excessively large voltage across the gate and drain of p-channel MOS transistor 11aa. If complementary word line sub-decode signal ZSD is adapted to vary between the ground voltage and (VDD−Vth), n-channel MOS transistor 11ac is unnecessary.

[Word Line Sub-Decode Signal Line Driver]

Figure 9:
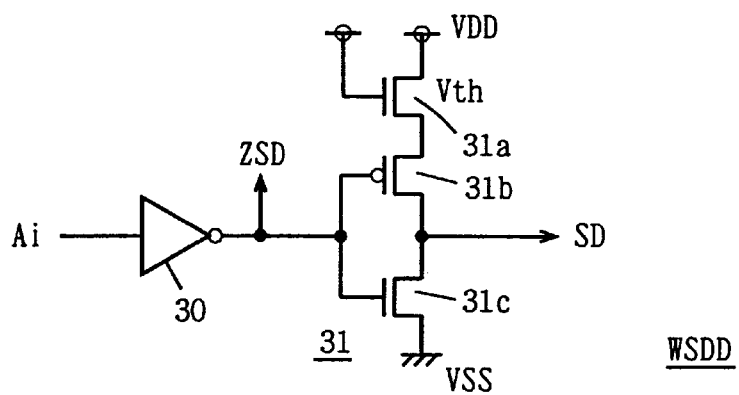
FIG. 9 shows an example of a structure of a word line sub-decode signal line drive circuit shown in FIGS. 4 and 5.

FIG. 9 shows a structure of a word line sub-decode signal line driver WSDD. FIG. 9 shows a structure for selecting the sub-word lines in all the sub-arrays included in one row block. Activation and deactivation of the word line sub-decode signal are determined merely depending on whether a selected sub-word line in each sub-array is on an even-numbered row or an odd-numbered row. This is designated by an address signal bit Ai.

In FIG. 9, the word line sub-decode signal line drive circuit includes an inverter 30 which receives address signal bit Ai and generates complementary word line sub-decode signal ZSD, and an inverter 31 which inverts sub-decode signal ZSD from inverter 30 and generates sub-decode signal SD. Inverter 30 generates sub-decode signal ZSD varying between power supply voltage VDD and the ground voltage.

Inverter 31 includes an n-channel MOS transistor 31a which is diode-connected and lowers power supply voltage VDD by a magnitude equal to its threshold voltage Vth, and also includes p- and n-channel MOS transistors 31b and 31c which are connected in series between n-channel MOS transistor 31e and the ground node, and receive signal ZSD on their gates. Inverter 31 sets the amplitude of sub-decode signal SD to be between the ground voltage and the voltage of (VDD−Vth).

N-channel MOS transistor 31a may be replaced with a p-channel MOS transistor.

Such a structure may be employed that sub-decode signals ZSD and SD varying between power supply voltage VDD and the ground voltage are produced, and are transmitted to sub-word line drive circuit through n-channel MOS transistors receiving on their gates the power supply voltage. In this structure, n-channel MOS transistor for voltage drop (for example, MOS transistor 11h in FIG. 8) is not required in the sub-word line drive circuit. In this case, the threshold voltage of the p-channel MOS transistor (for example, transistor 11aa in FIG. 8) connected between the main word line and the sub-word line is increased in absolute value. The structure described above can likewise prevent application of an excessively large voltage regardless of selection and unselection of main word line MWL and sub-word line SWL.

If there is a possibility that a problem of the breakdown voltage of the gate insulating film of the above p-channel MOS transistor arises, the main word line drive circuit shown in FIG. 7 may be configured into such a structure that the output signal of the decode circuit is applied to the gate of p-channel MOS transistor 10b through the voltage-dropping n-channel MOS transistor. In this structure, it is merely required to restrict the high (H-) voltage level of the output signal of decode circuit 10a.

According to the structure including the word line sub-decode signal line drive circuit shown in FIG. 9, the sub-word lines in all the sub-arrays included in the row block which in turn includes a selected main word line are selected. Inverter 30 shown in FIG. 9 may be replaced with an NAND type decode circuit receiving more address signal bits, in which case the sub-word lines can be driven to the selected state only in a predetermined number of sub-arrays in one row block.

[Structure 2 of Word Line Select Drive Portion]

Figure 10A:
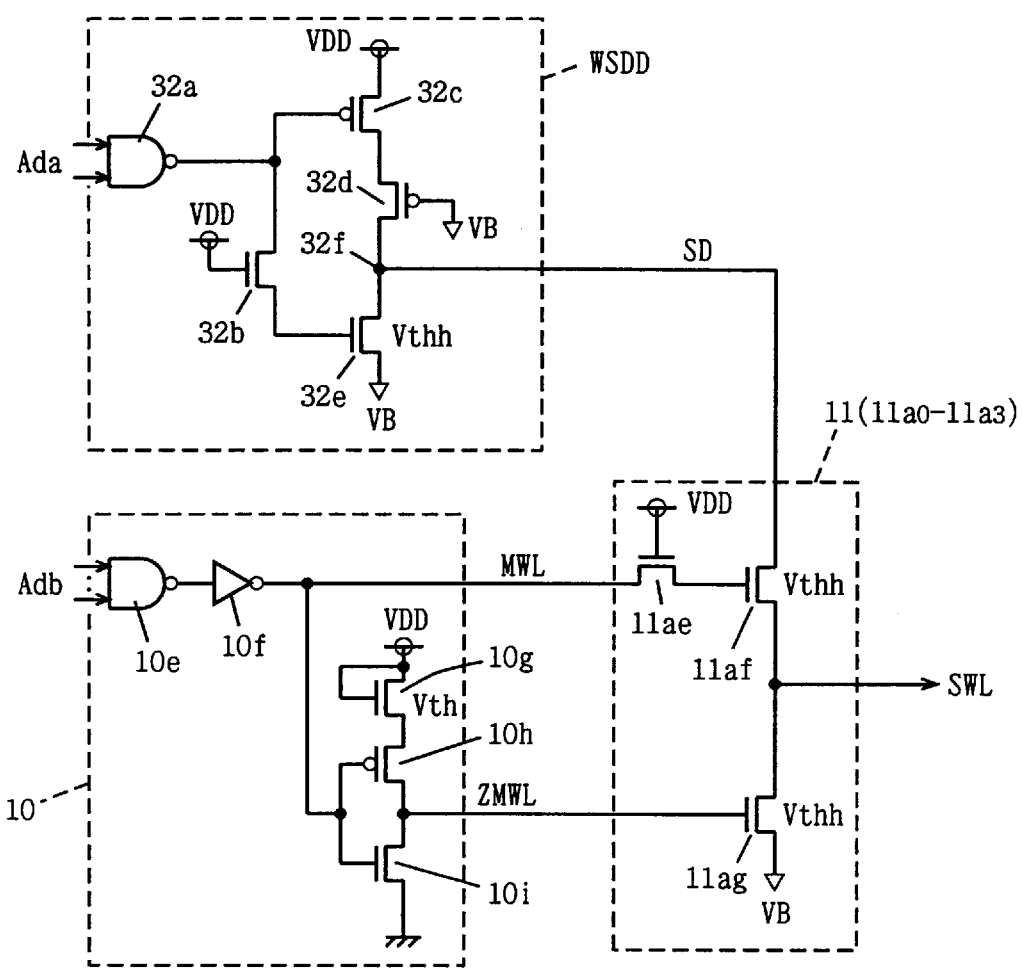
FIG. 10A shows a structure of a modification of a row select circuit.

FIG. 10A shows another structure of a word line drive portion (row select circuit). More specifically, FIG. 10A representatively shows a structure related to one sub-word line SWL. In the structure shown in FIG. 10A, a main word line drive signal is transmitted from main word line drive circuit 10 onto main word lines MWL and ZMWL. In the following description, signal lines and signals transmitted therethrough are represented by the same reference characters. Sub-word line drive circuit 11 (sub-word line drive circuits 11a0–11a3 in FIG. 5) drives sub-word line SWL to the selected state in accordance with main word line select signals MWL and ZMWL from main word line drive circuit 10 and word line sub-decode signal SD from word line sub-decode signal line drive circuit WSDD.

Word line sub-decode signal line drive circuit WSDD includes an NAND circuit 32a receiving an address signal Ada, an n-channel MOS transistor 32b which receives power supply voltage VDD on its gate and transmits the decode signal from NAND circuit 32a, an n-channel MOS transistor 32e which is connected between a node 32f and a node supplying negative voltage VB, and receives on its gate the output signal of NAND circuit 32a through MOS transistor 32b, and p-channel MOS transistors 32c and 32d connected in series between power supply voltage VDD and node 32f.

MOS transistor 32c receives the output signal of NAND circuit 32a on its gate. MOS transistor 32d receives negative voltage VB on its gate. Word line sub-decode signal SD is generated from node 32f. MOS transistor 32e has a large threshold voltage Vthh, and maintains the off state even when its gate-source voltage is IVBI. MOS transistor 32b has threshold voltage Vth, and shifts the level of the signal from NAND circuit 32 and at power supply voltage VDD level, for applying a signal at the voltage level of (VDD−Vth) to the gate of MOS transistor 32e.

Main word line drive circuit 10 includes an NAND circuit 10e receiving address signal Adb, an inverter 10f which inverts the output signal of NAND circuit 10e to generate the main word line select signal onto main word line MWL, MOS transistors 10g and 10h connected in series between the power supply node and complementary main word line ZMWL, and n-channel MOS transistor 10i which is connected between complementary main word line ZMWL and the ground voltage node and receives on its gate the output signal of inverter 10f. N-channel MOS transistor 10g has a gate and a drain interconnected, and transmits a voltage of (VDD−Vth) to a source of p-channel MOS transistor 10h. P-channel MOS transistor 10h receives on its gate the output signal of inverter 10f.

Sub-word line drive circuit 11 includes an n-channel MOS transistor 11ae which receives power supply voltage VDD on its gate and transmits the main word line select signal transmitted onto main word line MWL, an n-channel MOS transistor 11af which is selectively turned on in response to the signal applied through MOS transistor 11ae, to transmit word line sub-decode signal SD received from word line sub-decode signal line drive circuit SDD onto sub-word line SWL, and n-channel MOS transistor hag which is connected between sub-word line SWL and negative voltage VB supply node, and has a gate connected to complementary main word line ZMWL. MOS transistors 11af and 11ag each have threshold voltage Vthh larger than the absolute value of negative voltage VB.

Figure 10B:
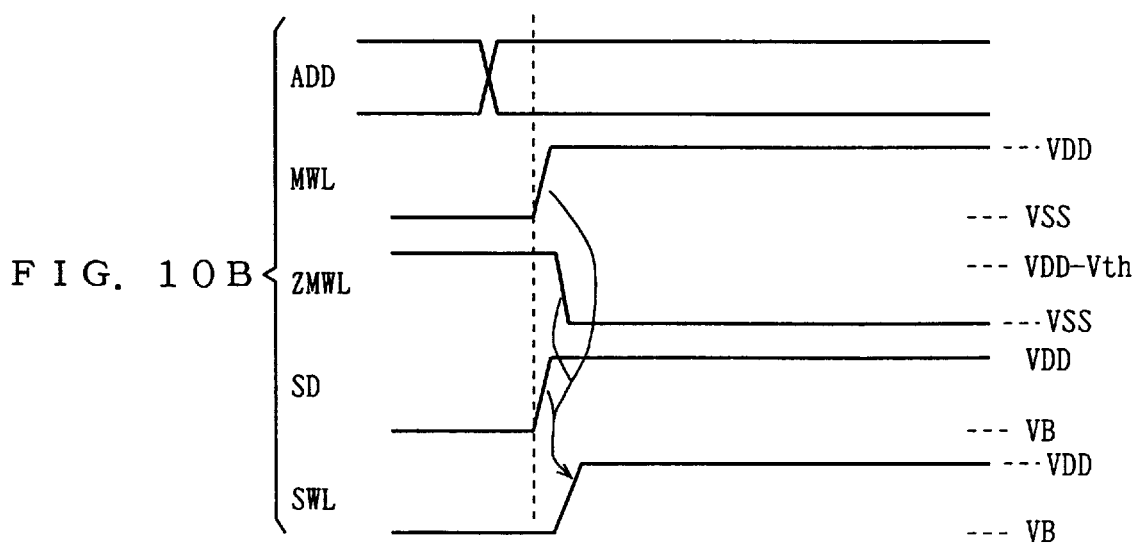
FIG. 10B is a signal waveform diagram representing an operation of a row select circuit shown in FIG. 10A.

Address signals Ada and Adb may be generated from an address buffer (not shown), or may be signals predecoded by a predecode circuit (not shown). An operation of the word line drive portion shown in FIG. 10A will now be described below with reference to a signal waveform diagram of FIG. 10B.

When the memory cycle starts and address signal ADD is defined, the states of internal address signals Ada and Adb are defined, and NAND circuits 32a and 10e perform a decoding operation. When main word line MWL is selected, the output signal of inverter 10f rises from ground voltage VSS level to power supply voltage VDD level. Complementary main word line ZMWL is driven to ground voltage VSS level because p-channel MOS transistor 10h is turned off and n-channel MOS transistor 10i is turned on.

In word line sub-decode signal line drive circuit WSDD, the voltage level of word line sub-decode signal SD changes in accordance with the output signal of NAND circuit 32a. When the output signal of NAND circuit 32a is at L-level, p-channel MOS transistor 32c is turned on. P-channel MOS transistor 32d receives negative voltage VB on its gate, and transmits power supply voltage VDD to node 32f. N-channel MOS transistor 32e receives the signal at ground voltage VSS level on its gate, but maintains the off state because its threshold voltage Vthh is sufficiently large. Therefore, word line sub-decode signal SD from node 32f rises to power supply voltage VDD level.

When the output signal of NAND circuit 32a is at H-level of power supply voltage VDD, p-channel MOS transistor 32c is off, and n-channel MOS transistor 32e receiving voltage (VDD−Vth) on its gate is turned on so that word line sub-decode signal SD is held at negative voltage VB level.

In sub-word line drive circuit 11, n-channel MOS transistor 11af receives the voltage of (VDD−Vth) on its gate when the signal on main word line MWL is at power supply voltage VDD level. Here, Vth represents the threshold voltage of n-channel MOS transistor 11ae. The signal on complementary main word line ZMWL is at the ground voltage VSS level, and n-channel MOS transistor 11ag has a sufficiently large threshold voltage Vthh so that MOS transistor 11ag maintains the off state. When word line sub-decode signal SD is at H-level, sub-word line SWL is driven to H-level through n-channel MOS transistor 11af.

At this time, word line sub-decode signal SD is at power supply voltage VDD level, and the voltage level on the gate of MOS transistor 11af is driven to a voltage level higher than the voltage of (VDD+Vthh) by a self-boot strap effect by the gate capacitance of MOS transistor 11af, and the signal at power supply voltage VDD level is transmitted onto sub-word line SWL. Even when the voltage on gate of MOS transistor 11af rises above the voltage of (VDD+Vthh), MOS transistor 11ae maintains the off state, and transmission of a large voltage onto main word line MWL is prevented.

When word line sub-decode signal SD is at negative voltage VB level and the signal on main word line MWL is at power supply voltage VDD level, word line sub-decode signal SD at negative voltage VB level is transmitted onto sub-word line SWL through MOS transistor 11af, and sub-word line SWL maintains the unselected state.

When the signal potential on main word line MWL is at ground voltage VSS level, MOS transistor 11af having sufficiently large threshold voltage Vthh maintains the off state even if word line sub-decode signal SD is at negative voltage VB level. In this state, MOS transistor 11ag receiving on its gate the voltage of (VDD−Vth) at H-level is on, and holds sub-word line SWL at negative voltage VB level.

In the structure shown in FIG. 10A, application of a large voltage to the circuit components, i.e., the MOS transistors can be prevented owing to provision of voltage lowering elements 32b, 32d and 10g. In sub-word line drive circuit 11, the maximum value of the gate-source voltage of MOS transistor 11ag is (VDD−Vth+|VB|). In this state, sub-word line SWL is at the level of negative voltage VB. The gate insulating film has only the voltage of (VDD−Vth+|VB|) or less applied thereacross, and the electric field applied to the gate insulating film of MOS transistor 11ag is relaxed so that the reliability of the gate insulating film is ensured.

In n-channel MOS transistor 11af, the maximum voltage applied across the gate and source thereof is (VDD−Vthh+|VB|), and the electric field applied to the gate insulating film is relaxed. When sub-word line SWL is driven to the selected state, word line sub-decode signal SD and sub-word line SWL are at power supply voltage VDD level. Therefore, the electric field applied to the gate insulating film is sufficiently relaxed even if the gate voltage of MOS transistor 11af rises to or above (VDD+Vthh).

In word line sub-decode signal line drive circuit WSDD, the maximum voltage applied between the gate and source of n-channel MOS transistor 32e is equal to (VDD+Vth+|VB|), and the electric field applied to the gate insulating film thereof is relaxed, as is done also in MOS transistor 11ag of the sub-word line drive circuit. When word line sub-decode signal SD is at negative voltage VB level, the voltage on the drain node of p-channel MOS transistor 32c is held at the voltage level of (|Vthp|−|VB|) by MOS transistor 32d. In p-channel MOS transistor 32c, the voltage applied between the gate and source/drain is likewise smaller than (VDD+|VB|), and the electric field applied to the gate insulating film can be relaxed in p-channel MOS transistor 32c.

In the structure shown in FIG. 10A, p-channel MOS transistor 32d of word line sub-decode signal line drive circuit WSDD receives negative voltage VB on its gate. When word line sub-decode signal SD is at the level of negative voltage VB, p-channel MOS transistor 32d operates in a diode mode to clamp the drain potential of p-channel MOS transistor 32c.

However, p-channel MOS transistor 32d may be connected such that the gate thereof receives ground voltage VSS. In this case, p-channel MOS transistor 32d clamps the voltage on drain node of p-channel MOS transistor 32c at the voltage level of |Vthp|, where Vthp represents the threshold voltage of p-channel MOS transistor 32d. In this case, p-channel MOS transistor 32c receives on its gate the voltage at power supply voltage VDD level which is equal to the voltage level on the source thereof, and maintains the off state so that flow of a through current from power supply voltage VDD to the negative voltage VB supply node is prevented.

The structure shown in FIG. 10A includes complementary main word lines MWL and ZMWL. A plurality of sub-word lines SWL are provided for the main word lines MWL and ZMWL, and the pitch of main word lines MWL and ZMWL can be equal to the pitch of sub-word lines SWL even in the worst case i.e., in the case where two sub-word lines are provided for one main word line. For driving the main word lines, one decode circuit is provided for one pair of main word lines MWL and ZMWL, and therefore the decode circuits (NAND circuit 10a and inverter 10f) can be arranged with a margin. MOS transistors 10g, 10h and 10i may be arranged such that these transistors overlap with complementary main word lines MWL and ZMWL in a plan view, whereby an area occupied by the main word line drive circuit is reduced, and the main word line drive circuit can be arranged for main word line pair MWL and ZMWL with a margin.

Such a structure may be employed that complementary main word line ZMWL are arranged adjacently to the sub-word line drive circuit in each sub-array, and only main word line MWL extends over the sub-arrays in the block.

According to the semiconductor memory device of the invention, as described above, the MOS transistor for level shift is employed at the portion, receiving negative voltage VB sub-word line drive in the circuit so that negative voltage VB is transmitted to the MOS transistor receiving negative voltage VB on one conduction terminal (source/drain). Therefore, it is possible to prevent application of a large voltage of, e.g., (VDD+|VB|) between the gate and source/drain of the MOS transistor which is a component, and thereby reliability of the gate insulating film can be sufficiently ensured.

Upon selection of sub-word line SWL, the voltage of (VDD+|VB|) is applied between the source and drain of n-channel MOS transistor 11ag for discharging. However, the selected sub-word lines are smaller in number than the unselected sub-word lines, and a period during which the sub-word line is kept in the selected state is shorter than the time of operation of the memory device. Consequently, the voltage applied between the source and drain of the discharging MOS transistor connected to the selected sub-word line is kept high for a short period, and therefore a time period of stress application is short on average. By relaxing the stress caused by application of a high voltage during standby and unselected state, it is possible to reduce remarkably the number of the MOS transistors entering the high voltage applied state temporarily and spacially, and the reliability of the gate insulating film of the MOS transistor is ensured.

[Cell Plate Voltage Control Signal Generating Circuit]

Figure 11:
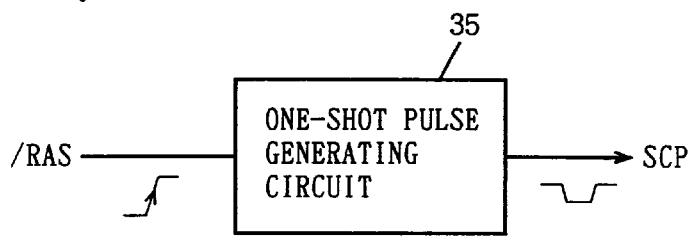
FIG. 11 schematically shows an example of a structure of a cell plate voltage control signal generating portion.

FIG. 11 schematically shows a structure of a cell plate voltage control signal generating portion. In FIG. 11, a cell plate voltage control signal generating circuit includes a one-shot pulse generating circuit 35 for generating a pulse signal of one shot which falls to and keeps L-level for a predetermined time in response to rising of row address strobe signal /RAS. One-shot pulse generating circuit 35 generates cell plate voltage control signal SCP. Row address strobe signal /RAS is an externally applied signal, and attains L-level when active to enter the semiconductor memory device into the active cycle. When externally applied row address strobe signal /RAS is deactivated to attain H-level, the semiconductor memory device returns to the precharged state. In response to this externally applied precharge instruction, cell plate voltage control signal SCP is lowered to and kept at L-level for a predetermined period, and the cell plate voltage of the memory cell is changed.

In the structure shown in FIG. 11, cell plate voltage control signal SCP is applied commonly to all the column blocks. In the case where the sub-word lines are selected in the predetermined number of sub-arrays in the row block including the selected main word line, the cell plate voltage control signal SCP applied to the selected sub-array is activated. In this case, cell plate voltage control signal shown in FIG. 11 and the decode signal designating the selected sub-array are used in a combined form. A column block designating signal designating the selected sub-array and an inverted signal of the cell plate voltage control signal SCP may be merely NANDed to change selectively the cell plate voltage control signal for the sub-arrays. However, the column block designating signal designating a column block including the selected sub-array is at H-level when active.

[Row-Related Control Circuitry]

Figure 12:
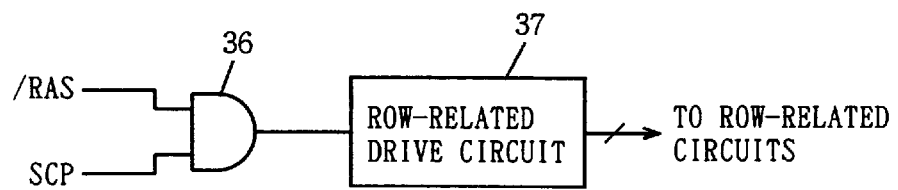
FIG. 12 schematically shows a structure of a row-related circuit control portion in the semiconductor memory device of the embodiment 2.

FIG. 12 shows a structure of the row-related control circuitry in the semiconductor memory device of the invention. The row-related control circuitry in FIG. 12 includes an AND circuit 36 receiving row address strobe signal /RAS and cell plate voltage control signal SCP, and a row-related drive circuit 37 generating control signals for respective row-related circuits in accordance with the output signal of AND circuit 36. Row-related drive circuit 37 activates and deactivates the row-related circuits in a predetermined sequence according to the output signal of AND circuit 36. The row-related circuits are circuits related to the row selection, and include bit line precharge/equalize circuits, sense amplifiers, word line select circuits (main word drivers and sub-word drivers) and others.

In the precharge cycle of the structure shown in FIG. 12, signals /RAS and SCP are at H-level similarly to the structure of FIG. 11, and the output signal of AND circuit 36 is at H-level. Also, the row-related drive circuit 37 holds the respective row-related circuits at the precharged state. When a memory cycle (i.e., active cycle) starts, row address strobe signal /RAS falls to L-level, and the output signal of AND circuit 36 attains L-level so that row-related drive circuit 37 drives the respective row-related circuits to perform operations related to word line selection. When row address strobe signal /RAS rises to H-level, cell plate voltage control signal SCP attains L-level, and the output signal of AND circuit 36 holds L-level so that row-related drive circuit 37 holds the row-related circuits in the active state. When cell plate voltage control signal SCP rises to H-level, the output signal of AND circuit 36 rises to H-level, and row-related drive circuit 37 returns the respective row-related circuits to the unselected state (precharged state) so that the memory array returns to the precharged state. According to the structure shown in FIG. 12, the precharging of the array is performed after changing the cell plate voltage and raising the voltage level on the storage nodes SN above the power supply voltage VDD.

The structures shown in FIGS. 11 and 12 receive row address strobe signal /RAS as the precharge instruction. However, in the case where the operation mode is specified by a command, as is done, for example, in a synchronous semiconductor memory device, a command which specifies the precharge operation may be used instead of row address strobe signal /RAS.

[Cell Plate Voltage Generating Circuit]

Figure 13:
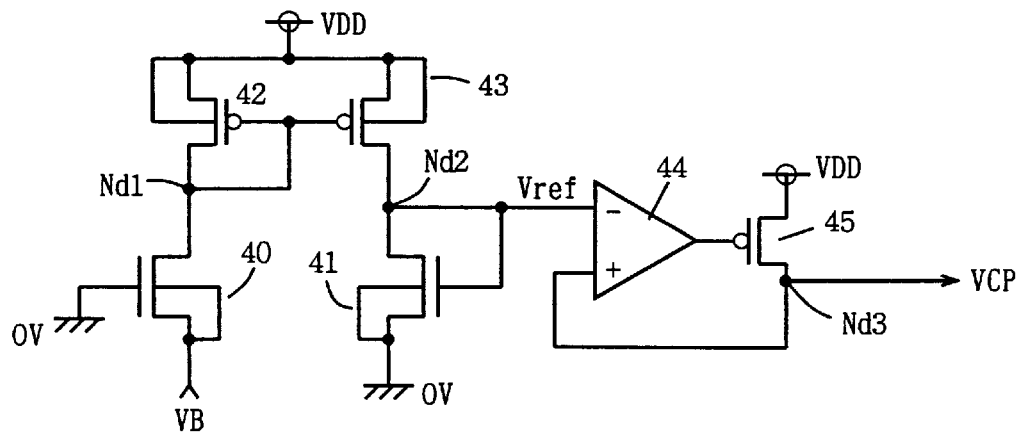
FIG. 13 shows an example of a structure of a cell plate precharge voltage generating circuit.

FIG. 13 shows a structure of the cell plate voltage generating circuit which generates cell plate voltage VCP during standby. In FIG. 13, cell plate voltage generating circuit includes an n-channel MOS transistor 40 which is connected between a node Nd1 and a node receiving negative voltage VB, and receives on its gate the ground voltage, an n-channel MOS transistor 41 which is connected between the ground node and a node Nd2, and has a gate connected to node Nd2, a p-channel MOS transistor 42 which is connected between the node receiving power supply voltage VDD and node Nd1, and has a gate connected to node Nd1, and a p-channel MOS transistor which is connected between the power supply node and node Nd2, and has a gate connected to node Nd1. These MOS transistors 40–43 form a reference voltage generating circuit of a current mirror type and generate a reference voltage Vref on node Nd2.

The cell plate voltage generating circuit further includes a comparison circuit 44 which makes a comparison between reference voltage Vref and cell plate reference (precharge) voltage VCP on a node Nd3, and a p-channel MOS transistor 45 which is connected between the power supply node and node Nd3, and has a conductance controlled by an output signal, of comparison circuit 44. The comparison circuit 44 receives voltage VCP on its positive input, and also receives reference voltage Vref on its negative input. An operation will now be described below.

MOS transistor 40 normally receives a ground voltage (0 V) on its gate, and supplies a constant current corresponding to the difference between negative voltage VB and the ground voltage. MOS transistors 42 and 43 form a current mirror circuit, and a current of the same magnitude as that flowing through MOS transistor 40 is applied to MOS transistor 41 through MOS transistor 43. MOS transistors 40 and 41 have the same size, and a current of the same magnitude as that flowing through MOS transistor 40 flows through MOS transistor 41. Therefore, the gate-source voltage of MOS transistor 41 is equal to the gate-source voltage of |VB| of MOS transistor 40. Accordingly, the reference voltage Vref generated from node Nd2 is at the level equal to the absolute value of negative voltage VB.

Comparison circuit 44 makes a comparison between reference voltage Vref and cell plate precharge voltage VCP. When cell plate precharge voltage VCP is higher than reference voltage Vref, the output signal of comparison circuit 44 is at H-level, and MOS transistor 45 is off. When cell plate precharge voltage VCP is lower than reference voltage Vref, the output signal of comparison circuit 44 is at a low level, and MOS transistor 45 has an increased conductance so that a current is supplied from the power supply node to node Nd3, and the voltage level of cell plate precharge voltage VCP rises. Therefore, cell plate precharge voltage VCP is held at the voltage level substantially equal to reference voltage Vref. Reference voltage Vref is equal to the absolute value of |VB| of negative voltage VB, and therefore cell plate precharge voltage VCP is at the level of |VB|.

Figure 14A:
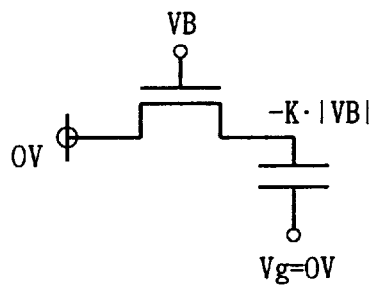
FIGS. 14A and 14B show voltages on respective nodes of the memory cells in accordance with change in cell plate voltage.

FIG. 14A shows a voltage level on the storage node in the unselected memory cell. The memory cell has stored the data at L-level. When cell plate voltage Vg lowers from voltage VCP, which was kept at |VB| during standby, to the ground voltage of 0 V, the voltage level on the storage node of this memory cell goes to (−K·|VB|). The coefficient of capacitive coupling takes a positive value of 1 or less. Therefore, negative voltage VB is lower than the voltage of (−K·|VB|) of the storage node so that the access transistor of the memory cell maintains the off state, and inflow of charges from the bit line into the storage node can be prevented.

Figure 14B:
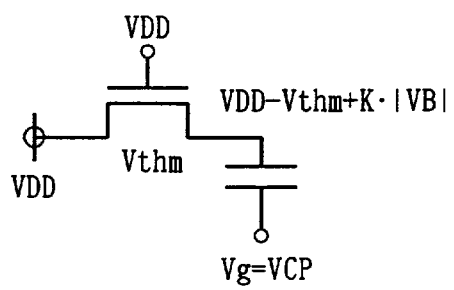

FIG. 14B shows a voltage level on storage node of the memory cell storing H-level data. When cell plate voltage Vg returns from the ground voltage to voltage VCP at which the voltage Vg was kept during standby, the voltage level on the storage node goes to (VDD−Vthm +K·|VB|). If K·|VB| is higher than threshold voltage Vthm of the access transistor, its storage node stores data at a level higher than power supply voltage VDD. If the unselected memory cell holds H-level data, the voltage level on the storage node temporarily lowers merely as a result of the capacitive coupling, and then returns to the original voltage level so that data is not destructed.

In the circuit which generates cell plate VCP during standby as is shown in FIG. 13, a current flows from node Nd1 to the negative voltage supply node. However, comparison circuit 44 has an extremely high input impedance, and reference voltage Vref can be generated without supplying a large current to the comparison circuit 44. It is required merely to generate reference voltage Vref. Therefore, it is possible to reduce a current flowing through MOS transistor 40, and it is possible to suppress sufficiently the variation in voltage level of negative voltage VB which may be caused by the current flowing through MOS transistor 40. This is because the negative voltage generating circuit has the charge supply capability which is sufficiently large compared with the current flowing through MOS transistor 40. Since negative voltage VB is supplied to all the main word lines and sub-word lines, this charge supply capability of the negative voltage generating circuit is set relatively large for fast driving of the word lines from the selected state to the unselected state.

Negative voltage VB may be equal in level to a substrate bias voltage VSUB applied to the substrate region of the memory cell array.

According to the embodiment 2 of the invention, as described above, the cell plate voltages are controlled on a sub-array basis. Therefore, writing of the data at a sufficiently high voltage level can be performed without boosting a word line and without causing destruction of data in the unselected memory cells. In addition, it is not necessary to boost the voltage on word line to a level higher than the power supply voltage, and therefore an excessively large electric field is not applied to the gate insulating film of the access transistor so that the reliability of the gate insulating film of the access transistor can be improved. Since the cell plate voltages are controlled on a sub-array basis, the cell plate electrode layer can be divided corresponding to the sub-arrays and can be divided easily. Since the cell plate voltages are controlled on a sub-array basis, the cell plate electrode line is sufficiently short, and therefore the voltage on the cell plate can be changed rapidly.

[Embodiment 3]

Figure 15:
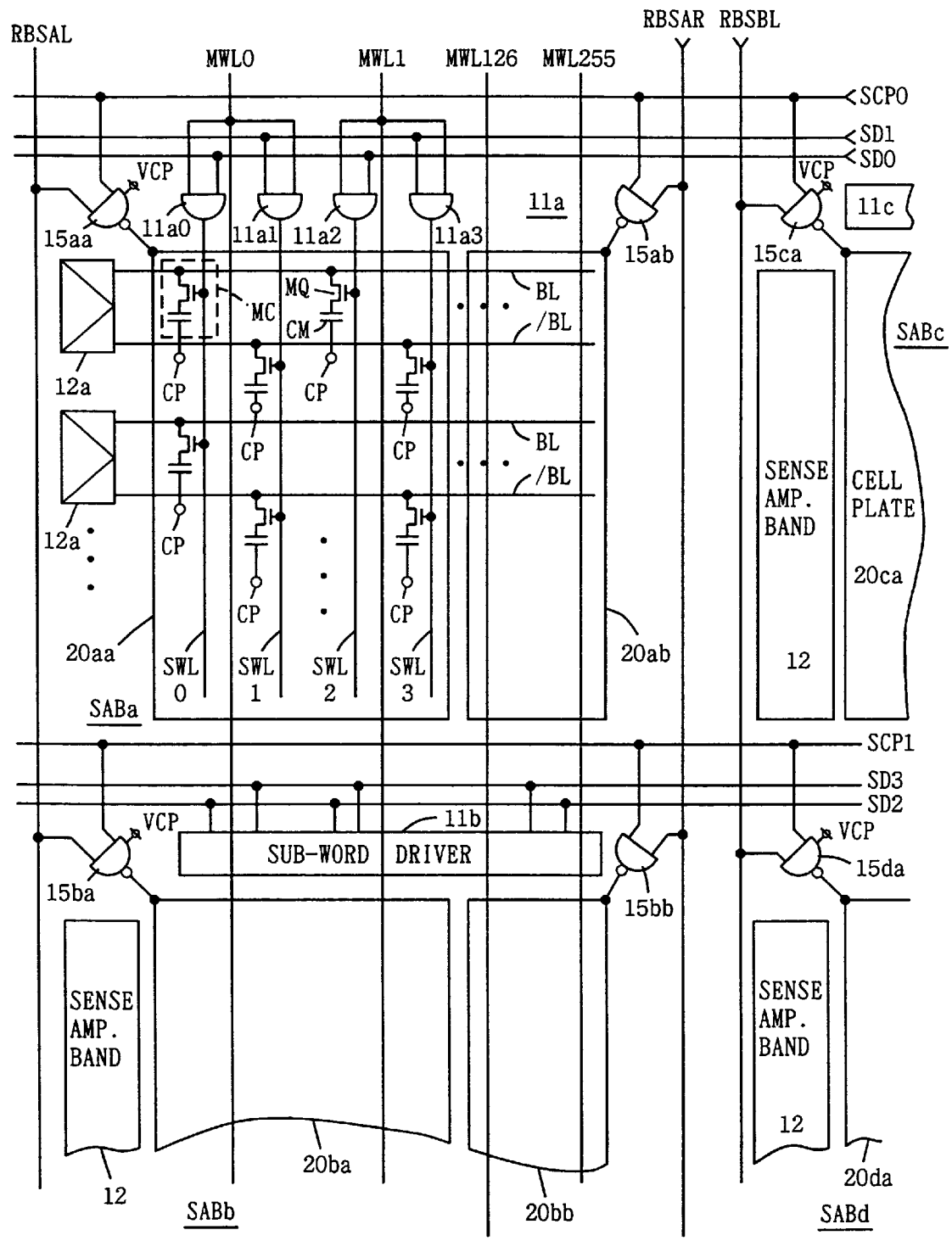
FIG. 15 schematically shows a structure of a main portion of a semiconductor memory device according to an embodiment 3 of the invention.

FIG. 15 shows a structure of a main portion of a semiconductor memory device according to an embodiment 3 of the invention. In the structure shown in FIG. 15, the cell plate electrode layer in each of sub-arrays SABa–SABd is divided into two portions. Thus, main word lines MWL0–MWL255 are divided into two sets; one for main word lines MWL0–MWL125 and the other for main word lines MWL126–MWL255. The cell plate electrode layer is arranged for each set of the main word lines. In sub-array SABa, a cell plate electrode layer 20aa is arranged for the memory cells provided corresponding to main word lines MWL0–MWL127. A cell plate electrode layer 20*ab* is arranged for the memory cells provided corresponding to main word lines MWL128–MWL255. For identifying the set including a selected word line, row block select signals RBSAL and RBSAR are applied to the row block including sub-arrays SABa and SABb. In each of sub-arrays SABaa and SABab, the cell plate electrode layer is bi-divided. Sub-array SABa includes two cell plate electrode layers 20*bb* and 20*ba* separated from each other. In each of sub-arrays SABc and SABd, the cell plate electrode layer is likewise bi-divided, but FIG. 15 shows only the first divided, cell plate electrode layers, i.e., cell plate electrode layers 20*ca* and 20*da*.

For driving these cell plate electrode layers independently of each other, each sub-array is provided with two cell plate voltage control circuits for each set of the main word lines. In sub-array SABa, there are provided a cell plate voltagecell plate voltage control circuit 15*aa* formed of an NAND circuit receiving row block select signal RBSAL and cell plate voltage control signal SCP0 for the cell plate electrode layer 20*aa* and a cell plate voltage control circuit 15*ab* formed of an NAND circuit receiving row block select signal RBSAR and cell plate voltage control signal SCP0 for cell plate electrode layer 20*ab*. In sub-array SABb, there is provided a cell plate voltage control circuit 15*ba* receiving row block select signal RBSAL and cell plate voltage control signal SCP1 for cell plate electrode layer 20*ba* as well as a cell plate voltage control circuit 15*bb* receiving row block select signal RBSAR and cell plate voltage control signal SCP1 for cell plate electrode layer 20*bb*.

Each of sub-arrays SABC and SABd is likewise provided with two sub-array voltage control circuits, but FIG. 15 shows only cell plate voltage control circuits 15*ca* and 15*da* provided for cell plate electrode layers 20*ca* and 20*da*, respectively. Cell plate voltage control circuit 15*ca* receives block select signal RBSBL and cell plate voltage control signal SCP0. Cell plate voltage control circuit 15*da* receives block select signal RBSBL and cell plate voltage control signal SCP1.

Description will be given on an operation which is performed when main word line MWL0 is selected and sub-word line SWL0 is selected.

Upon selection of main word line MWL0, block select signal RBSAL attains the H-level of active state. Meanwhile, block select signal RBSAR maintains the L-level unselected state. Then, sub-word line drive circuit 11*a*0 drives sub-word line SWL0 to the selected state. The remaining sub-word lines maintain the unselected state. Then, writing/reading of data into or from the memory cell is performed. Thereafter, cell plate voltage control signal SCP0 lowers from H-level to L-level. Thereby, the output signal of cell plate voltage control circuit 15*aa* attains L-level, and the voltage level on cell plate electrode layer 20*aa* lowers and the storage node potential of capacitor CM is changed through cell plate electrode node CP of the memory cell.

Upon elapsing of a predetermined period, the voltage level on cell plate electrode layer 20*aa* returns to predetermined voltage VCP level. Meanwhile, block select signal RBSAR is in the unselected state, and the change in cell plate voltage control signal SCP0 causes no change in the output signal of cell plate voltage control circuit 15*ab*, and the cell plate electrode layer 20*ab* maintains the predetermined level of voltage VCP. In the operation of driving the cell plate electrode layer, therefore, only one of the two divided cell plate electrode layers is driven so that a current consumption for driving the cell plate electrode layer can be halved. Also, a load capacitance of the cell plate electrode layer can be made small, which allows fast change of the cell plate voltage.

The structure for producing block select signals RBSAL and RBSAR can be easily achieved by the combination of the block select signal RBSA in the foregoing embodiment 1 with the least significant bit of the address signal for selecting a main word line. By the least significant bit of the address signal for designating a main word line, it is possible to easily which set (i.e., left or right set) contains a selected main word line.

In the structure shown in FIG. 15, the cell plate electrode layer is bi-divided. However, the cell plate electrode layer may be divided corresponding to each set of a predetermined number of main word lines. It is required only to change simultaneously the cell plate voltages for a plurality of sub-word lines. In this case, various select signals can be produced by combination of the address signal bits for the main word line selection and the row block designating signal.

In the structure shown in FIG. 15, the selection of memory cells may be performed in all the sub-arrays included in a selected row block, and alternatively, only a predetermined number of sub-arrays are driven to the selected state in the row block including the selected main word line.

According to the embodiment 3 of the invention, as described above, the cell plate electrode layer in each sub-array is divided corresponding to each set of a plurality of sub-word lines so that a current consumption during driving of the cell plate electrode layer can be reduced. Also, effects similar to those of the embodiment 1 can be achieved.

[Embodiment 4]

Figure 16:
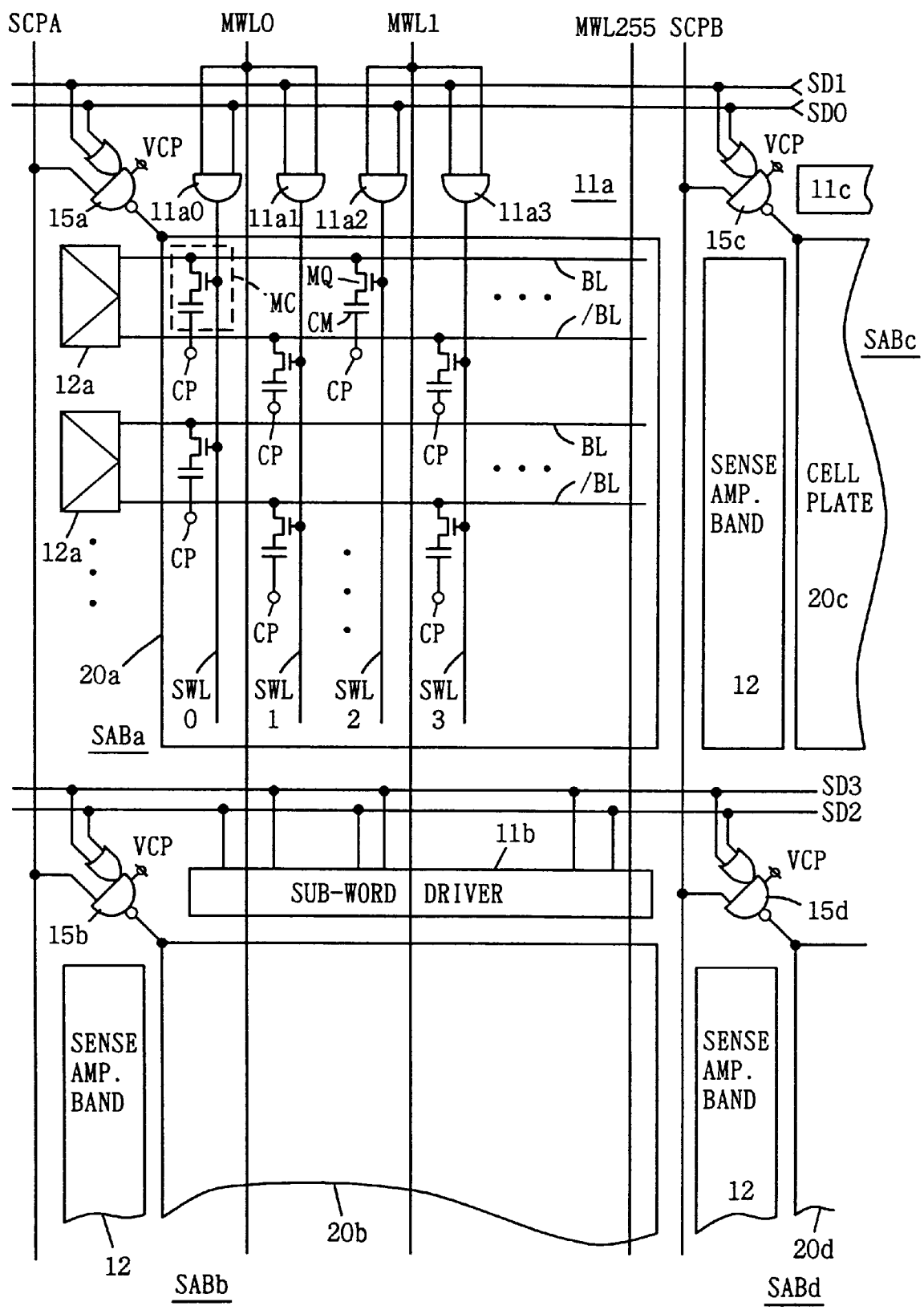
FIG. 16 schematically shows a structure of a main portion of a semiconductor memory device according to an embodiment 4 of the invention.

FIG. 16 schematically shows a structure of a main portion of a semiconductor memory device according to an embodiment 4 of the invention. Referring to FIG. 16, the semiconductor memory device according to the embodiment 4 differs from the semiconductor memory device according to the embodiment 1 in the following points. Each of cell plate voltage control circuits 15*a*–15*d* provided corresponding to sub-arrays SABa–SABd is formed of a OR/AND composite gate. Instead of block select signals RBSA and RBSB, select/control signals SCPA and SCPB are used, each of which is an AND signal of the row block select signal and the cell plate voltage control signal. Select/control signals SCPA and SCPB are transmitted commonly to the sub-arrays included in the corresponding row blocks through signal lines extending in the row direction.

Cell plate voltage control circuit 15*a* in sub-array SABa controls the voltage level on cell plate electrode layer 20*a* in accordance with select/control signal SCPA and sub-decode signals SDI and SD0. Cell plate voltage control circuit 15*a* is equivalent in a structure to a combination of an OR circuit receiving word line sub-decode signals SD0 and SD1 and an NAND circuit receiving an output signal of this OR circuit and select/control signal SPCA.

In sub-array SABb, cell plate voltage control circuit 15*b* is equivalent in a structure to a combination of an OR circuit receiving word line sub-decode signals SD2 and SD3 and an NAND circuit receiving the output signal of this OR circuit and select/control signal SPCA. Cell plate voltage control circuit 15*c* is equivalent in a structure to a combination of an OR circuit receiving word line sub-decode signals SD0 and SD1 and an NAND circuit receiving the output signal of this OR circuit and select/control signal SPCB. Cell plate voltage control circuit 15*d* is equivalent in a structure to a combination of an OR circuit receiving word line sub-decode signals SD2 and SD3 and an NAND circuit receiving the output signal of this OR circuit and select/control signal SPCB. Structures other than the above are the same as those shown in FIG. 5, and the corresponding potions bear the same reference numerals or characters.

In the structure shown in FIG. 16, a memory cell in sub-array SABa is selected as follows. For example, main word line MWL0 is selected, and sub-word line SWL is driven to the selected state. Select/control signal SCPA is still at L-level, the output signal of cell plate voltage control circuit 15a is still at H-level, and the voltage level on cell plate electrode layer 20a is at the precharged level of voltage VCP. After completion of writing or reading of the data, select/control signal SCPA rises to and is kept at H-level for a predetermined period so as to change the cell plate voltage, and the output signal of cell plate voltage control circuit 15a attains L-level so that cell plate electrode layer 20a attains L-level, and the voltage levels of the storage nodes of the memory cell capacitors of the memory cells included in sub-array SABa once lower and then rise.

Therefore, the structure shown in FIG. 16 does not require the two signal lines, i.e., the row block select signal line and the cell plate voltage control signal line, and an area occupied by the interconnections is reduced. The cell plate voltage control signal can be applied commonly to the sub-arrays included in the row block, which allows easy control because the select/control signal can be produced merely by a logical product of the row block select signal and the cell plate voltage control signal. Upon selection of the sub-arrays included in a column block, the word line sub-decode signals are selectively activated, whereby a predetermined number of sub-arrays in those included in the selected row block can be driven to the active state.

[Modification]

Figure 17:
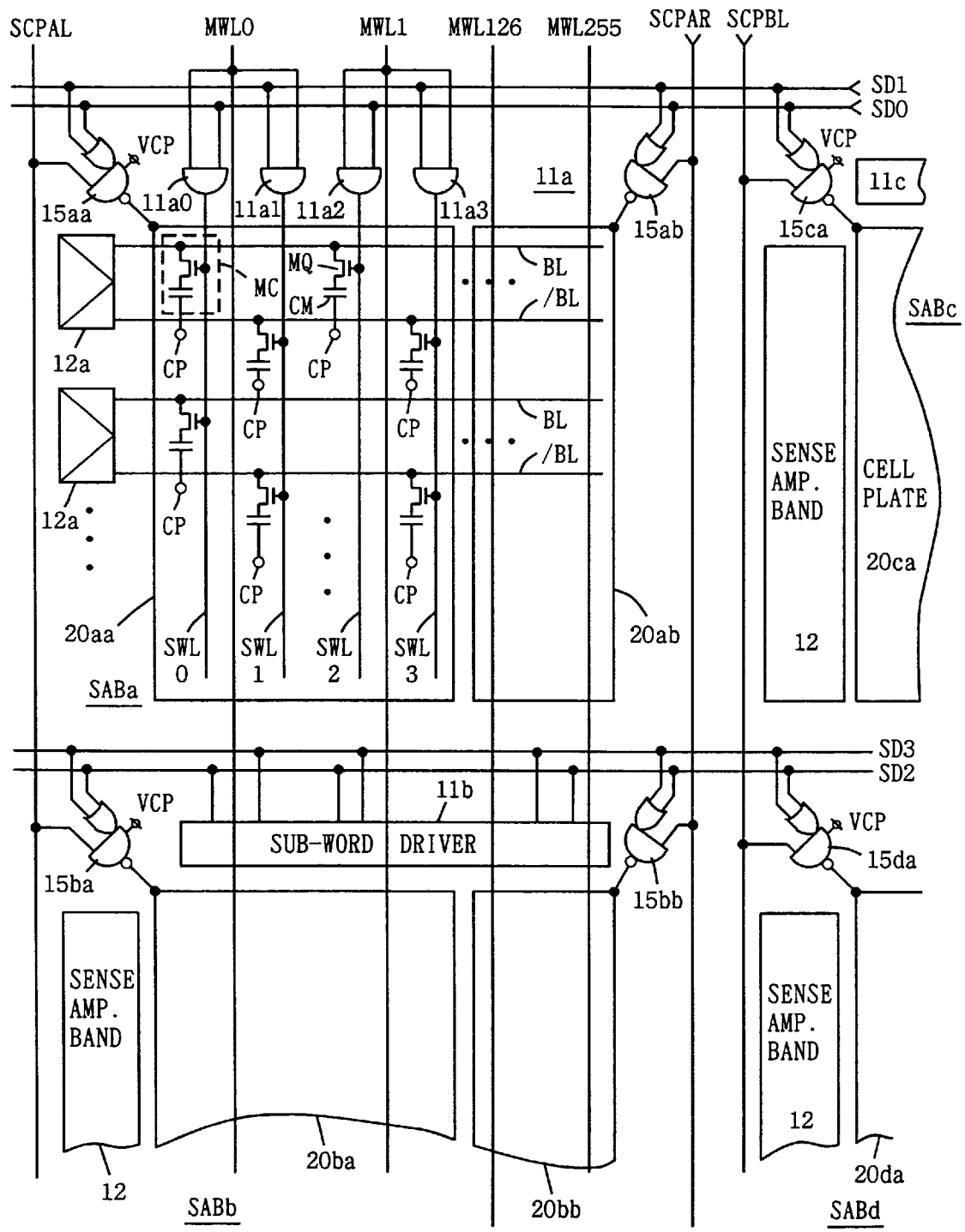
FIG. 17 schematically shows a modification of the structure according to the embodiment 4 of the invention.

FIG. 17 shows a structure of a modification of the embodiment 4 of the invention. In the structure shown in FIG. 17, each of sub-arrays SAB (SABa –SABd) is provided with two divided cell plate electrode layers. FIG. 17 shows two cell plate electrode layers 20aa and 20ab in sub-array SABa. Cell plate voltage control circuits 15aa and 15ab are provided for two divided cell plate electrode layers 20aa and 20ab, respectively similarly to the embodiment 2. Each of cell plate voltage control circuits 15aa and 15ab is formed of an OR/AND composite gate receiving select/control signal and the word line sub-decode signals, similarly to the structure shown in FIG. 16. In accordance with the divided cell plate electrode layers, two divided select/control signals SCPAL and SCPAR are used for selecting the blocks. Structures other than the above are the same as those shown in FIG. 16, and corresponding portions bear the same reference numerals or characters.

In this case, select/control signal SCPAL or SCPAR is driven to the selected state for the set including a selected main word line, as is done in the foregoing structure of FIG. 15. In this case, therefore, cell plate voltage Vg changes only on the cell plate electrode layer provided for the memory cells connected to a selected main word line. In the case where the cell plate electrode layer is bi-divided, an interconnection line for transmitting cell plate voltage control signal SCP is not required, and an area occupied by the interconnection lines can be reduced, as can be done also in the foregoing case of FIG. 15.

In the structure shown in FIG. 17, the structure for generating select/control signals SCPAL and SCPAR can be implemented by combining block select signals RBAL and RBAR with selected cell plate voltage control signal SCP in the foregoing embodiment 2. When driving only a predetermined number of sub-arrays to the selected state, this can be achieved by selectively activating word line sub-decode signals SD (SD0–SD3).

In the structure shown in FIGS. 16 and 17, therefore, it is not necessary to perform the decoding if the cell plate voltage control signal is merely to be changed for a predetermined number of sub-arrays in a selected row block, and such selective change can be performed by combination of common cell plate voltage control signal SCP and the row block select signal. Selection of the predetermined number of sub-arrays can be performed with the word line sub-decode signal. Therefore, the structure of the control signal generating portion can be simplified. Also, effects similar to those of the embodiment 2 can be achieved.

In this embodiment 4, the cell plate electrode layer may be further multi-divided in each sub-array.

[Embodiment 5]

Figure 18:
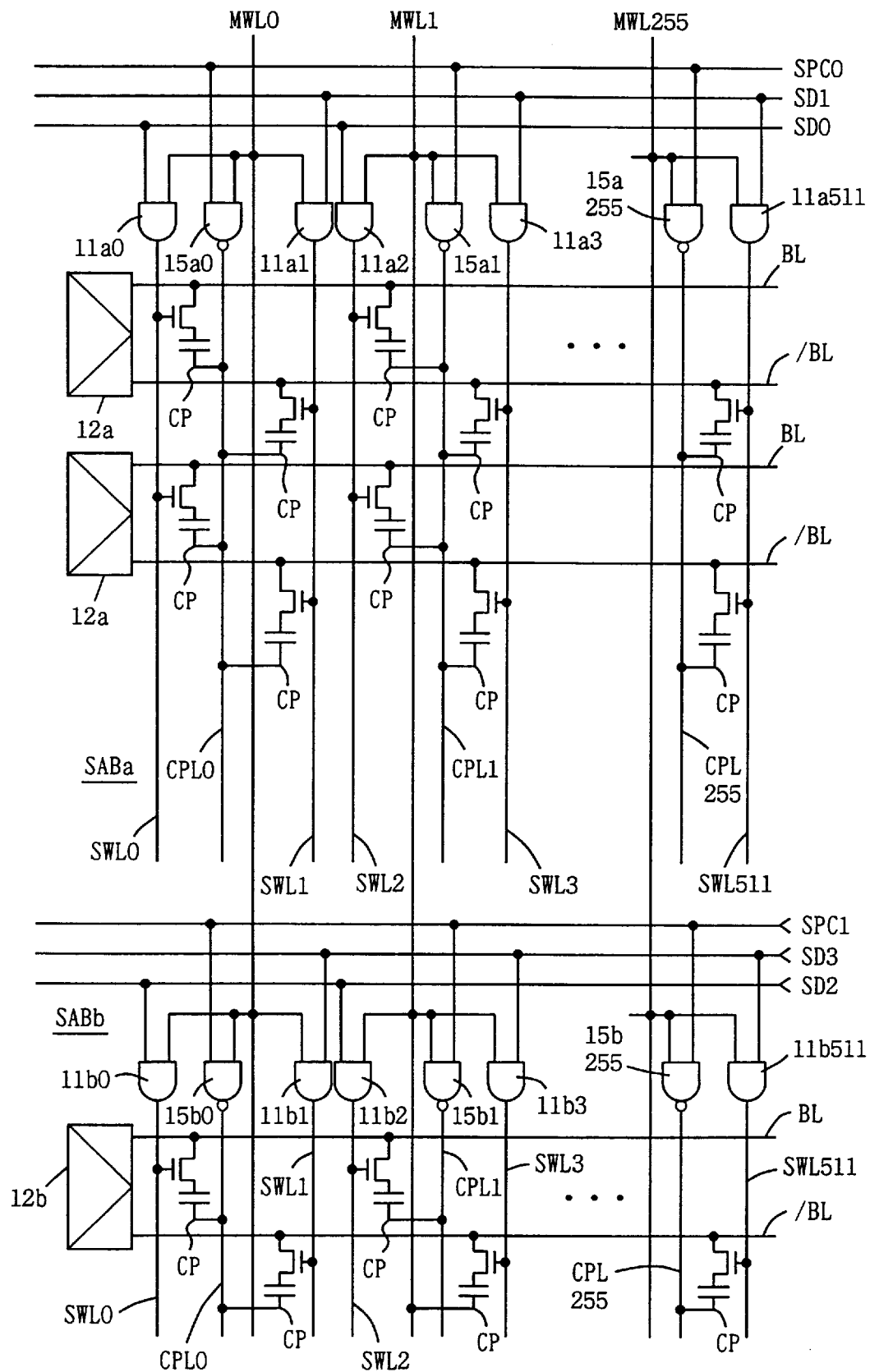
FIG. 18 schematically shows a structure of a main portion of a semiconductor memory device according to an embodiment 5 of the invention.

FIG. 18 schematically shows a structure of a main portion of a semiconductor memory device according to an embodiment 5 of the invention. More specifically, FIG. 18 shows a structure related to sub-arrays SABa and SABb. The same structures are employed in the other sub-arrays.

In FIG. 18, sub-array SABa includes cell plate lines CPL0–CPL255 arranged corresponding to main word lines MWL0–MWL255, respectively. Each of cell plate lines CPL0–CPL255 is connected to cell plate electrode nodes CP of the memory cells connected to sub-word lines selected by a corresponding main word line. Therefore, the cell plate electrode nodes of the memory cells contained in sub-array SABa and arranged in two rows are connected to each cell plate line CPLi (i=0–255).

For cell plate lines CPL0–CPL255, there are arranged cell plate voltage control circuits 15a0–15a255 formed of NAND circuits receiving the signal potentials on corresponding main word lines MWL0–MWL255 and cell plate voltage control signal SPC0. For sub-word lines SWL0–SWL511, there are arranged sub-word line drive circuits 11a0–11a511, respectively, each of which receives the signal on a corresponding one of main word lines MWL0–MWL255 and one of word line sub-decode signal SD0–SD1. Bit lines BL and /BL for the memory cells in each column are coupled to corresponding sense amplifier 12a.

Similarly to sub-array SABa, sub-array SABb includes cell plate lines CPL0–CPL255 arranged corresponding to main word lines MWL0–MWL255, respectively. For cell plate lines CPL0–CPL255, there are arranged cell plate voltage control circuits 15b0–15b255 receiving cell plate voltage control signal SPC1 and the signals on corresponding main word lines MWL0–MWL255. In this sub-array SABb, one cell plate line is arranged for the memory cells in two rows.

When main word line MWL0 is selected in sub-array SABa, one of sub-word lines SWL0 and SWL1 is driven to the selected state in accordance with sub-decode signals SD0 and SD1. Cell plate voltage control circuit 15a0 formed of an NAND circuit drives cell plate line CPL0 in accordance with cell plate voltage control signal SPC0 when the signal potential on main word line MWL0 attains H-level. Other main word lines MWL1–MWL255 hold corresponding cell plate lines CPL1–CPL255 at predetermined cell plate precharge voltage VCP independently of the logical level of cell plate voltage control signal SPC0, because corresponding main word lines MWLI–MWL255 are in the unselected state.

In sub-array SABb, cell plate voltage control circuit 15b0 changes the voltage on cell plate line CPL0 in accordance with cell plate voltage control signal SPC1 (if sub-arrays SABa and SAsb are simultaneously driven to the selected state), when main word line MWL0 is selected.

Figure 69:
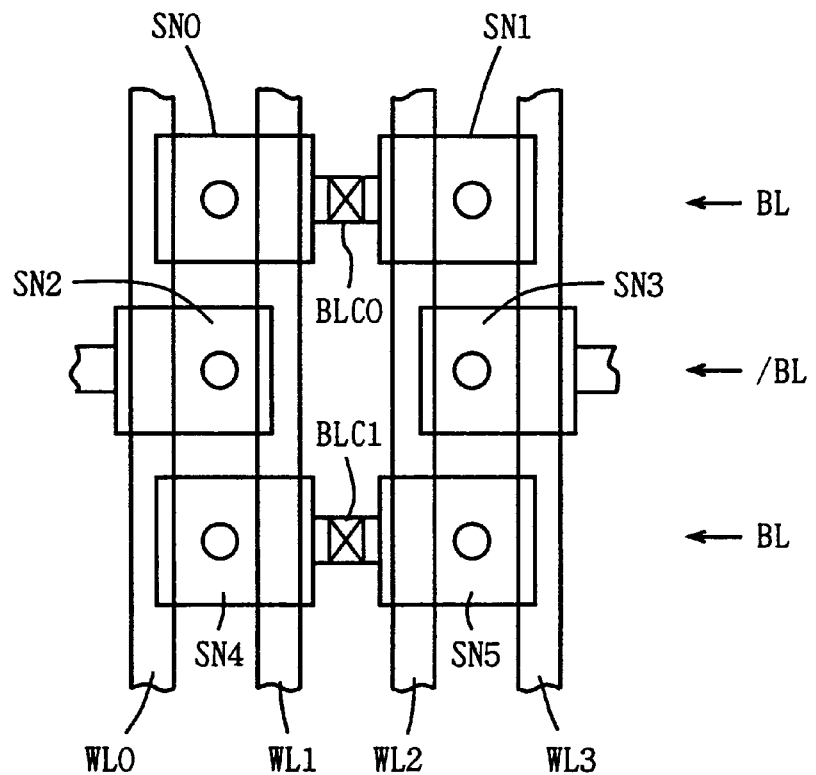
FIG. 69 schematically shows a planar layout of memory cells in the conventional semiconductor memory device.

In the structure shown in FIG. 18, the cell plate lines are provided corresponding to the respective main word lines, and the voltages on the cell plate lines are controlled in accordance with the cell plate voltage control signals and the signal potentials on the main word lines. In the structure shown in FIG. 18, therefore, it is not necessary to produce the block select signal designating a row block including a selected main word line, and an area occupied by the interconnection lines can be reduced. Each cell plate line is arranged for the memory cells in two rows in the corresponding sub-array. Therefore, the pitch of the cell plate lines is equal to a double pitch of the sub-word lines, and the cell plate line can be arranged with a margin. Even if the memory cells are arranged in a plan layout shown in FIG. 69, the cell plate electrode layer of the memory cells provided for two main word lines MWL0 and MWL1 can extend in the row direction, and therefore can be arranged easily.

In the structure shown in FIG. 18, cell plate lines CPL0–CPL255 are arranged corresponding to main word lines MWL0–MWL255, respectively. However, such a structure may be employed that each cell plate line is provided for two or more main word lines. This structure may be implemented by employing a composite gate formed of an OR circuit receiving the signal on a corresponding main word line and an NAND circuit taking an NAND of the output signal of the OR circuit and cell plate voltage control signal SPC (SPC0, SPC1).

[Embodiment 6]

Figure 19A:
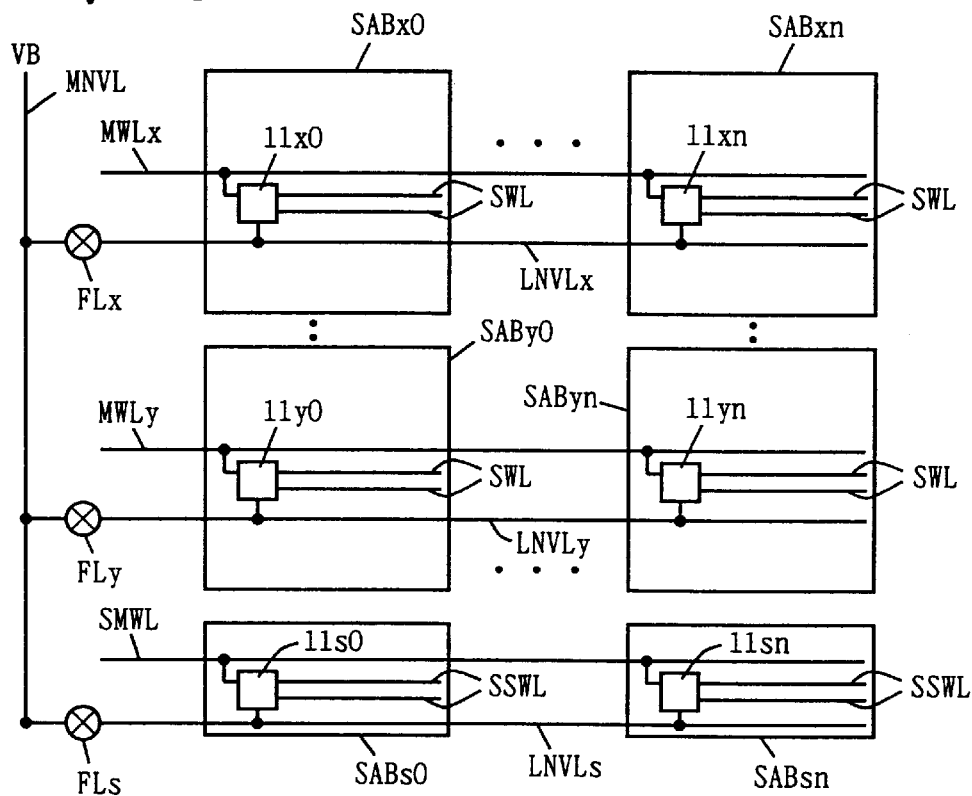
FIG. 19A schematically shows a structure of an array portion of a semiconductor memory device according to an embodiment 6 of the invention.

FIG. 19 schematically shows a structure of a main portion of a semiconductor memory device according to an embodiment 6 of the invention. More specifically, FIG. 19A shows a structure of a memory cell array. In FIG. 19A, a main word line MWLx is arranged for sub-arrays SABx0–SABxn arranged in the row direction, and main word line MWLy is arranged for sub-arrays SABy0–SAByn included in another row block. Apart from sub-arrays SABx0–SABy0 and SABy0 SAByn, there are arranged spare sub-arrays SABs0–SABsn arranged in the row direction. A spare main word lines MWL is arranged extending in the row direction for these spare sub-arrays SABs0–SABsn. Sub-word lines SWL are arranged for main word line MWLx or MWLy in each of sub-arrays SABx0–SABxn and SABy0–SAByn. These sub-word lines SWL are connected to corresponding main word lines MWLx and MWLy through corresponding sub-word line decoders 11x0–11xn and 11y0–11yn. In spare sub-arrays SABs0–SABsn, spare sub-word lines SSWL are arranged corresponding to spare main word line SMWL. These spare sub-word lines SSWL are connected to spare main word line SMWL through spare sub-word line decode circuits 11s0–11sn.

Local negative voltage transmission lines LNVLx and LNVLy transmitting negative voltage VB are arranged for main word lines MWLx and MWLy, respectively. Local negative voltage transmission line LNVLx supplies negative voltage VB to sub-word line decode circuits 11x0–11xn, and local negative voltage transmission line LNVLy transmits negative voltage VB to sub-word line decode circuits 11y0–11yn. These local negative voltage transmission lines LNVLx and LNVLy are coupled to a main negative voltage transmission line MNVL extending in the column direction through the memory cell array through fusible conductive elements (fuse elements) FLx and FLy of a low resistance, respectively.

For spare main word line SMWL, there is arranged a local negative voltage transmission line LNVLs for supplying negative voltage VB to spare sub-word line drive circuits 11so–11sn. Local negative voltage transmission line LNVLs is coupled to a main negative voltage transmission line MNVL through a fuse element FLs.

If a defect is present in a sub-word line SWL, a program circuit (not shown) sets a corresponding main word line MWLx or XWLy to the normally unselected state. In this case, corresponding local negative voltage transmission line LNVLx or LNVLy is disconnected from main negative voltage transmission line MNVL by blowing off a corresponding fuse element FLx or FLy. The defective main word line is replaced with spare main word line SXWL. If no defect is present in the main word lines (sub-word lines) and spare main word line SMWL is not used, fuse element FLs is blown off so that transmission of negative voltage VB to spare sub-word line SSWL is prevented to reduce the current consumption.

When a defective main word line is replaced with a spare main word line, the corresponding local negative voltage transmission line is disconnected from main negative voltage transmission line MNVL by fuse element FL (FLx or FLy), whereby it is possible to prevent transmission of negative voltage VB to any defective sub-word line SWL which is kept fixedly in the unselected state, and the current consumption is reduced.

The local negative voltage transmission lines are provided for the main word lines, respectively, and the local negative voltage transmission line corresponding to a replaced main word line is disconnected from the main negative voltage transmission line. Thereby, it is possible to reduce the current consumption and prevent a malfunction when a bit line and a sub-word line are short-circuited to each other, as will be described below.

Figure 19B:
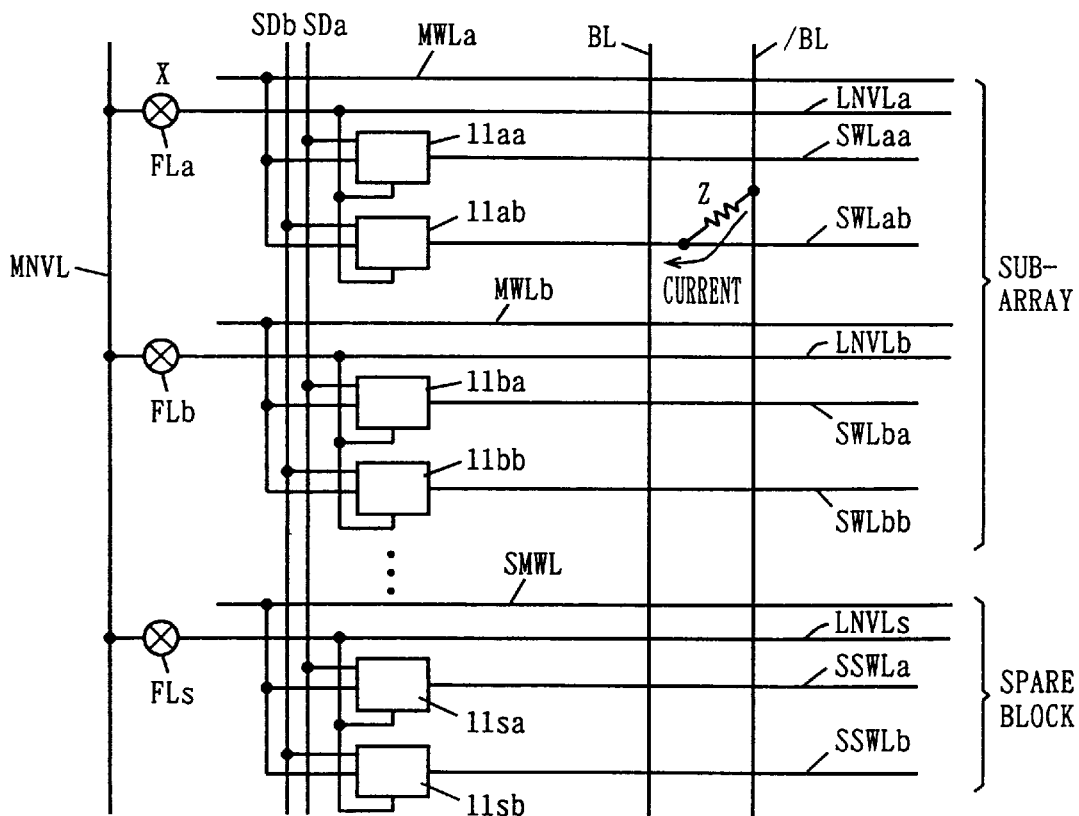
FIG. 19B shows a structure of a sub-array portion shown in FIG. 19A.

FIG. 19B shows a structure of one sub-array together with a spare block. In FIG. 19B, main word lines MWLa and MWLb neighboring to each other extend in the row direction through the sub-arrays included in one row block. For main word line MWLa, there are arranged sub-word lines SWLaa and SWLab. For main word line MWLb, there are arranged sub-word lines SWLba and SWLbb. Sub-word lines SWLaa and SWLab are coupled to main word line MWLa through sub-word line drive circuits 11aa and 11ab, respectively. Sub-word line drive circuits 11aa and 11ab receive word line sub-decode signals SDa and SDb, respectively. A local negative voltage transmission line MNVLa is arranged in parallel with main word line MWLa for supplying negative voltage VB to sub-word line drive circuits 11aa and 11ab. Local negative voltage transmission line LNVLa is coupled to main negative voltage transmission line MNVL through a fuse element FLa.

Similarly, sub-word lines SWLba and SWLbb are arranged for main word line MWLb. Sub-word lines SWLba and SWLbb are coupled to main word line MWL MWLb through sub-word line drive circuits 11ba and 11bb. Sub-word line drive circuits 11ba and 11bb receive word line sub-decode signals SDa and SDb, respectively. A local negative voltage transmission line LNVLb coupled to main negative voltage transmission line MNVL through a fuse element FLb is arranged corresponding to main word line MWLb. Local negative voltage transmission line LNVLb supplies negative voltage VB to sub-word line drive circuits 11ba and 11bb provided for main word line MWLb.

In the spare block, spare sub-word lines SSWLa and SSWLb are arranged corresponding to spare main word line SMWL. Spare sub-word lines SSWLa and SSWLb are coupled to spare main word line SMWL through spare sub-word line drive circuits 11sa and 11sb, respectively. Spare sub-word line drive circuits 11sa and 11sb receive word line sub-decode signals SDa and SDb, respectively. For spare main word line SMWL, there is arranged a local negative voltage transmission line LNVLs which in turn is coupled to main negative voltage transmission line MNVL through a fuse element FLs. Local negative voltage transmission line LNVLs supplies negative voltage VB to spare sub-word line drive circuits 11sa and 11sb.

Bit lines BL and /BL cross sub-word lines SWLaa, SWLab, SWLba, SWLbb, SSWLa and SSWLb. Bit lines BL and /BL are paired with each other, and transmit complementary signals.

It is now assumed that sub-word line SWLab and bit line /BL are short-circuited to each other as represented by a resistance element Z in FIG. 19B. During standby, bit line /BL is precharged to an intermediate voltage. Meanwhile, sub-word line SWLab is held at negative voltage VB level during standby. In this state, therefore, a current flows from bit line /BL at the intermediate voltage level to sub-word line SWLab at the negative voltage level, resulting in increase in current consumption. When the current flowing from bit line /BL raises the voltage level of negative voltage VB, a leak current of the memory cell cannot be reduced by holding the unselected sub-word line in the negative voltage state so that refresh characteristics (data retention characteristics) are degraded. Thus, the data holding characteristics are deteriorated.

When a sub-word line (e.g., sub-word line SWLba) is selected in operation, memory cell data is read onto one of bit lines BL and /BL. When the memory cell data is read onto bit line /BL, the voltage level on bit line /BL lowers due to discharging through resistance element Z so that the H-level data may be sensed and amplified as L-level data.

When a sense amplifier senses the memory cell data and the voltage level on bit line /BL is driven to H-level, a current flows from this bit line /BL to sub-word line SWLab. Thereby, the voltage level on bit line /BL lowers if the leak current is large. This current is supplied from the corresponding sense amplifier so that a current consumption increases.

If the above short-circuit occurs between sub-word line SWLab and bit line /BL, corresponding local negative voltage transmission line LNVLa is disconnected from main negative voltage transmission line MNVL by blowing off fuse element FLa. Main word line MWLa is set to the fixedly unselected state by a program circuit (not shown), and is replaced with spare main word line SMWL (if the resistance element has a relatively large resistance value, and the defect can be repaired by such redundant replacement). Thereby, it is possible to suppress increase in current which may be caused by short-circuit between the sub-word line and the bit line during standby, as well as rising of the voltage level of negative voltage VB which may be caused when the leak current is large.

The local negative voltage transmission lines are provided for the main word lines, respectively, and the local negative voltage transmission line corresponding to a defective main word line is disconnected from the main negative voltage transmission line, whereby it is possible to suppress an influence by the short-circuit between the bit line and the sub-word line on the negative voltage on a normal main word line, and a current consumption during standby can be reduced.

The short-circuit between a sub-word line and a bit line can be detected by tests determining a magnitude of the current consumption during standby and determining whether reading of data can be performed correctly or not when the activation timing of the sense amplifier is delayed.

Blowing of the fuse element is performed in the same step as fuse blowing which is performed during an address programming for replacement of a defective memory cell.

[Modification 1]

Figure 20:
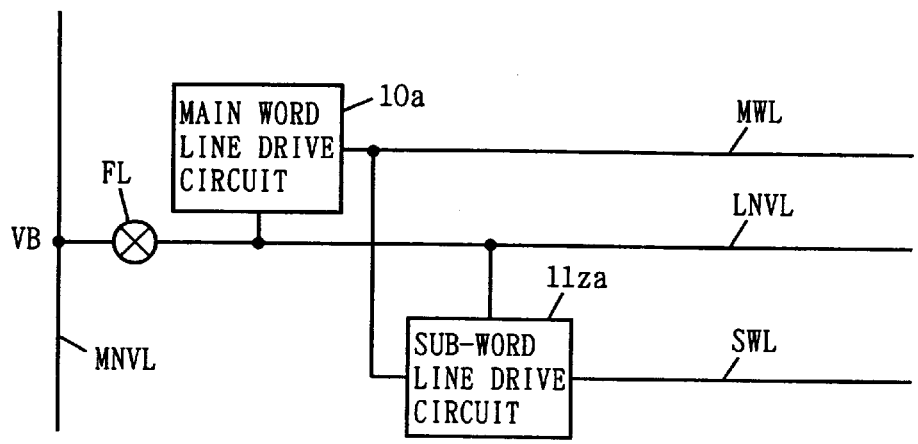
FIG. 20 shows a negative voltage supply path for a main word line drive circuit in a semiconductor memory device according to a embodiment 6 of the invention.

FIG. 20 schematically shows a structure of a modification of an embodiment 6 of the invention. FIG. 20 shows a structure of a portion related to one main word line MWL and one sub-word line SWL. Main word line MWL is driven to the selected/unselected state by main word line drive circuit 10a. Sub-word line SWL is driven to the selected/unselected state by sub-word line drive circuit 11za in accordance with the signal applied from main word line drive circuit 10a onto main word line MWL and the word line sub-decode signal (not shown).

A local negative voltage transmission line LNVL is arranged corresponding to main word line MWL. Local negative voltage transmission line LNVL is coupled to main negative voltage transmission line MNVL through fuse element FL. Local negative voltage transmission line LNVL supplies negative voltage VB to main word line drive circuit 10a and sub-word line drive circuit 11za.

In the structure shown in FIG. 20, supply of the negative voltage to main word line drive circuit 10a is stopped if main word line MWL is replaced with a spare main word line (not shown). In this case, supply of negative voltage VB to main word line MWL which is not used can be stopped so that a current consumption can be reduced. Even if a defect such as short-circuit occurs in main word line MWL, defective main word line MWL can be reliably replaced with the spare main word line, and it is possible to suppress an influence which may be exerted by defective main word line MWL on the negative voltages for the other normal main word lines, as well as increase in current consumption.

In the structure shown in FIG. 20, blowing of fuse element FL may set main word line MWL and sub-word line SWL to the unselected state in an electrically floating state. For preventing this floating state, main word line MWL and sub-word line SWL may be provided with high-resistance resistance elements for attaining the unselected state not at the negative voltage level.

[Modification 2]

Figure 21:
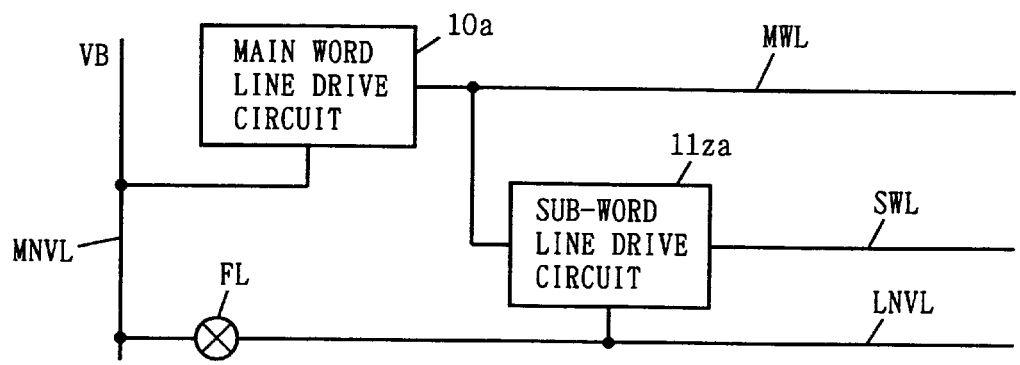
FIG. 21 shows another example of the negative voltage supply path for the main word line drive circuit.

FIG. 21 shows a structure of a modification 2 of the embodiment 6 of the invention. In the structure shown in FIG. 21, main word line drive circuit 10a driving main word line MWL receives negative voltage VB from main negative voltage transmission line MNVL, and sub-word line drive circuit 11za driving sub-word line SWL receives negative voltage VB from local negative voltage transmission line LNVL. Local negative voltage transmission line LNVL is connected to main negative voltage transmission line MNVL through fuse element FL.

In the structure shown in FIG. 21, even if main word line MWL is replaced with a spare main word line, main word line drive circuit 10a receives negative voltage VB from main negative voltage transmission line MNVL. If the sub-word line drive circuit shown in FIG. 10A is used, sub-word line SWL and main word line MWL are disconnected from each other. Therefore, even if short-circuit occurs between sub-word line SWL and the bit line, this short-circuit exerts no influence on main word line MWL.

By reliably fixing defective main word line MWL at negative voltage VB level, such a disadvantageous operation can be prevented that the potential on this main word line MWL rises due to an influence by noises and others during an operation of selecting a memory cell and causes floating up of the potential on sub-word line SWL through sub-word line drive circuit 11za so that the data of a memory cell connected to this sub-word line SWL is read onto a corresponding bit line, and adversely affects an operation of sensing the data of an addressed memory cell.

[Modification 3]

Figure 22:
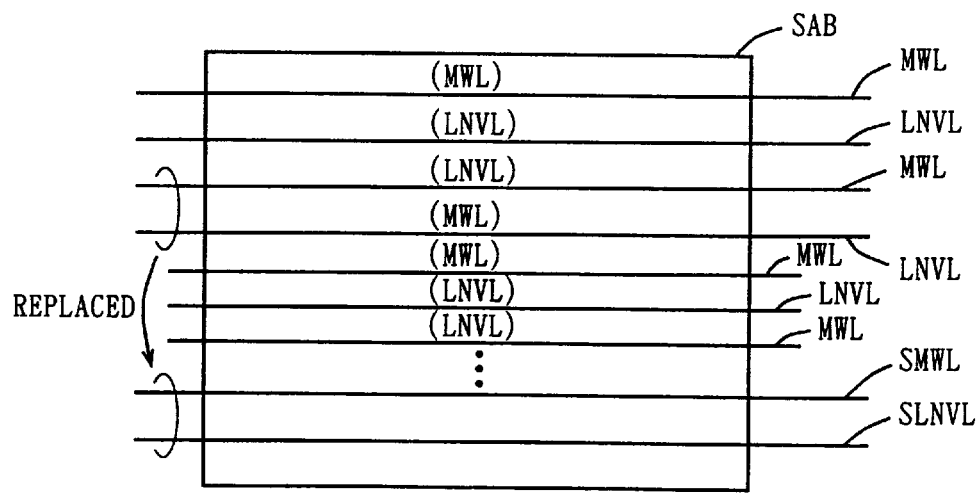
FIG. 22 schematically shows another structure of the memory array of the embodiment 6 of the invention.

FIG. 22 schematically shows a structure of a third modification of the embodiment 6 of the invention. More specifically, FIG. 22 shows one sub-array SAB. In the structure shown in FIG. 22, normal main word line MWL and local negative voltage transmission line MNVL are arranged corresponding to each other in one sub-array SAB, and spare main word line SMWL and spare local negative voltage transmission line SNVL are arranged in the sub-array SAB. If a defective sub-word line is present in this sub-array SAB, a corresponding main word line MWL is replaced with a spare main word line SMWL provided in the same sub-array SAB. Thereby, the defective main word line is repaired (replaced) in a row block including this sub-array SAB.

In the arrangement shown in FIG. 22, sets each including a plurality of (two in the FIG. 22) negative voltage transmission lines may be arranged alternately with respect to main word line sets each including a plurality of (two in the FIG. 22) main word lines MWL as represented within parentheses. In this case, negative voltage transmission line LNVL is arranged on only one side of each main word line, which reduce a possibility of short-circuit between main word line MWL and negative voltage transmission line LNVL.

According to the embodiment 6 of the invention, as described above, the local negative voltage transmission line is provided for each main word line. If a defective sub-word line is present, a local negative voltage transmission line is disconnected from a corresponding main word line, and the defective main word line is replaced with a spare main word line. Therefore, it is possible to prevent flow of a current to the negative voltage source due to a short-circuit to a bit line in the standby cycle. Accordingly, the current consumption can be reduced, and malfunction due to rising of the negative voltage level can be prevented.

[Embodiment 7]

FIG. 23 schematically shows a structure of a main portion of a semiconductor memory device according to an embodiment 7 of the invention. More specifically, FIG. 23 shows a row block RB#1 formed of sub-arrays aligned in the row direction as well as a structure related thereto. P-sense amplifier bands 62i1 and 62ir is formed of cross-coupled p-channel MOS transistors connected to alternate columns of sub-arrays. An N-sense amplifier band 60ik including n-channel MOS transistors is arranged between row blocks RB#i and RB#k neighboring to each other in the column direction. An N-sense amplifier band 60ij including n-channel sense amplifiers is arranged between row block RB#i and row block RB#j. N-sense amplifiers of N-sense amplifier bands 60ik and 60ij are connected to alternate columns (bit line pairs) of the sub-arrays in row block RB#i. Therefore, the semiconductor memory device shown in FIG. 23 has the shared sense amplifier structure of the alternate arrangement type.

A sense isolation gate 64kr, which connects N-sense amplifier band 60ik to the corresponding columns in row block RB#k in response to an isolation instructing signal SIkR, is arranged between N-sense amplifier band 60ik and row block RB#k (P-sense amplifier band). A sense isolation gate 64il, which connects the N-sense amplifiers of N-sense amplifier band 60ik to the corresponding columns (bit line pairs) in row block RB#i in response to an isolation instructing signal SIIL, respectively, is arranged between N-sense amplifier band 60ik and P-sense amplifier band 62il. A sense isolation gate 64ir, which connects the N-sense amplifiers of N-sense amplifier band 60ij to the corresponding columns in row block RB#i in response to an isolation instructing signal SIiR, respectively, is arranged between P-sense amplifier band 60ir and P-sense amplifier band 60ij. An N-sense isolation gate 64jl, which connects the N-sense amplifiers of N-sense amplifier band 60ij to the corresponding columns in row block RB#j in response to an isolation instructing signal SIiL, respectively, is arranged between N-sense amplifier band 60ij and row block RB#j.

When row block RB#i includes a selected main word line, sense isolation gates 64kr and 64jl are turned off, and sense isolation gates 64il and 64ir maintain the on state so that the N-sense amplifiers of N-sense amplifier bands 60ik and 60ij are connected to the respective columns in row block RB#i. The P-channel sense amplifiers of P-sense amplifier bands 62il and 62ir are always connected to the respective columns in row block RB#i. An operation of the semiconductor memory device shown in FIG. 23 will be described below with reference to a waveform diagram of FIG. 24.

During standby, isolation instructing signals SIkR, SIiL, SIiR and SIjL are inactive, and all sense isolation gates 64kr, 64il, 64ir and 64jl are on. Therefore, the bit line pairs in row blocks RB#k, RB#i and RB#j are precharged to a predetermined intermediate potential of (VDD/2) by a precharge/equalize circuit (not shown).

At time ta, an access starts so that isolation instructing signals SIkR and SIjL attain the inactive state of L-level in accordance with an applied address signal, and sense isolation gates 64kr and 64jl are turned off. Thereby, each bit line pair in row block RB#k is isolated from N-sense amplifier band 60ik, and each bit line pair in row block RB#j is isolated from N-sense amplifier band 60ij. Sense isolation gates 64il and 64ir maintain the on state, and bit line pairs of row block RB#i are connected to the corresponding N-sense amplifiers of N-sense amplifier bands 60ik and 60ij.

Figure 24:
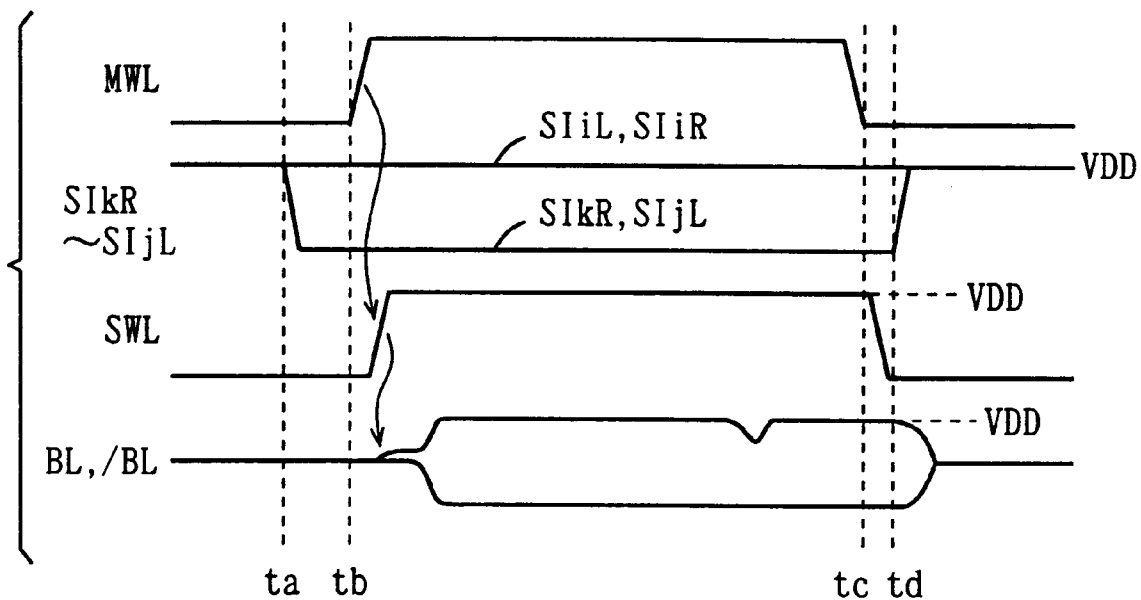
FIG. 24 is a waveform diagram representing an operation of the semiconductor memory device shown in FIG. 23.

Subsequently, decoding is performed at time tb so that main word line MWL is driven to the selected state, and the corresponding sub-word lines SWL are driven to the selected state. Data of the memory cells connected to selected sub-word lines SWL is read onto bit lines BL and /BL, and the sense amplifiers operate. In row block RB#i, the sense amplifiers in P-sense amplifier bands 62il and 62ir and N-sense amplifier bands 60ik and 60ij perform the sensing operation. Thereafter, reading/writing of the data is performed, and then the cell plate voltage is controlled in row block RB#i. FIG. 24 shows an operation waveform of the bit line pair receiving read data at H-level. After completion of boosting of the voltage on the storage node which is performed by controlling the cell plate voltage, main word line MWL is driven to the unselected state at time tc, and sub-word line SWL is driven substantially at the same timing to the unselected state. At subsequent time td, isolation instructing signals SIkR and SIjL rise to H-level, and sense isolation gates 64kr and 64jl are turned on so that each N-sense amplifier in N-sense amplifier bands 60ik and 60ij is connected to the corresponding bit line pair in row block RB#k or RB#j. Thereafter, a circuit (not shown) performs the precharging and equalizing.

The H-levels of main word line MWL and sub-word line SWL are equal to power supply voltage VDD level, and all the H-levels of isolation instructing signals SIkR, SIiL, SIiR and SIjL are equal to power supply voltage VDD level. In this case, the N-sense amplifiers of N-sense amplifier bands 60ik and 60ir are connected to the columns in row block RB#i through the sense isolation gates, respectively. Each of the sense amplifiers in N-sense amplifier bands 60*ik* and 60*ij* drive a bit line lower potential, in the corresponding bit line pair to the ground voltage level. Meanwhile, P-sense amplifier bands 62*il* and 62*ir* are connected to the respective bit line pairs in row block RB#i. Therefore, a bit line at a higher potential in each bit line pair in row block RB#i is reliably driven to power supply voltage VDD level. Therefore, by sharing only the respective N-sense amplifiers of the N-sense amplifier band between the adjacent sub-arrays (row blocks) as shown in FIG. 23, the bit line at a higher potential can be reliably held at H-level of power supply voltage VDD level even if the voltage level of the isolation instructing signal is at power supply voltage VDD level. Thereby, data can be correctly read, and the voltage on storage node can be correctly boosted.

Figure 25:
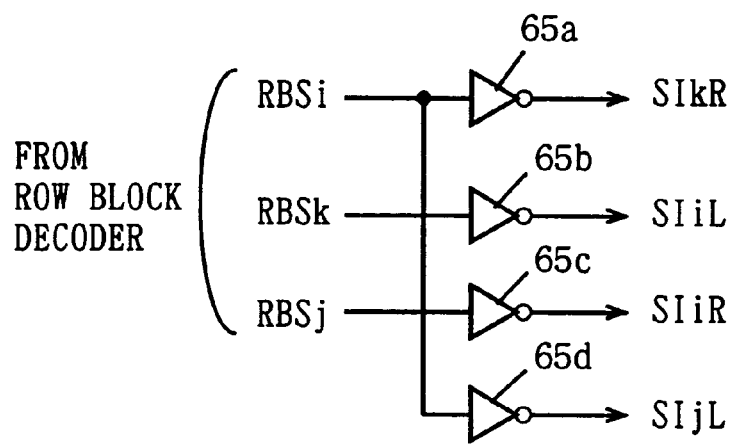
FIG. 25 schematically shows a structure of a portion generating a sense isolation instructing signal shown in FIG. 23.

FIG. 25 shows a structure of a portion generating the isolation instructing signal. In FIG. 25, row block instructing signals RBSi, RBSk and RBSj are generated from a row block decoder which decodes a row block address signal included in an address signal designating a main word line, and designate row blocks RB#i, RB#k and RB#j, respectively. Isolation instructing signal SIkR is produced by an inverter 65*a* receiving block instructing signal RBSi. Isolation instructing signal SIkL is produced by an inverter 65*b* receiving block instructing signal RBSk. Isolation instructing signal SIiR is produced by an inverter 65*c* receiving block instructing signal RBSj. Isolation instructing signal SIJL is produced by an inverter 65*d* receiving block instructing signal RBSi. Therefore, the isolation instructing signal for the unselected row block neighboring to a selected row block is activated, and the corresponding sense isolation gate is turned off.

In the structure shown in FIGS. 23 and 25, when one row block is selected, the sensing operation is performed in all the sub-arrays included in the selected row block, and thus all the sub-arrays are activated. However, such a structure may be employed that only a predetermined number of sub-arrays are activated in the selected row block, and this structure can be implemented by further coupling the isolation instructing signal generating portion with the sub-array instructing signal. Thus, inverters 65*a*–65*d* in FIG. 25 are replaced with NAND circuits which receive the row block designating signals and the column block designating signals.

[Specific Structure]

Figure 26:
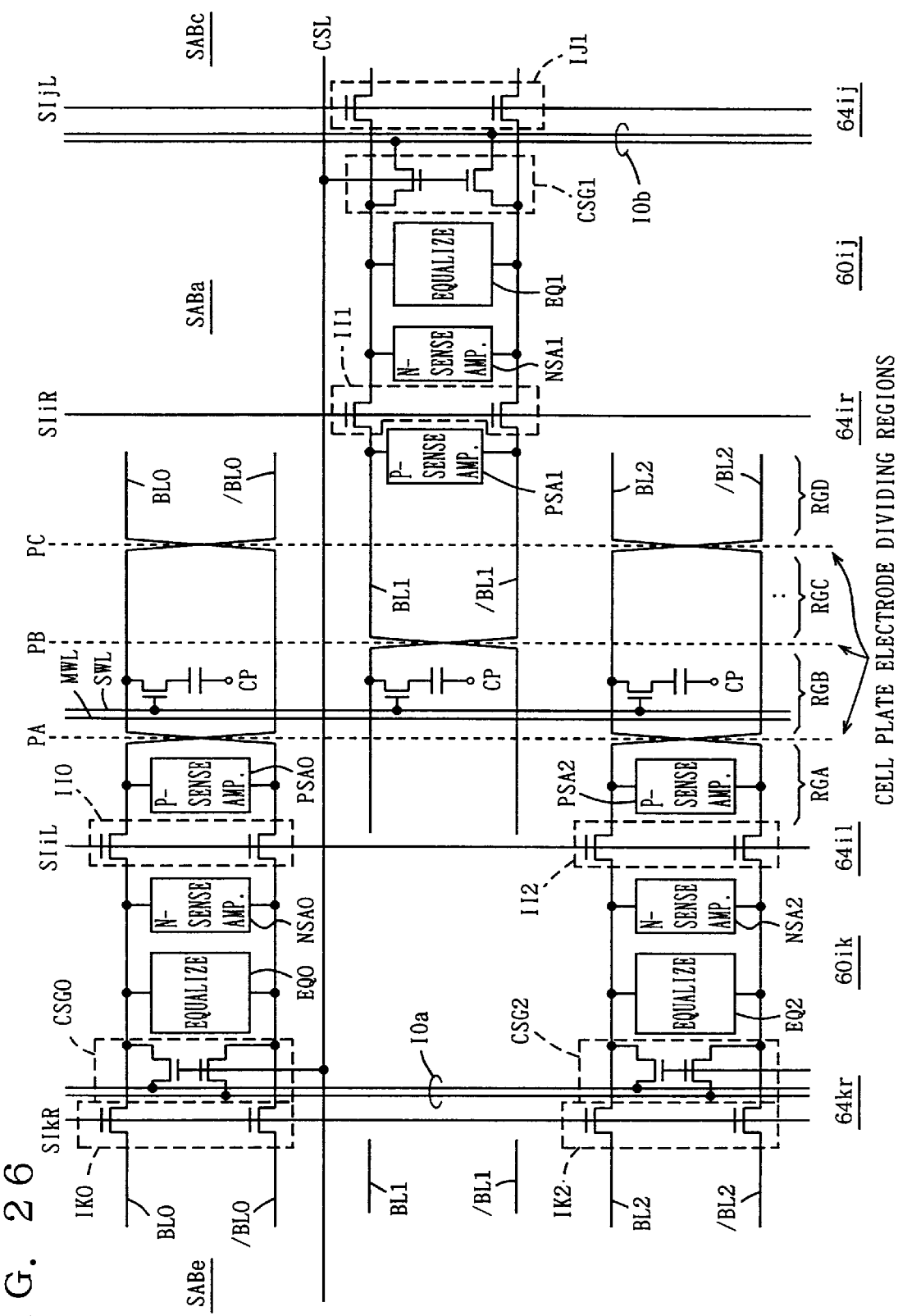
FIG. 26 specifically shows a structure of a main portion of a semiconductor memory device according to an embodiment 8 of the invention.

FIG. 26 schematically shows a structure of a sub-array portion of the semiconductor memory device according to an embodiment 7 of the invention. More specifically, FIG. 26 shows a structure of a portion related to sub-array SABa.

In sub-array SABa, P-sense amplifiers PSA0, PSA1 and PSA2 formed of p-channel MOS transistors are connected to bit line pairs BL0 and /BL0, BL1 and /BL1, and BL2 and /BL2, respectively. These P-sense amplifiers PSA0–PSA2 are shifted in position in the column direction of sub-array SABa from each other, and are located alternately on opposite sides. Sub-array SABa is included in row block RB#i shown in FIG. 23.

N-sense amplifier band 60*ik* between sub-arrays SABa and SABe includes N-sense amplifiers NSA0, NSA2, . . . which are provided for even-numbered bit line pairs, respectively, equalize circuits EQ0, EQ2, . . . for equalizing corresponding bit line pairs to the intermediate voltage of VDD/2, respectively, and column select gates CSG0, CSG2, . . . for connecting a selected bit line pair to an internal data line pair IOa in accordance with a column select signal.

N-sense amplifier band 60*ij* arranged between sub-arrays SABa and SABc includes N-sense amplifiers NSA1, equalize circuits EQ1 and column select gates CSG1 which are provided for bit line pairs in sub-arrays SABa and SABc. Column select gate CSG1 connects the corresponding bit line pair to an internal data line pair IOb. Internal data line pairs IOa and IOb are arranged for only the corresponding sub-array, and are coupled to a global data bus line pair which in turn is provided commonly to the sub-arrays arranged in the column direction and included in the column block.

Sense isolation gate 64*kr* arranged between sub-arrays SABe and SABa includes isolation gate circuits IK0 and IK2, which in turn connect bit line pairs (BL0 and /BL0) and (BL2 and /BL2) to corresponding N-sense amplifiers NSA0 and NSA2 in accordance with isolation instructing signal SIkr, respectively. Sense isolation gate 64*il* includes isolation gate circuits II0 and II2 for connecting even-numbered bit line pairs (BL0 and /BL0) and (BL2 and /BL2) in the sub-array SABa to corresponding N-sense amplifiers NSA0 and NSA2 in response to isolation instructing signal SIIL, respectively.

Sense isolation gate 64*ir* includes isolation gate circuits II1, . . . which are provided for odd-numbered bit line pairs BL1 and /BL1 in sub-array SABa, and connect the bit line pairs BL1 and /BLI to corresponding N-sense amplifiers NSA1, . . . in response to isolation instructing signal SIIR, respectively. Sense isolation gate 64*ij* includes isolation gate circuits IJ1 which are provided for odd-numbered bit line pairs in sub-array SABc and connect the corresponding bit line pairs to N-sense amplifiers NSA1, Iee, respectively.

In accordance with the alternate arrangement structure of the N-sense amplifiers, the isolation gate circuits are arranged alternately according to the N-sense amplifiers. This alternate arrangement structure of the sense amplifiers allows the pitch of the sense amplifiers to be double the pitch of the bit line pairs, and therefore the sense amplifiers can be arranged with a margin.

Isolation gate circuits IK0, II0, II1, IK2 and IJ1 include, for example, transfer gates formed of n-channel MOS transistors, respectively. Therefore, if isolation instructing signals SIkR, SIiL and SIjL rise only up to power supply voltage VDD level, the voltage level which can be transmitted onto the bit line is equal to (power supply voltage VDD−Vth), where Vth represents a threshold voltage of the transfer gate. However, P-sense amplifiers PSA0–PSA2 are provided for the bit line pairs, and the bit line at a higher potential in each bit line pair is driven to power supply voltage VDD level. Therefore, it is not necessary to use any boosted signal as the isolation instructing signal, and the gate insulating films of the transfer gates of the isolation gate circuits included in the sense isolation gate can surely have sufficient reliability.

The bit line pair has a structure of "twisted bit line pair". More specifically, each sub-array is equally divided in the column direction into four regions, and even-numbered bit line pair has two crossings in the dividing or quadrisecting regions. The odd-numbered bit line pair has a crossing in the central region (halving region) of the quadrisecting regions. According to the twisted bit line structure, a parasitic capacitance between neighboring bit lines is small, and it is possible to reduce noises which may occur due to the capacitance coupling between bit line pairs during the sensing operation so that the sense operation can be performed stably.

In this twisted bit line structure, the crossings of neighboring bit line pairs are located in different positions. No memory cell is arranged in this crossing. In sub-array SABa, therefore, the cell plate electrode layer is arranged commonly to the memory cells included in the respective quadrisected four regions RGA, RGB, RGC and RGD, and the cell plate electrode layer is divided in regions PA, PB and PC where the crossings are formed. In crossing regions PA, PB and PC where no memory cell is present, no memory cell capacitor is naturally present, and the cell plate electrode layer can be divided easily in crossing regions PA, PB and PC.

According to the embodiment 7 of the invention, as described above, the N-sense amplifiers formed of n-channel MOS transistors have the shared sense amplifier structure, and the P-sense amplifiers formed of p-channel MOS transistors are provided for the respective sub-arrays. Therefore, the bit line pair can be reliably driven to the power supply voltage level without using a boosted signal.

Owing to the twisted bit line structure, the cell plate electrode layer can be easily divided in the regions where the twisted portions are formed, respectively.

The structure for controlling the voltage on the cell plate electrode layer can be the same as that in any one of the embodiments 1 to 5.

The number of sub-array equally divided in the column direction may be a number such as two or eight other than four.

[Embodiment 8]

Figure 27:
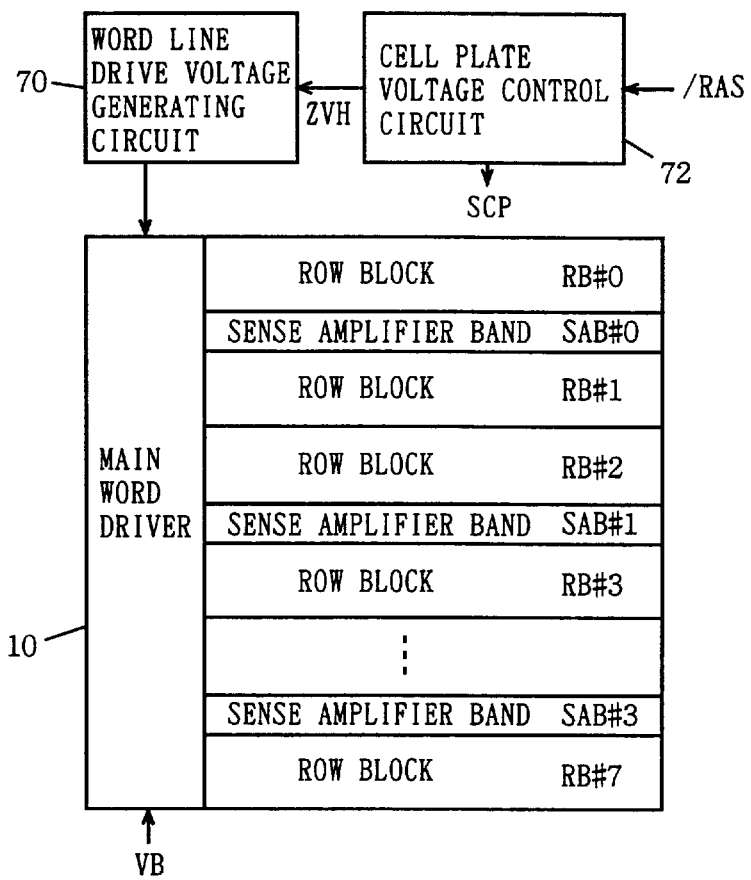
FIG. 27 schematically shows a whole structure of a semiconductor memory device according to an embodiment 8 of the invention.

FIG. 27 schematically shows a structure of a main portion of a semiconductor memory device according to an embodiment 8 of the invention. In FIG. 27, the memory array is divided into a plurality of row blocks RB#0–RB#7. Each of row blocks RB#0–RB#7 is divided into a plurality of sub-arrays, similarly to the structure shown in FIG. 4. Sense amplifier bands SAB#0–SAB#3 each including a plurality of sense amplifiers are arranged between neighboring row blocks, respectively. In the structure shown in FIG. 27, sense amplifier bands SAB#0–SAB#3 include both the P- and N-sense amplifiers, which in turn are formed of p- and n-channel MOS transistors, respectively. The sense amplifiers are arranged into the "shared sense amplifier arrangement", and the "alternate arrangement" is not employed. Therefore, sense amplifier band SAB#0 is commonly Iused by row blocks RB#0 and RB#1, and sense amplifier band SAB#1 is commonly used by row blocks RB#2 and RB#3. A sense amplifier band is not arranged between row blocks RB#1 and RB#2. Sense amplifier band SAB#3 is commonly used by row blocks RB#6 and RB#7 (not shown).

Commonly to these row blocks RB#0–RB#7, there is arranged a main word driver 10 for driving the main word lines. Main word driver 10 receives a word line drive voltage from a word line drive voltage generating circuit 70, which in turn lowers the voltage level of the word line drive voltage in response to an output signal of a cell plate voltage control circuit 72 generating cell plate voltage control signal SCP. Word line drive voltage generating circuit 70 lowers the voltage levels on a selected main word line and a selected sub-word line in boosting of the H-level data for the following purpose.

Since each of sense amplifier bands SAB#0–SAB#3 includes both the N- and P-sense amplifiers, the H-level of a bit line is lower than the level of power supply voltage VDD. Thereby, an access transistor may be turned on in boosting of the H-level data, and charges may flow to the corresponding bit line due to capacitive coupling. The foregoing purpose is to prevent this flow of the charges.

Figure 28:
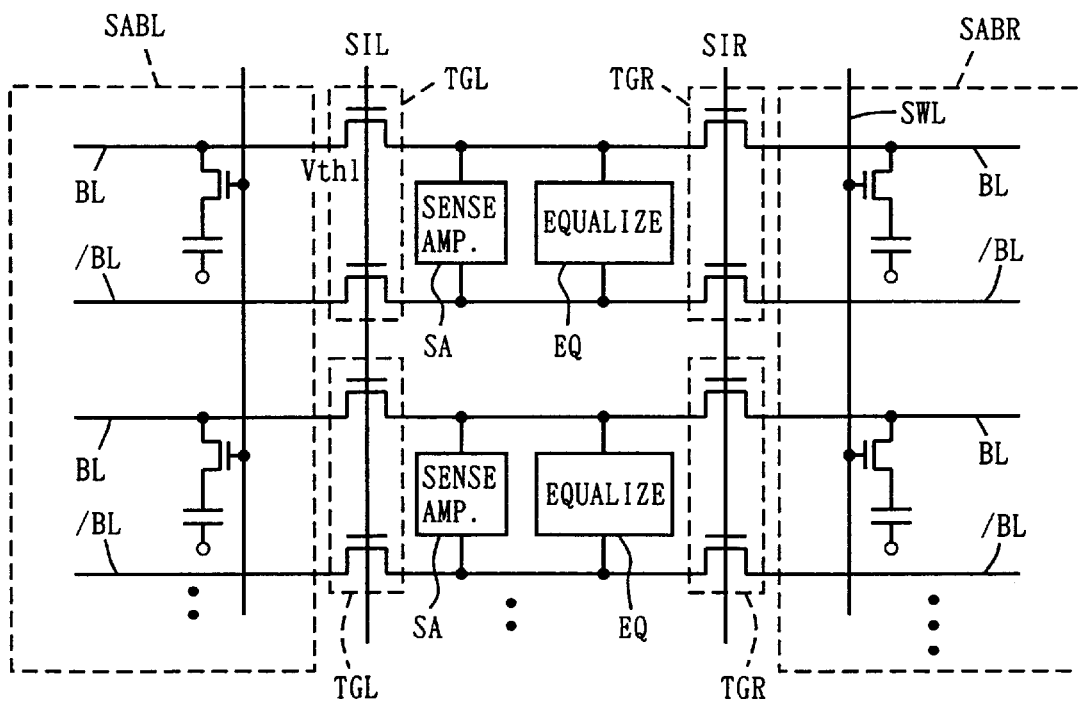
FIG. 28 schematically shows a structure of neighboring sub-arrays in the semiconductor memory device shown in FIG. 27.
Figure 29:
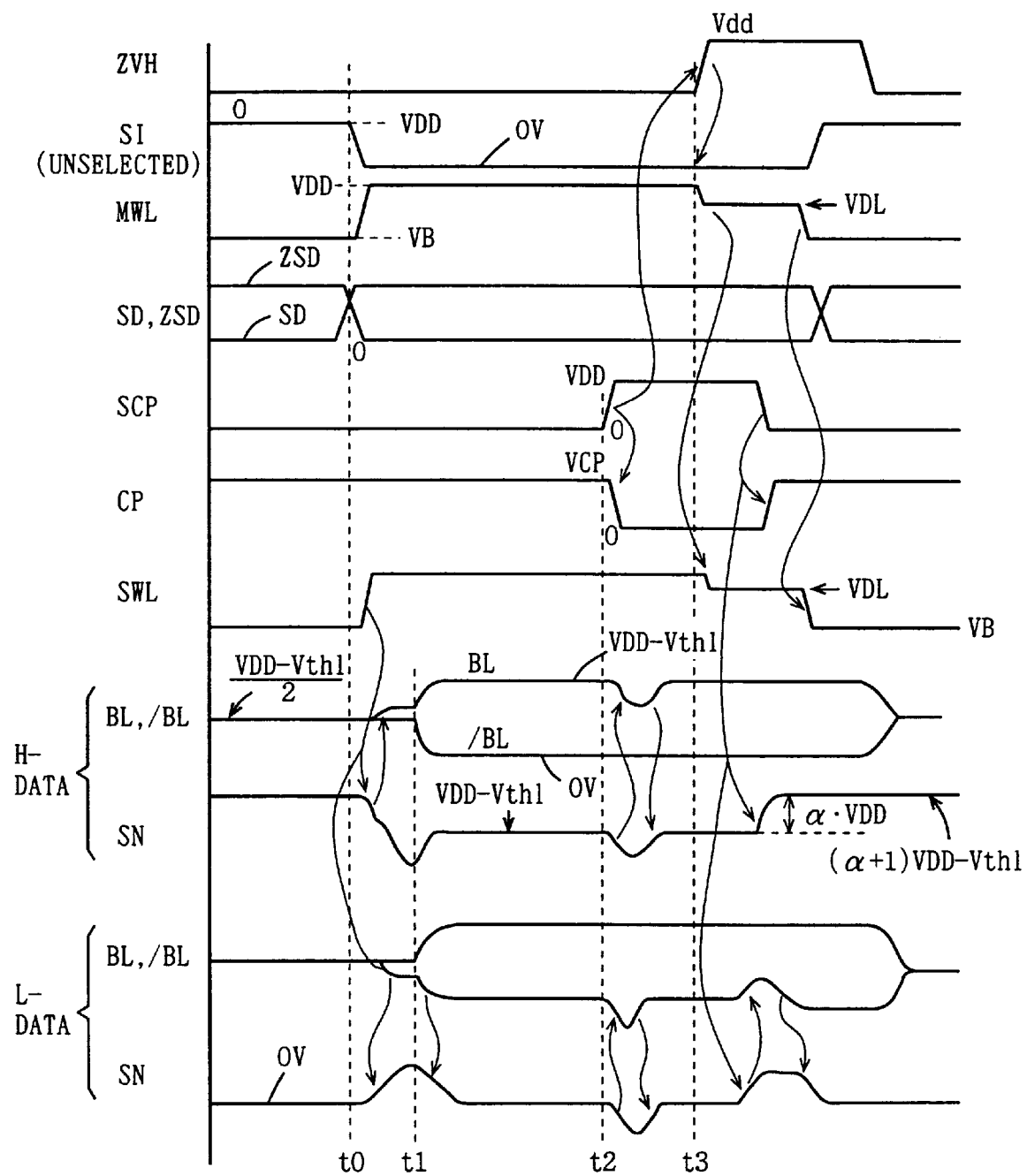
FIG. 29 is a signal waveform diagram representing an operation of the semiconductor memory device shown in FIG. 28.

FIG. 28 shows a structure of sub-arrays neighboring to each other in the column direction in the semiconductor memory device shown in FIG. 27. FIG. 28 representatively shows two bit line pairs BL and /BL in each of sub-arrays SABL and SABR. Sense amplifiers SA and bit line equalize circuits EQ are arranged between sub-arrays SABL and SABR. Bit lines BL and /BL in sub-array SABR are connected to sense amplifier SA and equalize circuit EQ through an isolation gate circuit TGR which in turn is made conductive in response to an isolation instructing signal SIR. Bit lines BL and /BL in sub-array SABL are connected to sense amplifier SA and equalize circuit EQ through an isolation gate circuit TGL which in turn is made conductive in response to an isolation instructing signal SIL. The H-levels of isolation instructing signals SIL and SIR are equal to power supply voltage VDD level. Each of isolation gate circuits TGL and TGR includes transfer gates provided corresponding to bit lines BL and /BL and formed of n-channel MOS transistors, respectively. An operation of the semiconductor memory device shown in FIG. 28 will be described below with reference to a waveform diagram of FIG. 29.

During standby before time t0, both isolation instructing signals SIL and SIR are held at H-level of power supply voltage VDD level. In this state, isolation gate circuits TGL and TGR are on, and bit lines BL and /BL of sub-arrays SABL and SABR are precharged to the intermediate voltage level by the corresponding equalize circuits EQ, respectively. The transfer gates included in isolation gate circuits TGL and TGR include n-channel MOS transistors having a low threshold voltage of Vthl. Therefore, the voltage amplitudes on bit lines BL and /BL are determined between ground voltage VSS (0 V) and (VDD−Vthl). Accordingly, equalize circuit EQ precharges bit lines BL and /BL to the potential level of (VDD−Vthl)/2.

When an active cycle starts, the isolation instructing signal for an unselected sub-array falls from H-level to L-level of the ground voltage level at time t0. It is now assumed that sub-word line SWL in sub-array SABR is selected. In this case, isolation instructing signal SIL attains L-level, and isolation instructing signal SIR maintains H-level. Then, word line sub-decode signals SD and ZSD are made definite, and main word line MWL is driven to power supply voltage VDD level. An unselected main word line maintains negative voltage VB level. When the potential level on main word line MWL rises, and word line sub-decode signals SD and ZSD are defined, a corresponding sub-word line SWL in sub-array SABR is driven to the selected state. When the voltage level on sub-word line SWL rises to power supply voltage VDD level, data of a memory cell is read onto bit line BL or /BL. In a memory cell storing H-level data, the potential level on storage node SN lowers, and the voltage level on the corresponding bit line BL rises. In a memory cell storing L-level data, the voltage on its storage node SN rises, and the voltage level on the corresponding bit line BL lowers.

Then, sense amplifier SA is activated at time t1, and the voltage levels on bit lines BL and /BL in selected sub-array SABR are driven to the levels of (VDD−Vthl) and ground voltage (0 V). After writing/reading of the data, the voltage level of cell plate voltage control signal SCP from cell plate voltage control circuit 72 shown in FIG. 27 rises to H-level.

In response to this rising of cell plate voltage control signal SCP, the voltage levels on cell plate electrode nodes CP of the memory cells in a plurality of rows including the selected memory cells lower from the reference voltage VCP, at which the nodes CP were kept during standby, to the ground voltage of 0 V. As a result of this lowering of the voltage level on cell plate electrode node CP, the voltage level on corresponding bit line BL lowers. However, the lowered voltage on bit line BL soon returns to the original level because sense amplifier SA is operating.

After the voltage levels on bit lines BL and /BL returned to the original voltage levels, a control signal ZVH from cell plate voltage control circuit 72 shown in FIG. 27 rises to H-level at time t3, and the word line drive voltage generated by word line drive voltage generating circuit 70 lowers from the level of power supply voltage VDD to a lower level of voltage VDL. In accordance with lowering of the voltage level on main word line MWL, the voltage level on selected sub-word line SWL also lowers (the sub-word line drive circuit is formed of the transfer gate). Thereafter, cell plate voltage control circuit 72 lowers cell plate voltage control signal SCP to L-level. Thereby, the voltage level on cell plate electrode nodes CP in a plurality of rows including the selected memory cell return to the initial level of reference voltage VCP. In response to this rising of the voltage level on cell plate electrode node CP, the voltage level on storage node SN rises.

In a memory cell storing H-level data, the voltage level on sub-word line SWL is equal to the level of voltage VDL, and the storage node SN has the voltage level raised through the capacitive coupling, whereby the access transistor has the gate voltage not higher than the source voltage and maintains the off state so that flow of charges from storage node SN to the corresponding bit line BL is prevented. The voltage level on storage node SN rises to $((\alpha+1)VDD-Vthl)$. In this case, the access transistor and the transfer gate of the isolation gate circuit have equal threshold voltages.

In a memory cell storing L-level data, sense amplifier SA clamps bit line BL at the ground voltage level even when the voltage level on storage node SN rises, and the access transistor maintains the on state so that the storage node SN is discharged and attains the ground voltage level again.

When restoring of charges (i.e., boosting) is completed, the voltage level on main word line MWL lowers so that sub-word line SWL returns to the unselected state, and word line sub-decode signals SD and ZSD return to the initial state. Then, both isolation instructing signals SIL and SIR attain H-level, and bit lines BL and /BL in sub-array SABL are connected to the corresponding equalize circuit EQ. Thereafter, the sense amplifiers are deactivated and equalize circuits EQ are activated so that bit lines BL and /BL in sub-arrays SABL and SABR are precharged to the intermediate voltage level of (VDD−Vthl)/2.

Thereafter, control signal ZVH from cell plate voltage control signal 72 lowers to L-level at a predetermined timing. Falling of control signal ZVH from H-level to L-level may be performed at any timing after driving of main word line MWL to the unselected state of L-level.

Figure 30:
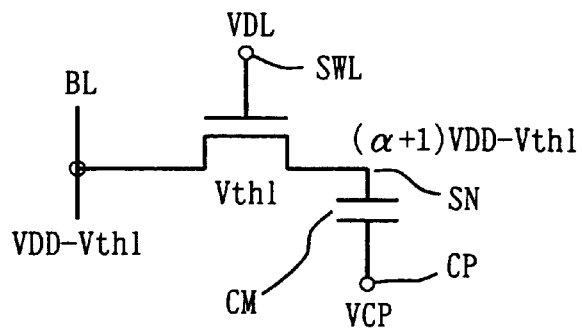
FIG. 30 shows voltages upon boosting of a storage node of a memory cell according to the embodiment 8 of the invention.

FIG. 30 shows voltages on respective nodes of the memory cell when a voltage level on cell plate electrode node CP is boosted from the ground voltage to reference voltage VCP for the standby. The voltage level on bit line BL is equal to (VDD−Vthl). The gate voltage of the access transistor is equal to VDL, and the voltage level on storage node SN is equal to $((\alpha+1)VDD-Vthl)$. Assuming that K represents a coefficient of capacitive coupling of capacitor CM, a relationship of $K \cdot VCP = \alpha \cdot VDD$ is satisfied. A threshold voltage of the access transistor is equal to threshold voltage Vthl of the transfer gate included in the isolation gate circuit. When the voltage level on storage node SN exceeds the voltage level on bit line BL, the access transistor has the node connected to the bit line serves as the source node. The access transistor maintains the off state when the condition expressed by the following relation is satisfied.

$VDL-(VDD-Vthl<Vthl$

When the voltage on a storage node storing L-level data is boosted, the access transistor must maintain the on state. Therefore, the following relation holds.

$Vthl<VDL<VDD$

Thus, voltage VDL is required to be lower than power supply voltage VDD and to be higher than threshold voltage Vthl.

[Structure of Cell Plate Voltage Control Circuit 72]

Figure 31:
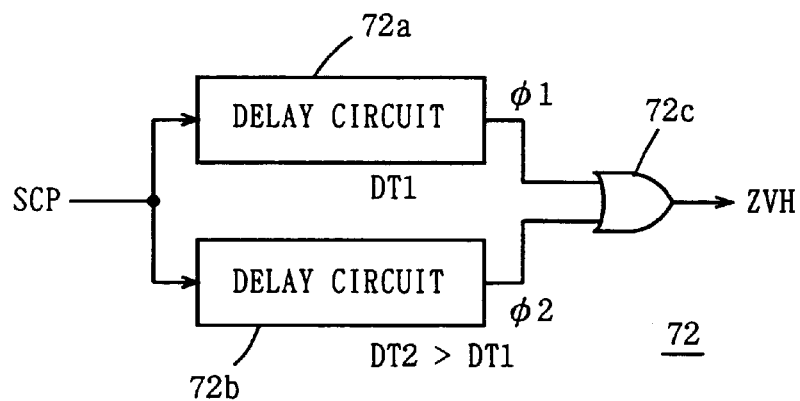
FIG. 31 shows an example of a structure of a word line drive voltage control signal generating portion coupled to a cell plate voltage control circuit shown in FIG. 27.

FIG. 31 shows a structure of a portion generating word line drive voltage control signal ZVH in cell plate voltage control circuit 72 shown in FIG. 27. Cell plate voltage control signal SCP can be generated by utilizing the structure of the one-shot pulse generating circuit shown in FIG. 11.

Figure 32:
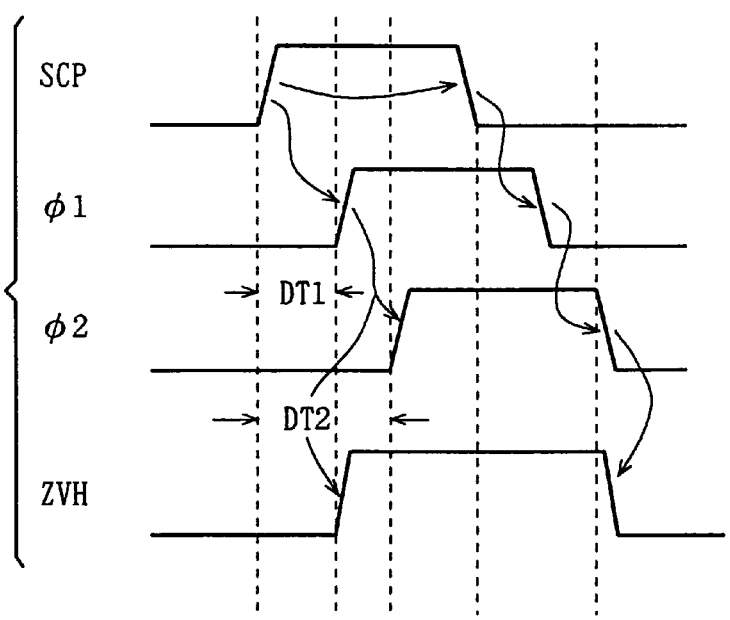
FIG. 32 is a signal waveform diagram representing an operation of a circuit shown in FIG. 31.

In FIG. 31, cell plate voltage control circuit 72 includes a delay circuit 72a which delays cell plate voltage control signal SCP by a predetermined time DT1, a delay circuit 72b which delays cell plate voltage control signal SCP by a predetermined time DT2, and an OR circuit 72c which receives output signals $\phi 1$ and $\phi 2$ of delay circuits 72a and 72b. OR circuit 72c generates word line drive voltage control signal ZVH. Delay time DT2 of delay circuit 72b is longer than delay time DT1 of delay circuit 72a. An operation of cell plate voltage control circuit 72 shown in FIG. 31 will be described below with reference to a signal waveform diagram of FIG. 32.

In accordance with the precharge instruction, cell plate voltage control signal SCP rises to H-level. After elapsing of delay time DT1, output signal $\phi 1$ of delay circuit 72a rises to H-level. Correspondingly, word line drive voltage control signal ZVH from OR circuit 72c rises to H-level. When delay time DT2 elapses, output signal $\phi 2$ of delay circuit 72b rises to H-level.

When cell plate voltage control signal SCP falls to L-level after elapsing of a predetermined period, output signal $\phi 1$ from delay circuit 72a falls to L-level after delay time DT1. In this state, output signal $\phi 2$ of delay circuit 72b is still at H-level, and word line drive voltage control signal ZVH maintains H-level. When delay time DT2 elapses after falling of cell plate voltage control signal SCP, output signal $\phi 2$ of delay circuit 72b falls to L-level so that word line drive voltage control signal ZVH likewise falls to L-level. While word line drive voltage control signal ZVH is at H-level, voltage VDL lower than power supply voltage VDD is transmitted onto a selected main word line and a selected sub-word line.

[Structure of Main Word Driver]

Figure 33:
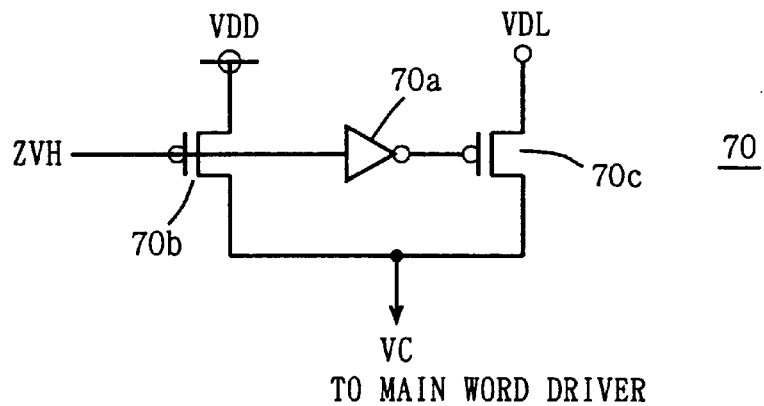
FIG. 33 schematically shows a structure of a word line drive voltage generating circuit shown in FIG. 27.

FIG. 33 shows an example of a structure of word line drive voltage generating circuit 70 in FIG. 27. In FIG. 33, word line drive voltage generating circuit 70 includes an inverter 70a receiving word line drive voltage control signal ZVH, a p-channel MOS transistor 70b which is turned on to transmit power supply voltage VDD when word line drive voltage control signal ZVH is at L-level, and a p-channel MOS transistor 70c which is turned on to transmit voltage VDD when the output signal of inverter 70a is at L-level. The output nodes of these MOS transistors 70b and 70c are commonly connected to a main word driver to transmit word line drive voltage VC thereto.

Figure 34:
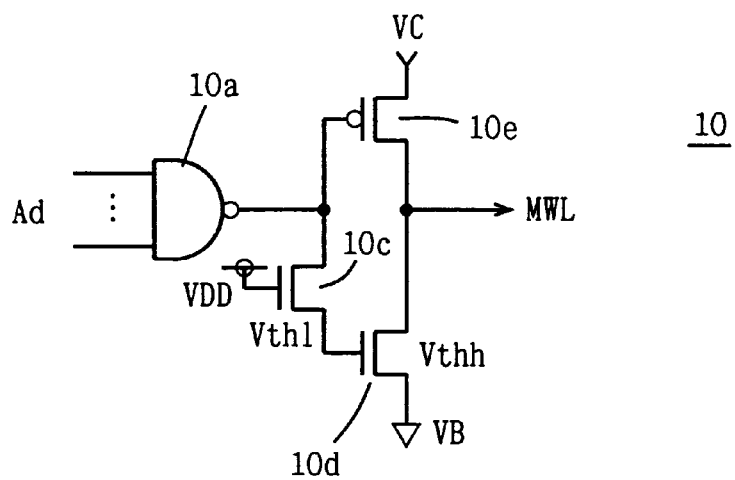
FIG. 34 shows a structure of a main word line drive circuit included in a main word driver shown in FIG. 27.

FIG. 34 shows a structure of main word driver 10. More specifically, FIG. 34 shows a structure of the main word line drive circuit provided for one main word line MWL. The structure of the main word line drive circuit shown in FIG. 34 differs from the structure shown in FIG. 7 only in that p-channel MOS transistor 10e receives word line drive voltage VC instead of power supply voltage VDD. In the structure shown in FIGS. 33 and 34, word line drive voltage VC is at the level of power supply voltage VDD when word line drive voltage control signal ZVH is at L-level. In this state, therefore, a signal at the level of power supply voltage VDD is transmitted onto a selected main word line MWL. When word line drive voltage control signal ZVH is at H-level, p-channel MOS transistor 70c is on, and voltage VDL is transmitted onto a main word line MWL through the word line drive circuit. By utilizing the structure shown in FIGS. 33 and 34, the voltage level on a selected main word line can be lowered, and the voltage level on a selected sub-word line can also be lowered. The sub-word line drive circuit can be comprised of the foregoing structure shown in FIG. 8, and the word line sub-decode signal generating circuit can be comprised of the structure shown in FIG. 9.

[Voltage VDL Generating Circuit]

Figure 35A:
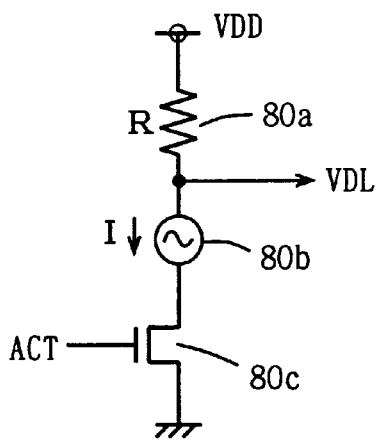
FIG. 35A shows an example of a structure of a word line drive voltage generating portion.
Figure 35B:
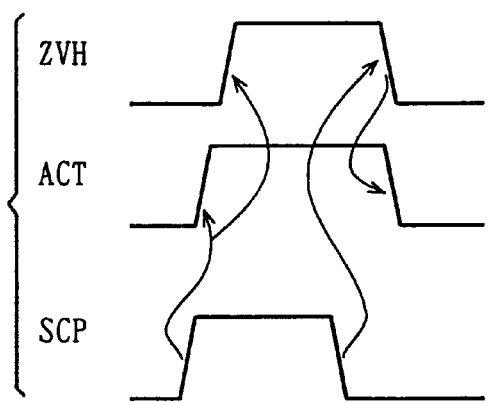
FIG. 35B is a signal waveform diagram representing an operation of the circuit shown in FIG. 35A.

FIG. 35A shows an example of the structure of a word line drive voltage generating portion. In FIG. 35A, the portion of generating word line drive voltage VDL includes a resistance element 80a connected between a power supply node and an output node, a constant current source 80b which supplies a constant current I through resistance element 80a, and an n-channel MOS transistor 80c which is connected between constant current source 80b and a ground node, and electrically connects constant current source 80b to the ground node in response to activation of an activating signal ACT. An operation of the word line drive voltage generating portion shown in FIG. 35A will be described below with reference to a waveform diagram of FIG. 35B.

When cell plate voltage control signal SCP is at L-level, activating signal ACT is at L-level, and MOS transistor 80c is off. In this state, voltage VDL is at the level of power supply voltage VDD. When cell plate voltage control signal SCP rises to H-level, activating signal ACT attains H-level after a predetermined time, and the current from constant current source 80b is discharged to the ground node so that voltage VDL lowers to the voltage level of (power supply voltage VDD−I·R), where R represents a resistance value of resistance element 80a.

When voltage VDL lowers to the level lower than power supply voltage VDD, then word line drive voltage control signal ZVH attains H-level, and voltage VDL lower than power supply voltage VDD is transmitted onto a main word line MWL, and the voltage levels of main word line MWL and the sub-word line lower. Thereafter, cell plate voltage control signal SCP is deactivated, and word line drive voltage control signal ZVH attains the inactive state of L-level so that activating signal ACT attains L-level. Thereby, MOS transistor 80c is turned off, and voltage VDL rises to power supply voltage VDD level again.

In the structure shown in FIG. 35A, MOS transistor 80c is turned on only when the voltage VDL is to be lowered. Thus, current consumption of the portion generating voltage VDL can be reduced. This word line drive voltage generating portion only drives one or a plurality of main word lines, and is not required of a large current drive capability.

In the structure shown in FIG. 35A, resistance element 80a may be replaced with an MOS transistor which is diode-connected and causes a voltage drop of an absolute value of a threshold voltage thereof. By lowering the voltage level of activating signal ACT, MOS transistor 80c may be used as the constant current source.

The embodiment 8 uses the shared sense amplifier structure. The shared sense amplifier structure of the alternate arrangement type may be used. The control of the cell plate voltage can be performed in any manner in the embodiment 1 already described.

According to the embodiment 8 of the invention, as described above, the shared sense amplifier structure is employed, and the voltage levels of a selected main word line and a selected sub-word line are lowered when the voltage on the storage node is to be boosted. Therefore, even when the amplitude of the bit line voltage does not reach the full power supply voltage level, it is possible to prevent flow of charges from a storage node storing H-level data to a bit line, and the voltage on the storage node can be reliably boosted.

The bit line precharge voltage is equal to (VDD−Vthl)/2. This precharge voltage can be easily produced by lowering the power supply voltage by a diode-connected MOS transistor having threshold voltage Vthl, and halving the lowered voltage by a voltage dividing circuit formed of, e.g., a resistance element.

[Embodiment 9]

Figure 36:
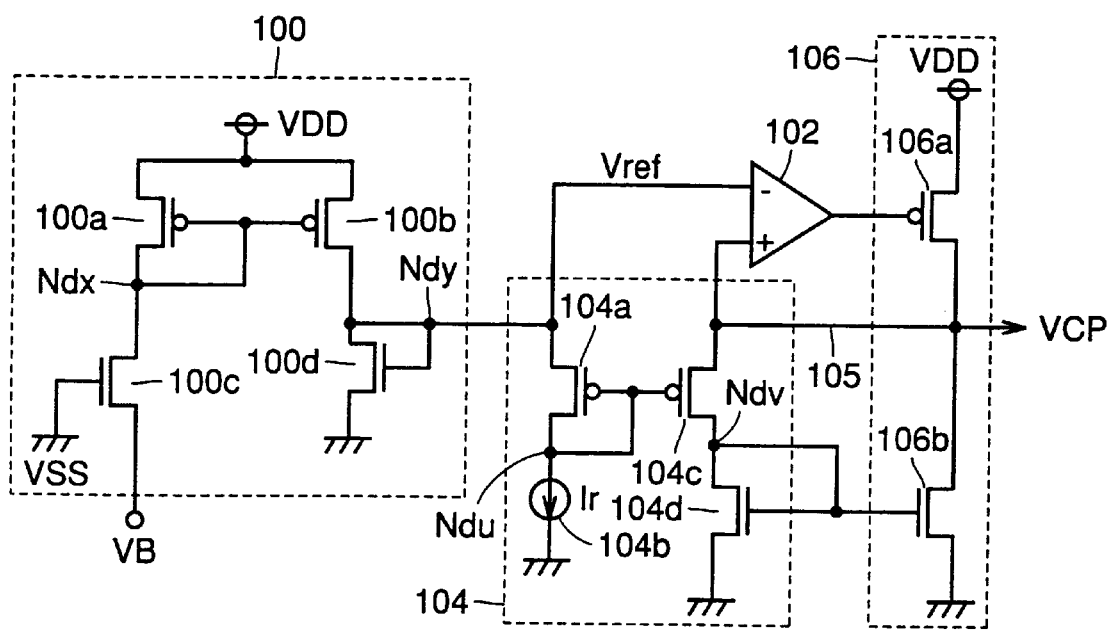
FIG. 36 shows a structure of a cell plate precharge voltage generating portion in a semiconductor memory device according to an embodiment 9 of the invention.

FIG. 36 shows a structure of a main portion of a semiconductor memory device according to an embodiment 9 of the invention. More specifically, FIG. 36 shows a structure of a VCP generating circuit which generates reference voltage VCP for precharging a cell plate electrode node CP. In FIG. 36, the cell plate precharge voltage generating circuit includes a reference voltage generating circuit 100 generating a reference voltage Vref, a comparator 102 for comparing reference voltage Vref with cell plate precharge voltage VCP, a pull-down circuit 104 for returning a raised cell plate precharge voltage VCP to the original voltage level, and a drive circuit 106 for producing cell plate precharge voltage VCP in accordance with the output signals of comparator 102 and pull-down circuit 104.

Reference voltage generating circuit 100 includes a p-channel MOS transistor 100a which is connected between a power supply node and a node Ndx and has a gate connected to node Ndx, an n-channel MOS transistor 100c which is connected between node Ndx and a node receiving negative voltage VB and has a gate connected to a node (ground node) supplying a ground voltage VSS, a p-channel MOS transistor 100b having one conduction node, connected to a power supply node and a gate connected to node Ndx, and an n-channel MOS transistor 100d which is connected between MOS transistor 100b and the ground node and has a gate connected to a node Ndy. MOS transistors 100a and 100b form a current mirror circuit, and currents of the same magnitude flow therethrough. MOS transistor 100c flows a current corresponding to the gate-source voltage thereof. Therefore, the gate-source voltage of MOS transistor 100d is equal to that of MOS transistor 100c (both the transistors have the same size), and reference voltage Vref from node Ndy is at the voltage level of the absolute value |VB| of negative voltage VB.

The pull-down circuit 104 includes a p-channel MOS transistor 104a which is connected between nodes Ndy and Ndu, and has a gate connected to node Ndu, a constant current source 104b connected between node Ndu and the ground node, a p-channel MOS transistor 104c which is connected between a cell plate precharge voltage transmission line 105 and node Ndy and has a gate connected to node Ndu, and an n-channel MOS transistor 104d which is connected between node Ndv and the ground node and has a gate connected to node Ndv. Constant current source 104b supplies an extremely small current Ir.

Drive circuit 106 includes a p-channel MOS transistor 106a which is connected between the power supply node and a precharge voltage transmission line 105 and receives on its gate the output signal of comparator 102, and an n-channel MOS transistor 106b which is connected between cell plate precharge voltage transmission line 105 and the ground node and has a gate connected to node Ndv. MOS transistors 104d and 106b form a current mirror circuit, and the currents of the same magnitude flow through the MOS transistors 104d and 106b, respectively (both the transistors have the same size). An operation will be briefly described below.

Current Ir supplied from constant current source 104b is much smaller than the discharging current of MOS transistor 100d. In reference voltage generating circuit 100, the current supplied from MOS transistor 100b flows through MOS transistor 100d and p-channel MOS transistor 104a. When the voltage level of reference voltage Vref lowers, the gate voltage of MOS transistor 100d lowers so that the conductance of MOS transistor 100d decreases, and a quantity of current flowing through MOS transistor 100d decreases. Meanwhile, current Ir supplied from constant current source 104b normally flow through MOS transistor 104a. When reference voltage Vref lowers, the current supplied from MOS transistor 100b is not fully discharged, and the voltage level of reference voltage Vref on node Ndy rises.

When reference voltage Vref rises, the gate voltage of MOS transistor 100d rises, and the conductance thereof increases so that the voltage level on node Ndy is lowered.

Therefore, reference voltage Vref is held substantially at the level of the absolute value |VB| of negative voltage VB, because current Ir driven by constant current source 104b is sufficiently smaller than the current flowing through MOS transistor 100d.

In drive circuit 106, MOS transistor 106a supplies a current from the power supply node to cell plate precharge voltage transmission line 105 in accordance with the output signal of comparator 102. When the voltage level of cell plate precharge voltage VCP lowers, the level of output signal of comparator 102 lowers, and the conductance of MOS transistor 106a increases so that the voltage level of cell plate precharge voltage VCP is raised.

When cell plate precharge voltage VCP lowers, a voltage difference between the gate and source of MOS transistor 104c decreases, and the conductance of MOS transistor 104c decreases so that the supplying current thereof decreases, and lowering of cell plate precharge voltage VCP is suppressed. A current, which is equal in magnitude to the current flowing through MOS transistor 104c, flows through MOS transistor 104d in MOS transistor 106b. Therefore, when cell plate precharge voltage VCP significantly varies and MOS transistor 104c is turned off to cut off the current flow therethrough, a current does not flow through MOS transistor 106b so that lowering of cell plate precharge voltage VCP is suppressed.

When cell plate precharge voltage VCP rises, the output signal of comparator 102 rises, and MOS transistor 106a is turned off. Meanwhile, a voltage difference between the gate and source of MOS transistor 104c increases, and a current larger than current Ir flowing through MOS transistor 104a flows through MOS transistor 104c. A current of the same magnitude as this current flows through MOS transistor 104d so that the current flowing through MOS transistor 106b increases, and cell plate precharge voltage VCP is lowered.

When cell plate precharge voltage VCP is equal in voltage level to reference voltage Vref, MOS transistors 104a and 104c have the same gate-source voltage, and operate as a current mirror circuit so that a minute current Ir flows through MOS transistors 104c and 104d. This constant current Ir flows also through MOS transistor 106b. Therefore, when cell plate precharge voltage VCP is at the voltage level of reference voltage Vref, only minute current Ir flows in drive circuit 106. Since this current Ir is sufficiently small in magnitude, cell plate precharge voltage VCP can be stably held at the constant voltage level of reference voltage Vref without increasing the current consumption. Accordingly, such a situation can be prevented that cell plate precharge voltage VCP rises and sets cell plate precharge voltage transmission line 105 to the floating state, and that the cell plate precharge voltage higher than the predetermined voltage level is transmitted. Thus, in accordance with change in cell plate voltage Vg, the voltage level on the storage node of a memory cell storing H-level data can be accurately raised.

In particular, MOS transistors 104d and 106b form the current mirror circuit, and change in cell plate precharge voltage VCP is rapidly fed back. Therefore, fast responsibility to a sudden change can be achieved, and cell plate precharge voltage VCP can be accurately held at the intended voltage level.

[Embodiment 10]

Figure 37:
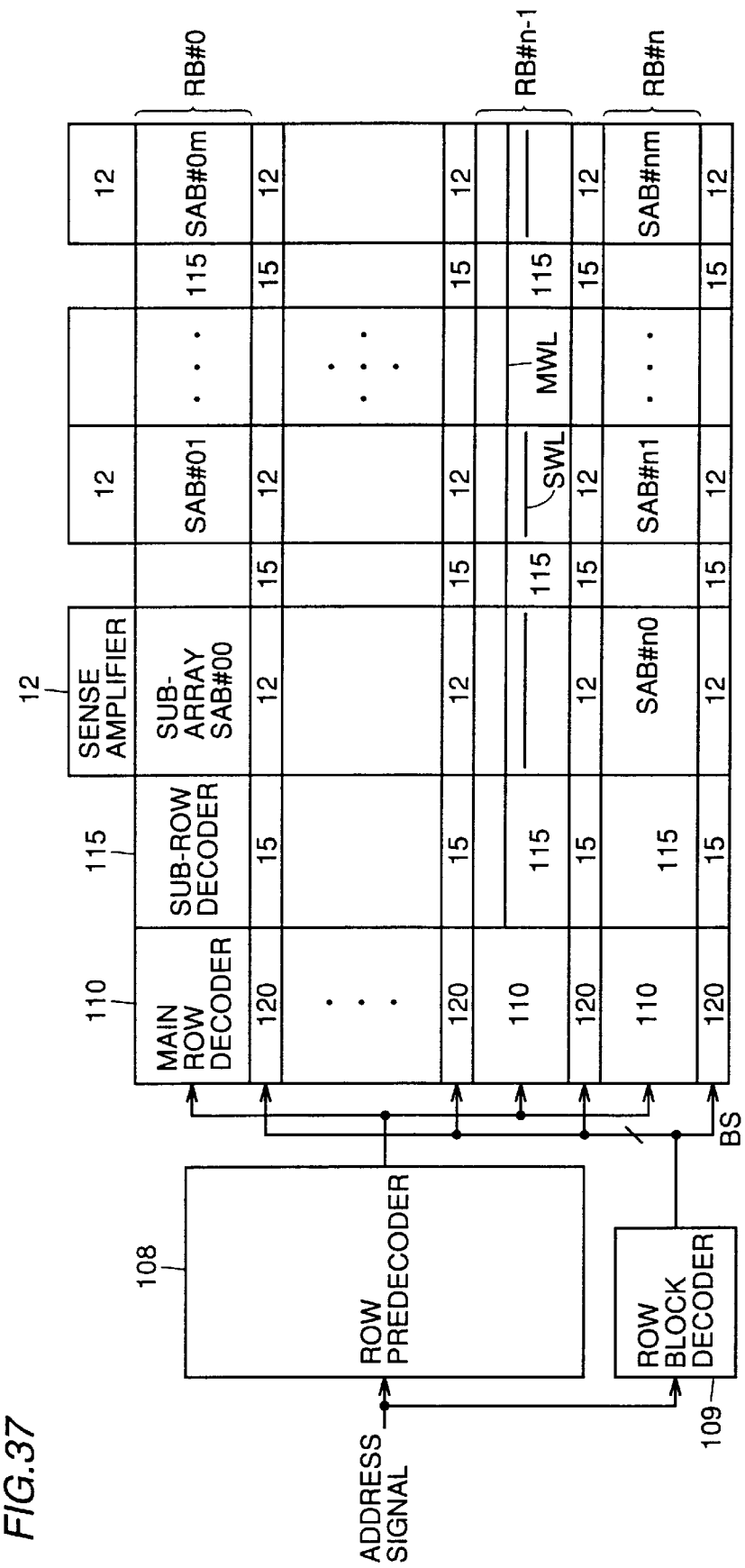
FIG. 37 Schematically shows a whole structure of a semiconductor memory device according to an embodiment 10 of the invention;, FIG. 38 schematically shows a structure of one sub-array in the semiconductor memory device-shown in FIG. 37.

FIG. 37 shows a structure of a main portion of a semiconductor memory device of an embodiment 10 of the invention. In FIG. 37, the memory cell array is divided into a plurality of sub-arrays SAB#00–SAB#nm. Sub-arrays SAB#i0–SAB#im (i=0÷n) which are alignedly arranged in the row direction (horizontal direction in FIG. 37) form a row block RB#i. In FIG. 37, there are arranged (n+1) row blocks RB#0–RB#n. Sense amplifier bands 12 are arranged corresponding to sub-arrays SAB#00–SAB#nm, respectively. Each sense amplifier band 12 has the shared sense amplifier structure, similarly to the foregoing embodiment, and is commonly used by the sub-arrays neighboring thereto in the column direction.

For each of row blocks RB#0–RB#n, there is arranged a main row decoder 110 which decodes a word line address predecode signal from a row predecoder 108. Main row decoder 110 drives a main word line MWL, which extends in the row direction through the sub-arrays included in a corresponding row block, to the selected state.

Corresponding to sub-arrays SAB#00–SAB#nm, there are arranged sub-row decoders 115, respectively, each of which in turn drives the sub-word lines included in the corresponding sub-array to the selected state in accordance with the signal on the main word line and the word line sub-decode signal. Word line sub-decode signal is produced from a block select control circuit 120 which is arranged corresponding to a row block and neighboring to a main decoder 110. Block select control circuit 120 produces the cell plate voltage control signal and the word line sub-decode signal commonly for the sub-arrays in a corresponding row block in accordance with row block select signal BS from row block decoder 109, which in turn decodes an address signal to produce a row block select signal BS designating a row block. Therefore, in each of sub-arrays SAB#i0–SAB#in included in a row block including a selected word line, a sub-word line is selected and the cell plate voltage is controlled.

Control of the cell plate voltage in each of sub-arrays SAB#00–SAB#nm is performed in accordance with the cell plate voltage control signal which is supplied to corresponding cell plate voltage drive circuit 15 from corresponding block select control circuit 120. The word line sub-decode signal and cell plate voltage control signal are supplied from block select control circuit 120 through signal lines extending in the row direction through the sense amplifier band.

These signal lines are made of, e.g., metal interconnection lines, and are arranged at a layer higher than respective sense amplifiers included in a sense amplifier band and, for example, in parallel with a power supply line (sense power supply line) in the sense amplifier band. Thereby, the cell plate voltage control signals and the word line sub-decode signals can be transmitted without adversely affecting the layout of the memory cell array. In the structure shown in FIG. 37, control of the cell plate voltages is performed for each sub-array included in a row block including a selected main word line at a time, and is performed entirely on a unit of a predetermined number of sub-word lines including the selected sub-word line, as is done also in the embodiments already described. Therefore, the data at the voltage level equal to or higher than the power supply voltage can be rapidly stored in the memory cell with a low current consumption without causing destruction of an unselected memory cell data, as can be done in the embodiments 1 to 8 already described.

Figure 38:
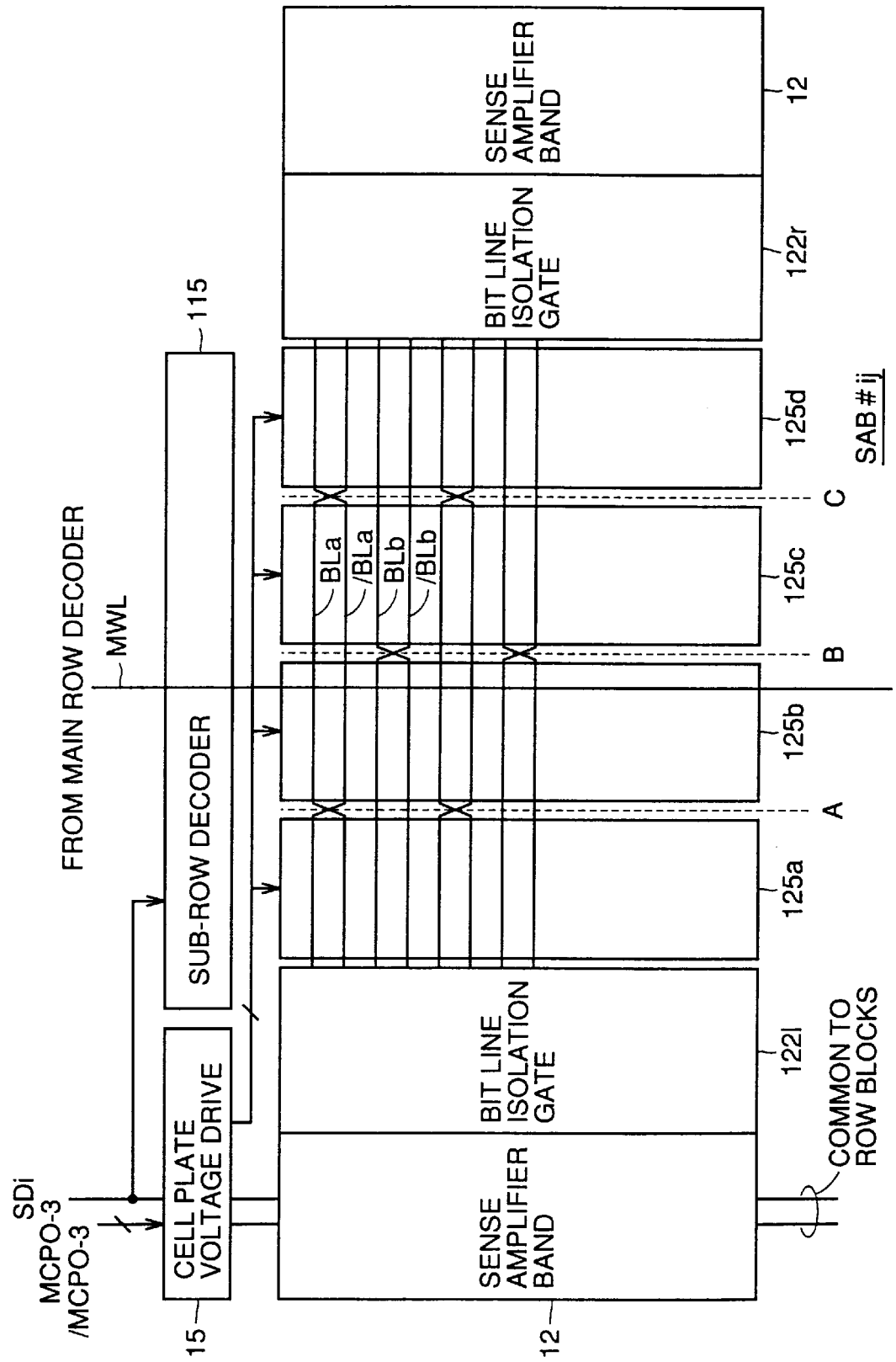

FIG. 38 shows a structure of one sub-array SAB#ij. In sub-array SAB#ij, the bit lines have crossings in quadrisecting regions A, B and C. Bit line pairs of BLa and /BLa each having two crossings in regions A and C and bit line pairs of BLb and /BLb each having a crossing in central region B are arranged alternately to each other so that the crossings of the neighboring bit line pairs may not neighbor to each other. In each of the quadrisected regions, there are arranged cell plate electrode layers 125a–125d for transmitting cell plate voltages Vg, respectively.

In opposite sides of sub-array SAB#ij, there are arranged sense amplifier bands 12 with bit line isolation gates 122l and 122r therebetween, respectively. Each sense amplifier band 12 has a shared sense amplifier structure of the alternate arrangement type, and is commonly used by the sub-arrays neighboring thereto in the column direction. However, the other of the neighboring sub-array is not shown in the figure.

Main word line MWL which extends in the row direction for transmitting the word line select signal from the main row decoder shown in FIG. 37 is provided commonly for the row block including sub-array SAB#ij. In sub-array SAB#ij, sub-word lines SWL are arranged corresponding to main word lines MWL, respectively. In the structure shown in FIG. 38, sub-word lines SWL are equal in number to main word lines MWL, and a memory cell is not present in quadrisecting regions A, B and C containing the crossings of the bit lines. In the structure wherein main word line MWL is arranged corresponding to each sub-word line SWL, therefore, cell plate electrode layers 125a–125d can be divided in these quadrisecting regions A, B and C, because a memory cell is not present in these regions.

Cell plate voltage drive circuit 15 changes the voltage on a cell plate electrode layer arranged corresponding to a row including a selected sub-word line in accordance with main cell plate voltage control signals MCP0–MCP3 and /MCP0–/MCP3 applied from a block select control circuit, which will be described later. The cell plate electrode layers provided for the rows including only the unselected sub-word lines maintain the constant voltage level of cell plate precharge voltage VCP.

Sub-row decoder (sub-word line driver) 115 drives a corresponding sub-word line to the selected state in accordance with word line sub-decode signal SDi produced from the block select control circuit shown in FIG. 37 in accordance with block select signal BS (BS0–BSn) and the signal on main word line MWL. Therefore, a sub-word line is selected in each sub-array in the row block including a selected main word line. In the structure shown in FIG. 38, cell plate electrode layers 125a–125d extend only within the corresponding sub-arrays, respectively, and cell plate voltage drive circuit 15 can rapidly change the cell plate voltages. Main word line MWL attains power supply voltage VDD level when not selected, and attains the voltage level of ground voltage 0 V when selected.

Figure 39:
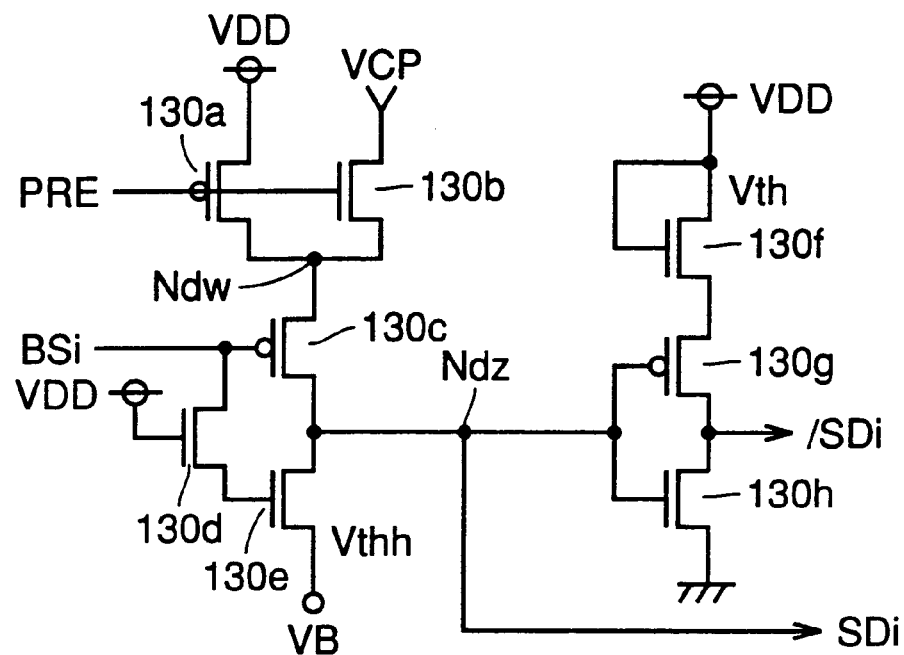
FIG. 39 shows a structure of a word line sub-decode signal generating portion included in a row select/control circuit shown in FIG. 37.

FIG. 39 shows a structure of a word line sub-decode signal generating portion included in block select control circuit 120 shown in FIG. 37. In FIG. 39, the word line sub-decode signal generating portion includes a p-channel MOS transistor 130a which is turned on to transmit power supply voltage VDD onto a node Ndw when precharge instructing signal PRE is at L-level, an n-channel MOS transistor 130b which is turned on to transmit cell plate precharge voltage VCP onto node Ndw when precharge instructing signal PRE is at H-level, a p-channel MOS transistor 130c which is turned on to transmit the voltage on node Ndw onto a node Ndz when block select signal BSi is at L-level, and an n-channel MOS transistor 130e which is connected between node Ndz and a node supplying negative voltage VB and has a gate receiving block select signal BSi through MOS transistor 130d. MOS transistor 130d receives power supply voltage VDD on its gate. MOS transistor 130d lowers block select signal BSi at H-level by the threshold voltage thereof and applies the signal thus lowered to the gate of MOS transistor 130e. MOS transistor 130e has large threshold voltage Vthh.

Figure 40:
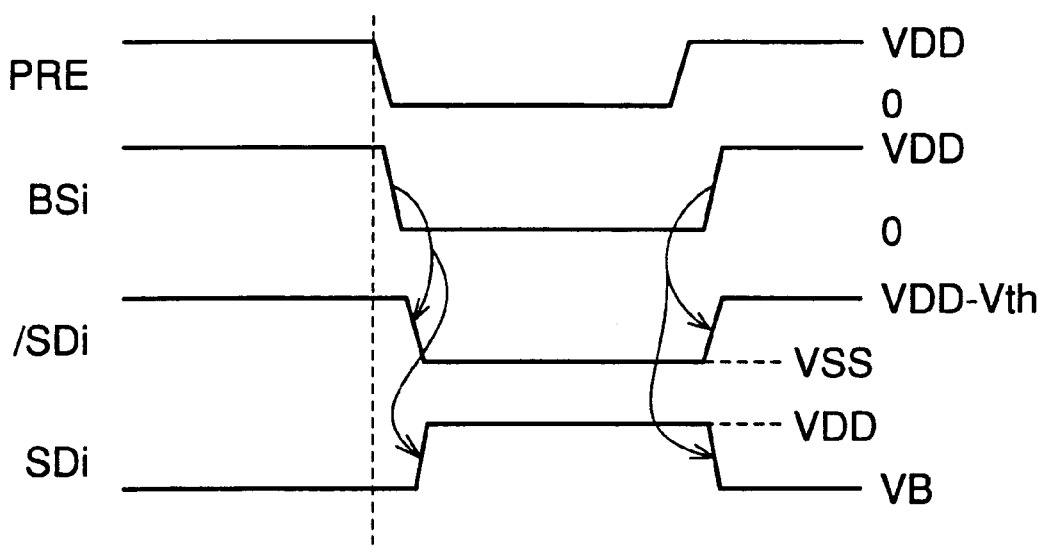
FIG. 40 is a signal waveform diagram representing an operation of the word line sub-decode signal generating circuit shown in FIG. 39.

Word line sub-decode signal generating portion further includes a diode-connected n-channel MOS transistor 130f which lowers power supply voltage VDD by a magnitude corresponding to a threshold voltage Vth thereof, and p- and n-channel MOS transistors 130g and 130h which are connected in series between MOS transistor 130f and the ground node, have gates connected to node Ndz and produce a complementary word line sub-decode signal /SDi. An operation of the word line sub-decode signal generating portion shown in FIG. 39 will be described below with reference to an operation waveform diagram of FIG. 40.

In the precharged state (standby cycle), precharge instructing signal PRE is at H-level of power supply voltage VDD, MOS transistor 130a is off and MOS transistor 130b is on so that node Ndw is held at the level of cell plate precharge voltage VCP. When unselected, block select signal BSi is at H-level of the power supply voltage level, and MOS transistor 130c maintains the off state. Meanwhile, MOS transistor 130e is turned on, and a signal Sdi from node Ndz is held at negative voltage VB level. In this state, MOS transistor 130e receives on its gate a voltage lower than power supply voltage VDD from MOS transistor 130d, and therefore application of a high voltage across the gate and source of MOS transistor 130b is prevented. The voltage on node Ndw is at the level of cell plate precharge voltage VCP, and a high voltage is not applied across the source and drain of MOS transistor 130c even if node Ndz is at the negative voltage level. The voltage across the gate and source of MOS transistor 130c attains a level lower than power supply voltage. A voltage higher than the power supply voltage is applied across the drain and gate of MOS transistor 130c. However, this does not particularly cause a problem because measures against a high drain electric field are usually taken in the MOS transistor.

This negative voltage on node Ndz turns on MOS transistor 130g, and complementary word line sub-decode signal /SDi attains the voltage level of (VDD−Vth) which is lower by threshold voltage Vth of MOS transistor 130f than power supply voltage VDD. Even in this state, the voltage at power supply voltage VDD level is merely applied across the gate and source of MOS transistor 130g, and destruction of the gate insulating film due to a high voltage can be prevented. In MOS transistor 130h, a voltage at power supply voltage VDD level is applied across the gate and drain, and a high voltage is not applied so that breakdown of the insulating film can be prevented.

When an active cycle starts, precharge instructing signal PRE attains L-level, and MOS transistor 130a is turned on. Meanwhile, MOS transistor 130b is turned off so that the voltage level on node Ndw attains power supply voltage VDD level. When the corresponding row block is in the unselected state, block select signal BSi holds power supply voltage VDD level so that the voltage levels of sub-decode signals SDi and /SDi do not change, similarly to the standby cycle. When the corresponding row block is selected, block select signal BSi lowers from power supply voltage VDD level to the ground voltage level, and node Ndz receives power supply voltage VDD through MOS transistor 130c so that word line sub-decode signal SDi is driven to power supply voltage VDD level.

MOS transistor 130e receives on its gate the signal at the ground voltage level. However, threshold voltage Vthh of MOS transistor 130e is equal to or higher than the absolute value |VB| of negative voltage VB, and MOS transistor 130e maintains the off state (or weak off state). When signal SDi from node Ndz rises to power supply voltage VDD level, MOS transistor 130g attains the off state, and complementary word line sub-decode signal /SDi is driven to the ground voltage level.

When the memory (active) cycle is completed, precharge instructing signal PRE is driven to H-level again, and block select signal BSi returns to the power supply voltage level so that word line sub-decode signals SDi and /SDi are driven to the levels of negative voltage VB and (VDD–Vth), respectively. Precharge instructing signal PRE and block select signal BSi change substantially at the same timing, but the timing relationship between them is not particularly restricted. When precharge instructing signal PRE rises to H-level prior to block select signal BSi, node Ndw is charged to precharge voltage VCP level. In this case, such discharging is merely performed in two stages that the voltage level of SDi on node Ndz lowers to cell plate electrode precharge voltage VCP level, and thereafter lowers to voltage VB level. If the sub-word line is already driven to the unselected state, no malfunction occurs.

By using MOS transistor 130e having a high threshold voltage as well as MOS transistor 130d for voltage dropping, it is possible to prevent application of a high voltage to MOS transistor 130c. By transmitting cell plate precharge voltage VCP to precharged node Ndw, application of a high voltage across the gate and source of p-channel MOS transistor 130c can be prevented. By lowering the power supply voltage for application to the source of p-channel MOS transistor producing the signal /SDi, application of a high voltage can be prevented even if the gate voltage is at the negative voltage level, and therefore dielectric breakdown due to a high voltage can be prevented. When unselected, block select signal BSi may be at a level lower than power supply voltage VDD and, for example, may be at cell plate voltage VCP level.

Figure 41:
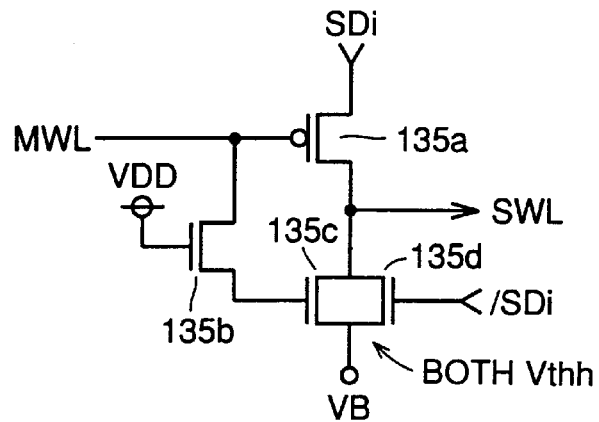
FIG. 41 shows a structure of a sub-word line drive circuit included in a sub-row decoder shown in FIG. 38.

FIG. 41 shows a structure of the sub-row decode circuit provided for each sub-word line. In FIG. 41, the sub-row decode circuit includes a p-channel MOS transistor 135a which receives on its gate a signal on main word line MWL and transmits word line sub-decode signal SDi onto sub-word line SWL, an n-channel MOS transistor 135c which receives the signal on main word line MWL through a MOS transistor 135b and transmits negative voltage VB onto sub-word line SWL, and an n-channel MOS transistor 135d which receives word line sub-decode signal /SDi on its gate and transmits negative voltage VB onto sub-word line SWL.

Figure 42:
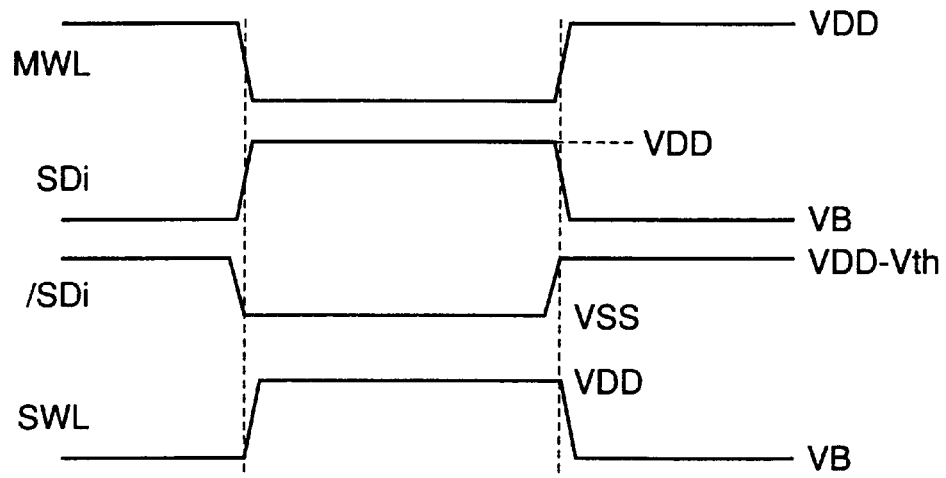
FIG. 42 is a signal waveform diagram representing an operation of to circuit shown in FIG. 41.

MOS transistor 135b has a gate connected to a node supplying power supply voltage VDD. Both MOS transistors 135c and 135d each have large threshold voltage Vthh. An operation of the sub-row decode circuit shown in FIG. 41 will be described below with reference to a signal waveform diagram of FIG. 42.

During a standby cycle, main word line MWL is in the unselected state of H-level (power supply voltage VDD level). In this state, MOS transistor 135a is off. MOS transistor 135c receives on its gate the signal at power supply voltage VDD level through MOS transistor 135b, and transmits negative voltage VB onto sub-word line SWL. Signal /SDi is at H-level of (VDD–Vth), and MOS transistor 135d is likewise turned on to transmit negative voltage VB onto sub-word line SWL. The gate voltages of these MOS transistors 135c and 135d are lower than the power supply voltage, and they are not subjected to application of a large voltage even when negative voltage VB is transmitted onto sub-word line SWL. Therefore, intended breakdown voltage characteristics of the gate insulating films can be ensured in MOS transistors 135c and 135d.

A relatively large voltage is applied across the gate and source of p-channel MOS transistor 135a. However, a p-channel MOS transistor is usually connected to the power supply node in many cases, and is designed to have sufficient breakdown voltage characteristics so that no problem arises in the gate insulating film. Such a structure may be employed that a signal on the main word line is transmitted onto the gate of p-channel MOS transistor 135a through MOS transistor 135b. In this case, the voltage across the gate and source of MOS transistor 135a can be held at the power supply voltage level.

When an active cycle starts and main word line MWL is selected, the gate of p-channel MOS transistor 135a attains the ground voltage level. Likewise, the gate of n-channel MOS transistor 135c attains the ground voltage level. MOS transistor 135c has a large threshold voltage Vthh, and is turned off.

When sub-word line SWL is selected, signal SDi attains power supply voltage VDD level, and p-channel MOS transistor 135a is turned on so that sub-word line SWL is driven to power supply voltage VDD level. At this time, signal /SDi is at ground voltage VSS level, and n-channel MOS transistor 135d maintains the off state due to its high threshold voltage so that sub-word line SWL is reliably driven to power supply voltage VDD level.

Even when main word line MWL is selected, signal SDi is at negative voltage VB level and MOS transistor 135a maintains the off state if sub-word line SWL is in the unselected state. In this state, signal /SDi is at H-level of (VDD–Vth), and MOS transistor 135d is turned on to drive the unselected sub-word line SWL to negative voltage VB level. By using MOS transistor 135d, it is possible to prevent an unselected sub-word line provided corresponding to a selected main word line from attaining the floating state.

As described above, the gate voltage of the MOS transistor receiving on its source the negative voltage is set to the level lower than the power supply voltage level, whereby application of a voltage higher than the power supply voltage can be prevented, and intended dielectric breakdown characteristics of the gate insulating film can be ensured. Therefore, the word line drive circuit which can operate stably can be achieved.

Figure 43:
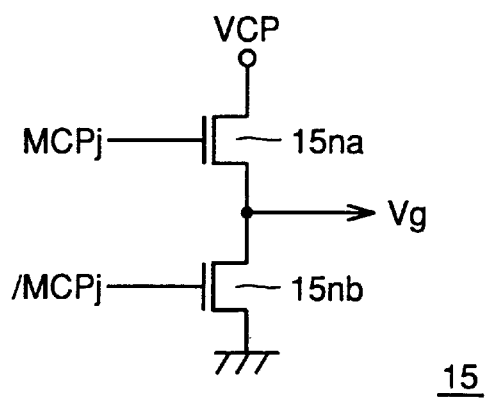
FIG. 43 shows a structure of a cell plate voltage drive circuit shown in FIG. 38.

FIG. 43 shows a structure of cell plate voltage drive circuit 15. In FIG. 43, cell plate voltage drive circuit 15 includes an n-channel MOS transistor 15na which is turned on to transmit cell plate precharge voltage VCP and produce cell plate voltage Vg when cell plate voltage control signal MCPi is at H-level, and an n-channel MOS transistor 15nb which is turned on to transmit ground voltage VSS as cell plate voltage Vg when complementary cell plate voltage control signal /MCPj is at H-level. Cell plate voltage control signals MCPj and /MCPj are complementary with each other. An operation of cell plate voltage drive circuit 15 shown in FIG. 43 will be described below with reference to a waveform diagram of FIG. 44.

Control signal SCP lowers to L-level in a one-shot pulse form after completion of an active cycle as shown in FIG. 11, and is usually at H-level of power supply voltage VDD level. In this state, cell plate voltage control signal MCPj is at H-level, and complementary cell plate voltage control signal /MCPi is at L-level. Voltage VCP is transmitted as cell plate voltage Vg through n-channel MOS transistor 15na.

When the active cycle is completed, control signal SCP lowers to L-level, and signal MCPj lowers to L-level. Meanwhile, complementary cell plate voltage control signal /MCPj rises to H-level, and cell plate voltage Vg is lowered to ground voltage VSS level by n-channel MOS transistor 15nb. When a predetermined period elapses, signal SCP rises to H-level, and control signals MCPj and /MCPj change into H-level and L-level, respectively, so that cell plate voltage Vg returns to precharge voltage VCP.

Cell plate voltage drive circuit 15 is provided for each cell plate electrode layer, and signals MCPj and /MCPj n* change any one of the cell plate voltages of four cell plate electrode layers 125a–125d in one cell array shown in FIG. 39.

Figure 45:
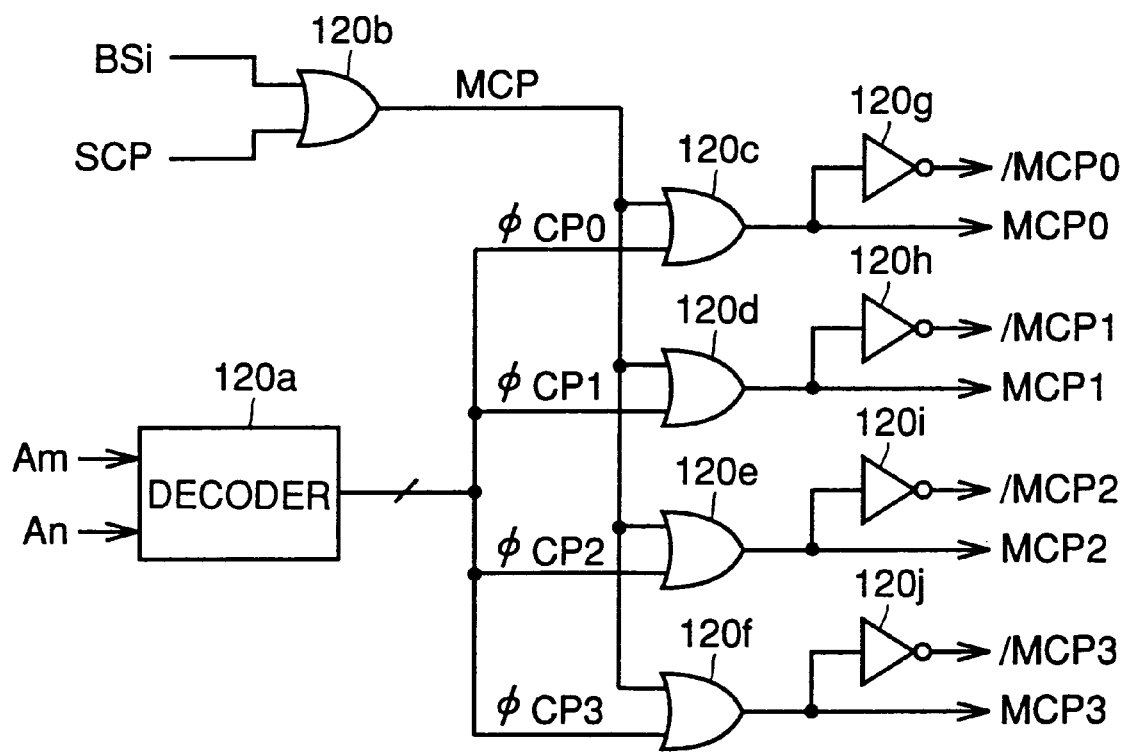
FIG. 45 schematically shows a structure of a cell plate voltage control signal generating portion shown in FIG. 43.

FIG. 45 schematically shows a structure of the cell plate voltage control signal generating portion included in block select control circuit 120 shown in FIG. 37. In FIG. 45, the cell plate voltage control signal generating portion includes a decoder 120a which decodes higher 2 bits Am and An of an address signal for designating a word line, an OR circuit 120b receiving row block select signal BSi and cell plate voltage control signal SCP, an OR circuit 120c receiving a cell plate electrode layer designating signal φCP0 from decoder 120a and main cell plate voltage control signal MCP from OR circuit 120b, an OR circuit 120d receiving main cell plate voltage control signal MCP and cell plate electrode layer designating signal φCPI, an OR circuit 120e receiving main cell plate voltage control signal MCP and a cell plate electrode designating signal φCP2, an OR circuit 120f receiving main cell plate voltage control signal MCP and a cell plate electrode layer designating signal φCP3, and inverters 120g–120j inverting the output signals of OR circuits 120c–120f, respectively. OR circuit 120c and inverter 120g generate control signals MCP0 and /MCP0.

Figure 46:
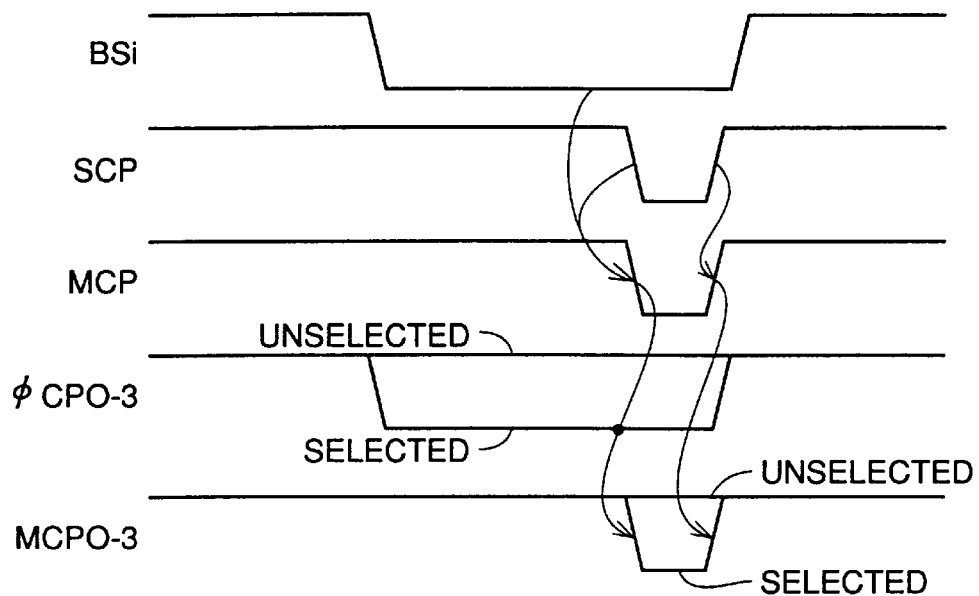
FIG. 46 is a signal waveform diagram representing an operation of the circuit shown in FIG. 45.

OR circuit 120d and inverter 120h generate control signals MCP1 and /MCP1. OR circuit 120e and inverter 120i generate control signals MCP2 and /MCP2. OR circuit 120f and inverter 120j generate control signals MCP3 and /MCP3. An operation of the cell plate voltage control signal generating portion shown in FIG. 45 will be described below with reference to a waveform diagram shown in FIG. 46.

Figure 44:
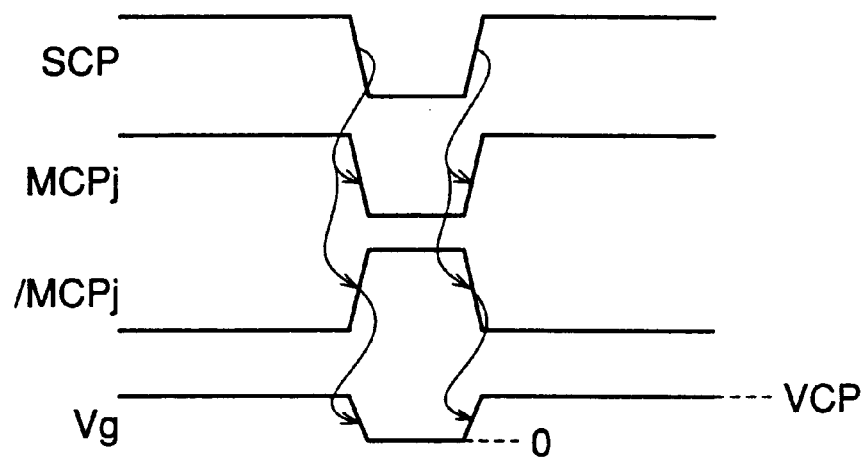
FIG. 44 is a signal waveform diagram representing an operation of the circuit shown in FIG. 43.

During standby, block select signal BSi is at H-level of the power supply voltage level, and cell plate voltage control signal SCP is also at H-level. Therefore, cell plate voltage control signals MCP0–MCP3 are at H-level, and cell plate voltage Vg is held at the predetermined precharge voltage VCP level, as shown in FIG. 44.

When an active cycle starts, block select signal BSi sent from the block decoder for specifying a row block to be selected attains an active state of L-level. At this time, signal SCP is at H-level, and output signal MCP of OR circuit 120b holds H-level. Decoder 120a decodes higher two bits Am and An of the word line designating address signal, and generate the signal specifying a group including a selected word line. Thereby, one of the cell plate electrode layer designating signals φCP0–φCP3 is driven to the selected state of L-level, and the other designating signals hold the unselected state of H-level. In this state, control signals MCP0–MCP3 are held at H-level by OR circuits 120c–120f, respectively.

When the active cycle terminates, control signal SCP is driven to L-level so that main cell plate voltage control signal MCP from OR circuit 120b falls to L-level. Since the signal specifying the cell plate electrode layer which is provided for the set of rows including the selected word line, is at L-level, cell plate voltage control signal MCPj is at L-level in accordance with cell plate electrode layer designating signal φCPj in the selected state and main cell plate voltage control signal MCP at L-level. Meanwhile, complementary cell plate voltage control signal /MCPj rises to H-level, and cell plate voltage Vg lowers to the ground voltage level. For the unselected cell plate electrode layer, the cell plate voltage control signal maintains H-level and more specifically precharge voltage VCP level, because the corresponding cell plate electrode layer designating signal φCP is at H-level.

When a predetermined period elapses, control signal SCP rises to H-level, and thereby main cell plate voltage control signal MCP rises to H-level so that the cell plate voltage control signal MCPj in the selected state returns to H-level. Thereby, cell plate voltage Vg returns to predetermined precharge voltage VCP level.

The structure shown in FIG. 45 has been discussed merely by way of example, and the OR circuits may be replaced with NOR circuits. It is merely required that the voltage on the cell plate electrode layer provided for a selected main word line changes in accordance with control signal SCP.

[Modification]

Figure 47:
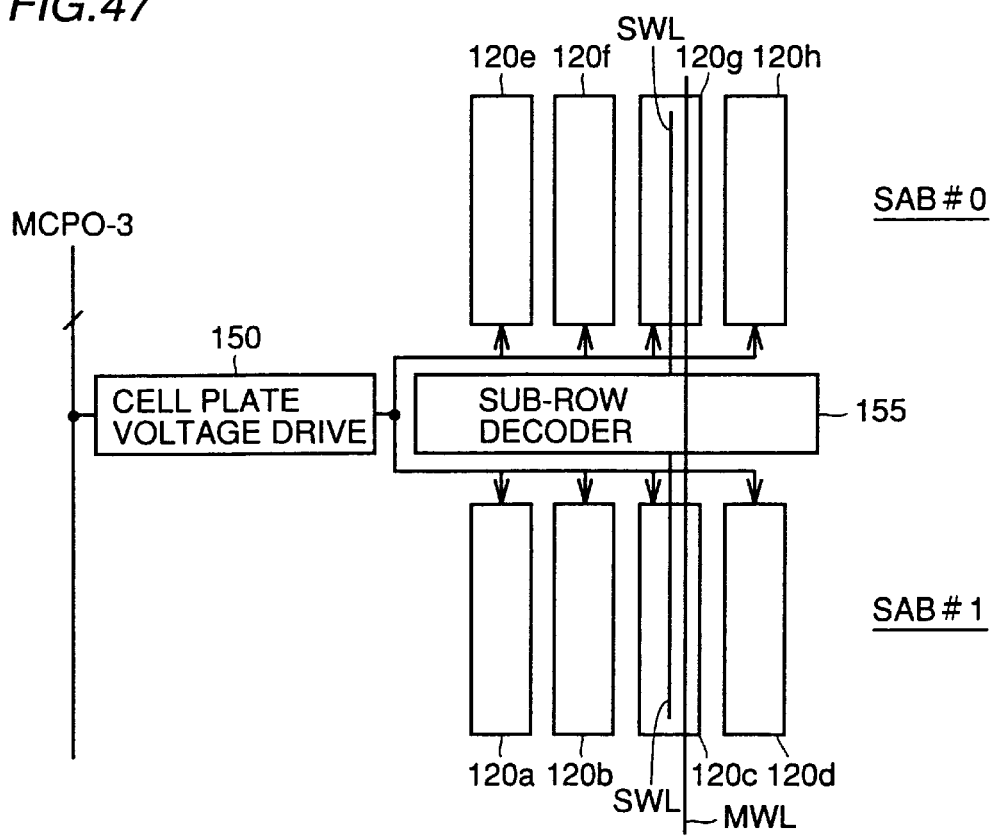
FIG. 47 schematically shows a structure of a modifications of the embodiment 10 of the invention.

FIG. 47 shows a structure of a modification of the embodiment 10 of the invention. More specifically, FIG. 47 shows a structure related to two sub-arrays SAB#0 and SAB#1 included in the same row block. In FIG. 47, a sub-row decoder 155 is provided commonly to sub-arrays SAB#0 and SAB#1, and sub-word line SWL is driven to the selected state in each of sub-arrays SAB#0 and SAB#1 in accordance with the signal on the same main word line MWL and the word line sub-decode signals (not shown). Similarly to the manner of commonly using sub-row decoder 155, cell plate voltage drive circuit 150 is provided commonly for sub-arrays SAB#0 and SAB#1. Cell plate voltage drive circuit 150 selectively changes the cell plate voltages on the cell plate electrode layers 120e–120h included in sub-array SAB#0 as well as the cell plate voltages on the cell plate electrode layers 120a–120d included in sub-array SAB#1 in accordance with cell plate voltage control signal MCP0–MCP3. In the structure shown in FIG. 47, sub-row decoder 155 and cell plate voltage drive circuit 150 can be commonly used by two sub-arrays SAB#0 and SAB#1, and therefore an area occupied by the circuitry can be reduced. In the structure shown in FIG. 47, sub-word lines are driven to the selected state in all the sub-arrays of the row block including the selected main word line. Main word line MWL is made of, e.g., a metal interconnection layer of aluminum, and can rapidly transmits the word line select signal to all the sub-arrays included in this row block.

[Modification 2]

Figure 48:
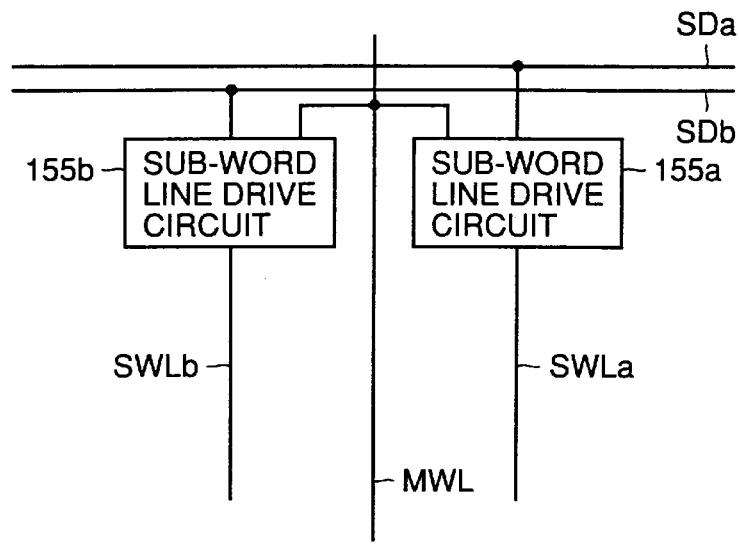
FIG. 48 schematically shows a structure of a modification 2 of the embodiment 10 of the invention.

FIG. 48 shows a structure of a modification 2 of the embodiment 2 of the invention. In FIG. 48, one main word line MWL is provided for two sub-word lines SWLa and SWLb. Sub-word line SWLa is driven to the selected state by a sub-word line drive circuit 155a which receives the signal on main word line MWL and word line sub-decode signal SDa. Sub-word line SWLb is driven to the selected state by a sub-word line drive circuit 155b which receives the signal on main word line MWL and word line sub-decode signal SDb. The structures of sub-word line drive circuits 155a and 155b are the same as those shown in FIG. 41.

In the structure shown in FIG. 48, only one main word line is arranged for two sub-word lines, and therefore the pitch condition of the main word lines can be relaxed. In the structure shown in FIG. 48, therefore, cell plate voltage control signal lines MCP0–MCP3 arranged on the sense amplifier band can extend on the sub-arrays throughout the row block, and can be arranged in the same layer as main word line MWL, which increases the degree of freedom in interconnection layout. This is true also with respect to the word line sub-decode signal SD.

In FIG. 48, word line sub-decode signals SDa and SDb are shown being transmitted in the direction perpendicular to the row direction. However, similarly to the foregoing structure in FIG. 38, the transmission lines for word line sub-decode signals SDa and SDb extend in the row direction and are arranged commonly to the sub-arrays included in one row block.

Figure 49:
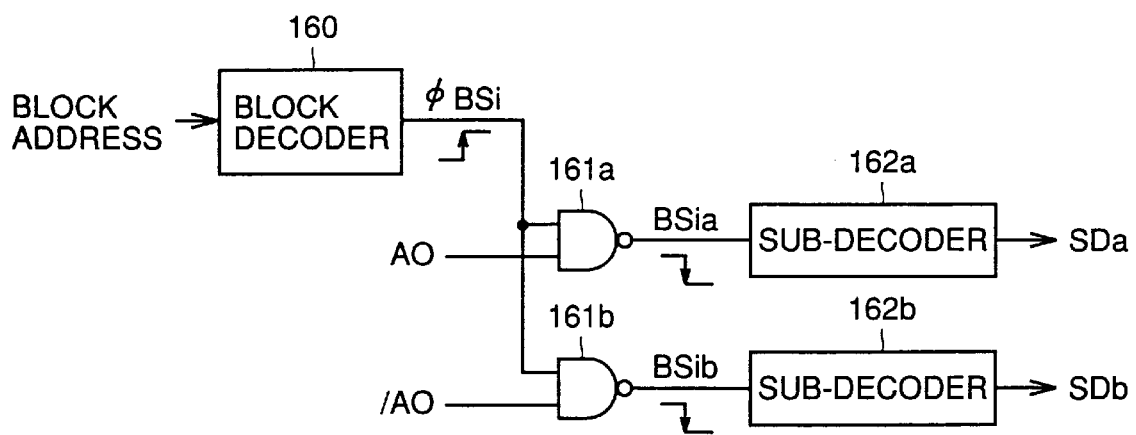
FIG. 49 schematically shows a structure of a word line sub-decode s g generating portion shown in FIG. 48.

FIG. 49 shows a structure of the word line sub-decode signal generating portion shown in FIG. 48. In FIG. 49, the word line sub-decode signal generating portion includes a block decoder 160 which decodes a block address signal and generates row block designating signal φBSi, an NAND circuit 161a which receives a lowest order bit A0 of a word line specifying address signal and row block designating signal XBSi, and generates block select signal BSia, an NAND circuit 161b which receives row block designating signal φBSi and a complementary address signal bit /A0, and generates block select signal BSib, a sub-decoder 162a which generates word line sub-decode signal SDa in accordance with block select signal BSia, and a sub-decoder 162b which generates word line sub-decode signal SDb in accordance with block select signal BSib. Sub-decoders 162a and 162b have the same structures as that shown in FIG. 39, and determine the selection/unselection of corresponding word line sub-decode signals SDa and SDb in accordance with applied block select signals BSia and BSib, respectively.

In the structure shown in FIG. 49, block decoder 160 decodes the block address signal, and raises block designating signal φBSi designating a row block including a selected main word line to H-level. Address signal bits A0 and /A0 are the lowest order bits of address signal bits for specifying a word line, and designate whether an even-numbered sub-word line to be selected or a odd-numbered sub-word line is to be selected. Block select signals BSia and BSib are driven to L-level by NAND circuits 162a and 162b, respectively, when selected, and are held at H-level when unselected. Therefore, sub-decoders 162a and 162b having the same structures as that shown in FIG. 39 can produce word line sub-decode signals SDa and SDb, and one of sub-word lines SWLa and SWLb shown in FIG. 48 can be driven to the selected state in accordance with the signal potential on main word line MWL.

One main word line may be provided for four or more sub-word lines.

[Embodiment 11]

Figure 50:
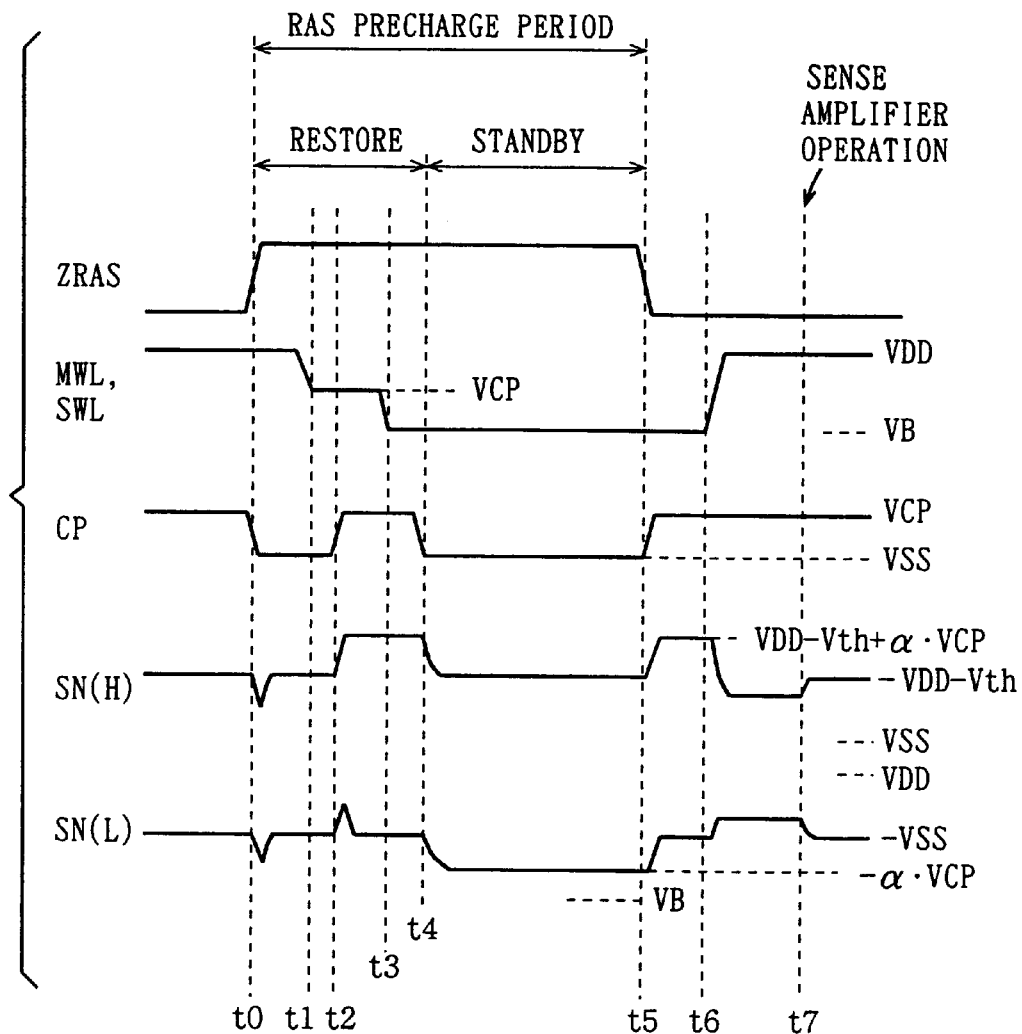
FIG. 50 is a signal waveform diagram representing an operation of a semiconductor memory device according to an embodiment 11 of the invention.

FIG. 50 is a signal waveform diagram representing an operation of a semiconductor memory device according to an embodiment 11 of the invention. The whole circuit structure is the same as that shown in FIG. 27. An operation represented in FIG. 50 will be described below.

When one memory cycle is completed at time t0, internal row address strobe signal ZRAS is driven from the active state of L-level to the inactive state of H-level. Row address strobe signal ZRAS may be internally produced in accordance with externally applied row address strobe signal /RAS, or may be a signal which is activated in accordance with an externally applied active command and is deactivated in accordance with an externally applied precharge command.

In response to deactivation of row address strobe signal ZRAS, voltage Vg which is applied to cell plate electrode node CP is driven from predetermined cell plate electrode node precharge voltage (reference voltage) VCP to ground voltage VSS level. The sense amplifier is still active, and a word line (main word line MWL and sub-word line SWL) is still in the selected state. In accordance with lowering of the voltage on cell plate electrode node CP, storage nodes SN (SN(H) and SN(L)) of the memory cells temporarily lower, but will be clamped at the original levels, i.e., H-level of (VDD−Vth) and L-level of ground voltage VSS by the active sense amplifiers, respectively. The voltage level on the selected main word line depends on the structure of the main word line.

At time t1, the voltage level on the word line (sub-word line SWL) in the selected state lowers from power supply voltage VDD to predetermined reference voltage VCP level. In this state, cell plate voltage Vg applied to the cell plate electrode node is driven from the ground voltage level to reference voltage VCP level. The voltage on sub-word line SWL is at reference voltage VCP level, and the voltage level on storage node SN(H) storing H-level data rises from the level of (VDD−Vth) to the level of (VDD−Vth+α·VCP) owing to the capacitive coupling of the memory cell capacitor, where α represents a coefficient of capacitive coupling and is equal to a value obtained by dividing the capacitance value of the memory cell capacitor by a parasitic capacitance present in storage node SN. The voltage level on storage node SN(H) storing H-level data is higher than the voltage level on corresponding sub-word line SWL, and therefore the access transistor is off so that the charges supplied into storage node SN(H) are held without flowing onto the bit line.

In the memory cell storing L-level data, the voltage level on storage node SN(L) rises in accordance with this rising of the voltage on the cell plate electrode node, but the access transistor is on so that the sense amplifier driving the corresponding bit line at L-level clamps the voltage level on storage node SN(L) at original ground voltage VSS level.

At time t3, the voltage level on selected sub-word line SWL is driven to negative voltage VB. Thereby, the access transistor connected to storage node SN(L) holding L-level data is completely turned off.

After driving the sub-word line to the unselected state, the sense amplifier is deactivated at an appropriate timing, and the bit lines are equalized and precharged.

After selected sub-word line SWL is driven to the unselected state, cell plate voltage Vg on cell plate electrode node CP is driven from reference voltage VCP to ground voltage VSS level at time t4. Thereby, the voltage level on storage node SN(H) storing H-level data lowers from the level of (VDD−Vth +α·VCP) to the level of (VDD−Vth).

Meanwhile, the voltage level on storage node SN(L) storing L-level data lowers from ground voltage VSS level to the level of negative voltage of (−α·VCP). If the sum of the negative voltage VB and the amount (α·VCP) of voltage change caused by the memory cell capacitor is lower than threshold voltage Vthl of an access transistor, the access transistor is off, and charges do not move between the bit line and storage node SN(L) storing L-level data so that the charges on storage node SN(L) are held. This state is kept during standby.

At time t5, row address strobe signal ZRAS is driven to the active state of L-level again. Thereby, the voltage on cell plate electrode node CP provided corresponding to selected main and sub-word lines rises from ground voltage VSS to the level of reference voltage VCP. In accordance with this rising of the voltage level on cell plate electrode node CP, the voltage level on storage node SN(H) of the memory cell storing H-level data rises from the voltage level of (VDD−Vth) to the voltage level of (VDD Vth+α·VCP) again so that a sufficient amount of charges are stored in storage node SN(H).

Storage node SN(L) of the memory cell storing L-level data returns from negative voltage of (−α·VCP) to the original level of ground voltage VSS owing to the capacitive coupling of the capacitor.

After returning storage nodes SN(H) and SN(L) to the original states, a sub-word line SWL is driven to the selected state in accordance with an address signal at time t6, and has the voltage level thereof raised from the level of negative voltage VB to the level of power supply voltage VDD. The data of a memory cell connected the selected sub-word line SWL is transmitted onto the corresponding bit line, and the voltage level on storage node SN(H) of the memory cell storing H-level data lowers from the level of (VDD−Vth+α·VCP) to the voltage level slightly higher than the precharge voltage of the bit line. Meanwhile, the voltage on storage node SN(L) of the memory cell storing L-level data rises to the voltage level slightly lower than the bit line precharge voltage.

Thereafter, the sense amplifier is activated at time t7, and storage nodes SN(H) and SN(L) are driven to the level of voltage (VDD−Vth) and the level of ground voltage VSS, respectively. Thereafter, data is written into or read from a selected memory cell.

From time t0 to time t4, signal charges accumulated in a memory cell are restored, and voltage Vg on cell plate electrode node CP is held at ground voltage VSS level after completion of the restoring. During standby, cell plate electrode node CP is held at ground voltage VSS level. In this case, the RAS precharge period contains at least a period from time t0 to time t4. Change in voltage on cell plate electrode node CP occurs only in the group of a predetermined number of sub-word lines including a memory cell connected to a selected word line (sub-word line), and the cell plate electrode node CP of a memory cell provided corresponding to an unselected word line is held at the ground voltage VSS level, i.e., the same level as that during standby.

Figure 51A:
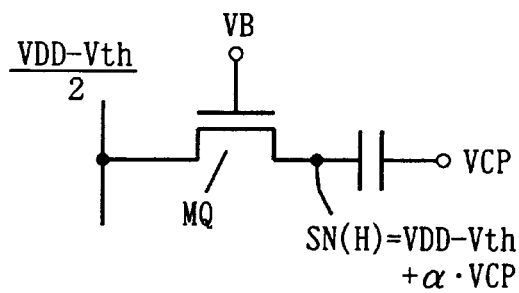
FIGS. 51A and 51B show voltages to a storage node of a memory cell in the embodiment 11 of the invention.
Figure 51B:
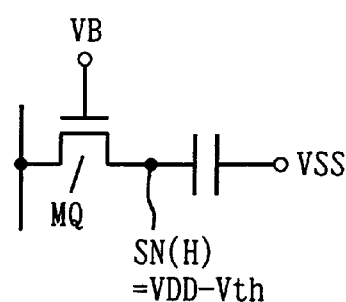

FIGS. 51A and 51B show voltages applied in memory transistor MQ during restoring and standby, respectively. FIG. 51A shows the state at time t3 in FIG. 50. In this state, negative voltage VB is applied to the gate of memory transistor MQ, and the voltage level on storage node SN(H) storing H-level data goes to (VDD−Vth+α·VCP). The bit line is set to the voltage level of H-level data or precharge/ equalize voltage by the sense amplifier. FIG. 51A shows the bit line at the precharge/equalize voltage of (VDD−Vth)/2.

In this state, a voltage higher than the power supply voltage is applied between storage node SN(H) and the gate of memory transistor MQ, and a large electric field is applied to a region of memory transistor MQ where the drain region and the gate thereof overlap with each other in a plan view.

As shown in FIG. 51B, the cell plate voltage lowers to ground voltage VSS level at time t4 during standby, and the voltage on storage node SN(H) attains the level of voltage (VDD−Vth) so that the voltage difference between the gate and the drain of memory transistor MQ decreases, and the electric field applied to the region near the drain can be reduced.

The state shown in FIG. 51A is attained in a memory cell connected to a selected word line (sub-word line and main word line), and the memory cell in the state shown in FIG. 51B is an unselected memory cell or a memory cell on standby. Only in the selected memory cell, therefore, a large voltage is applied across the gate and drain of the memory transistor MQ for a short period from time t3 to time t4. Therefore, compared with the case where voltage Vg on the cell plate electrode node is continuously held at reference voltage VCP level during standby, it is possible to reduce the electric field applied to the gate insulating film of memory transistor MQ, and therefore the gate insulating film can maintain an intended reliability.

Figure 52:
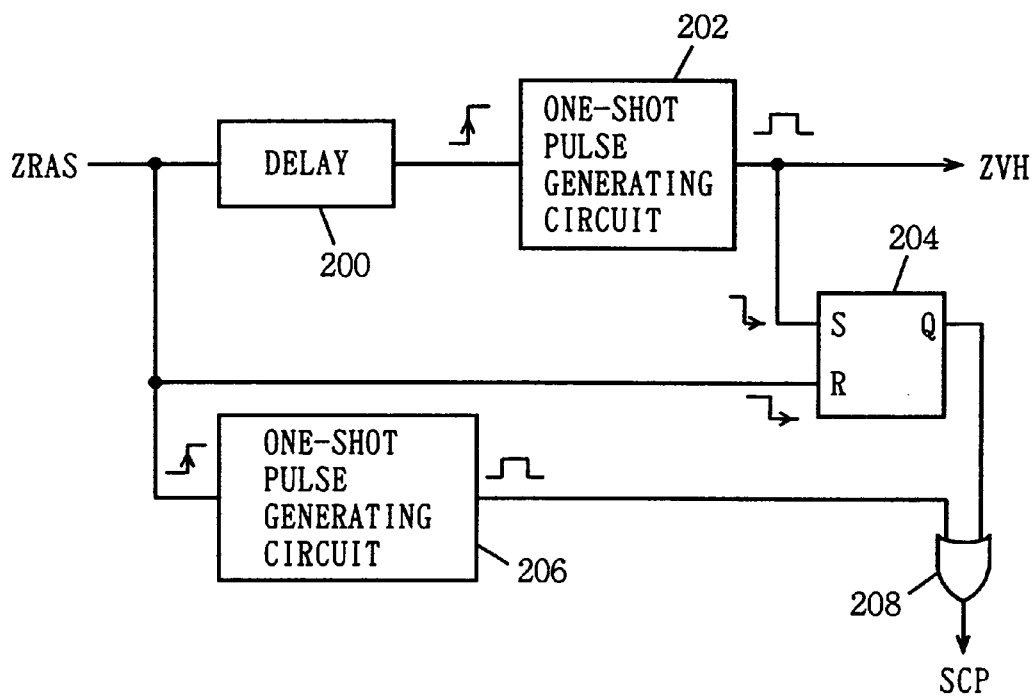
FIG. 52 schematically shows a structure of a cell plate voltage control signal generating circuit in the embodiment 11 of the invention.

FIG. 52 schematically shows a structure of a cell plate voltage control portion according to an embodiment 11 of the invention. In FIG. 52, the cell plate voltage control portion includes a delay circuit 200 which delays row address strobe signal ZRAS by a predetermined time, a one-shot pulse generating circuit 202 which generates a pulse signal of one-shot having a predetermined time width in response to rising of the output signal of delay circuit 200, a set/reset flip-flop 204 which is set in response to falling of output signal ZVH of one-shot pulse generating circuit 202 and is reset in response to falling of row address strobe signal ZRAS, a one-shot pulse generating circuit 206 which generates a pulse signal of one-shot having a predetermined width in response to rising of row address strobe signal ZRAS, an OR circuit 208 which receives the output signal from an output Q of set/reset flip-flop 204 and the output signal of one-shot pulse generating circuit 206.

Figure 53:
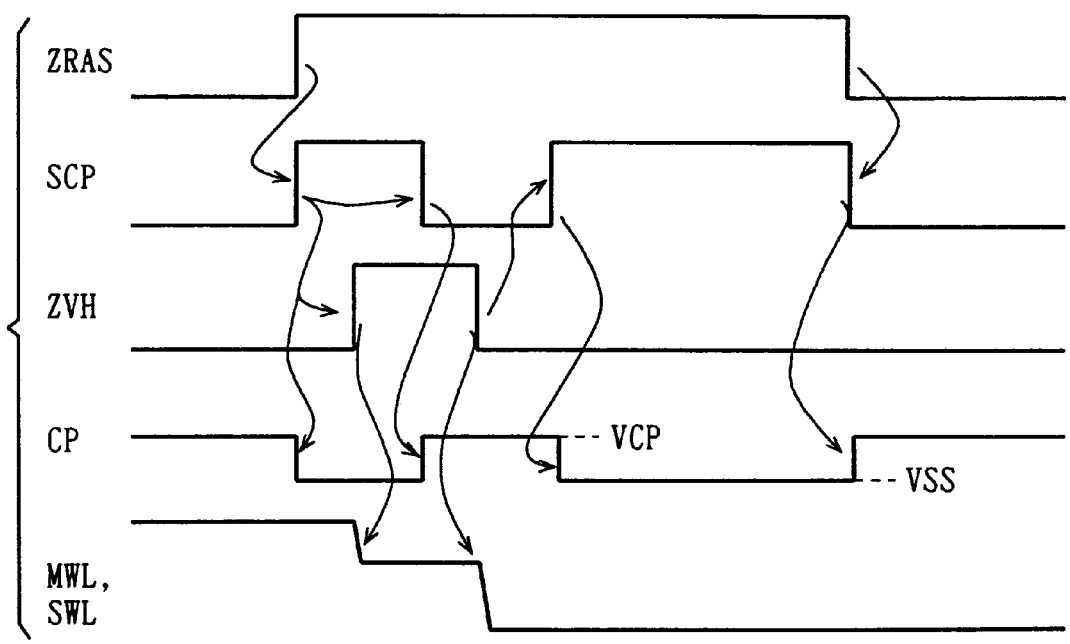
FIG. 53 is a signal waveform diagram representing an operation of a circuit shown in FIG. 52.

One-shot pulse generating circuit 202 generates a word line voltage switching signal ZVH which switches the voltage transmitted onto a selected word line, and OR circuit 208 generates cell plate voltage control signal SCP. These signals ZVH and SCP are the same as those from the circuits shown in FIGS. 11 and 31. An operation of the cell plate voltage control portion shown in FIG. 52 will be described below with reference to a signal waveform diagram of FIG. 53.

When row address strobe signal ZRAS rises from the active state of L-level to the inactive state of H-level, the output signal of one-shot pulse generating circuit 206 rises to and keeps H-level for a predetermined time. During this period, set/reset flip-flop 204 is in the reset state, and its output signal is at L-level so that cell plate voltage control signal SCP from OR circuit 208 keeps H-level for a predetermined period.

When the delay time of delay circuit 200 elapses, one-shot pulse generating circuit 202 generates a pulse signal of one-shot in response to the rising of the delayed row address strobe signal from delay circuit 200, and thereby raises word line voltage switching signal ZVH to H-level. When cell plate voltage control signal SCP attains H-level, the voltages on cell plate electrode nodes CP in the group including a selected memory cell lower to the ground voltage level.

When word line voltage switching signal ZVH rises to H-level, the voltage level on the selected word line (sub-word line SWL) lowers to reference voltage VCP level. These structures are the same as those shown in FIGS. 11 and 12.

When a predetermined period elapses, control signals SCP and ZVH fall to L-level. In response to the falling of signal ZVH, the selected main word line and the selected sub-word line fall to the ground voltage level and thus attain the unselected state.

When word line voltage switching signal ZVH falls from H-level to L-level, set/reset flip-flop 204 is set in response to the falling of switching signal ZVH after elapsing of a predetermined time so that the output signal thereof attains H-level, and cell plate voltage control signal SCP of OR circuit 208 is driven to H-level. Thereby, the voltage level on cell plate electrode node CP of a selected memory cell lowers to the ground voltage level. This state is kept while row address strobe signal ZRAS is at H-level or in the standby state.

When row address strobe signal ZRAS falls from H-level to L-level and a memory cycle starts, set/reset flip-flop 204 is reset, and the output signal thereof attains L-level so that cell plate voltage control signal SCP from OR circuit 208 attains L-level, and the voltage level on cell plate electrode node CP provided for the group including a selected memory cell rises from the ground voltage VSS level to the reference voltage VCP level again.

For lowering the voltage level on cell plate electrode node CP in the selected memory cell group from reference voltage VCP to ground voltage VSS during standby, it is necessary to use the row block select signal. Since cell plate voltage control signal SCP rises twice, the row address signal must be internally latched, and thereafter the control signal for selecting a cell plate electrode node must be reset. Therefore, the row select circuitry for selecting a word line is driven to the unselected state in response to the falling of cell plate voltage control signal SCP, and the row block select signal generating circuit for selecting a cell plate electrode node is kept active until second rising of cell plate voltage control signal SCP.

In this case, it is necessary to change the cell plate voltage only in the group including a selected memory cell, and the cell plate voltages in the other unselected memory cell group are merely required to be held at ground voltage VSS level. Therefore, the embodiment 11 of the invention can utilize the structure of cell plate voltage drive circuit 15 shown in FIGS. 15 and 16. This can be achieved by inverting logics of the row block select signal and the cell plate voltage control signal in the structure shown in FIGS. 15 and 16.

According to the embodiment 11 of the invention, as described above, the voltage on the cell plate electrode node is lowered to the ground voltage level during standby, and a selected memory cell has the voltage level on the cell plate electrode node thereof raised at the start of a next memory cycle. Therefore, it is possible to prevent application of a large electric field to the gate insulating film of the memory transistor without a loss of signal charges, and therefore the transistor of a memory cell can have improved breakdown voltage characteristics.

[Embodiment 12]

Figure 54:
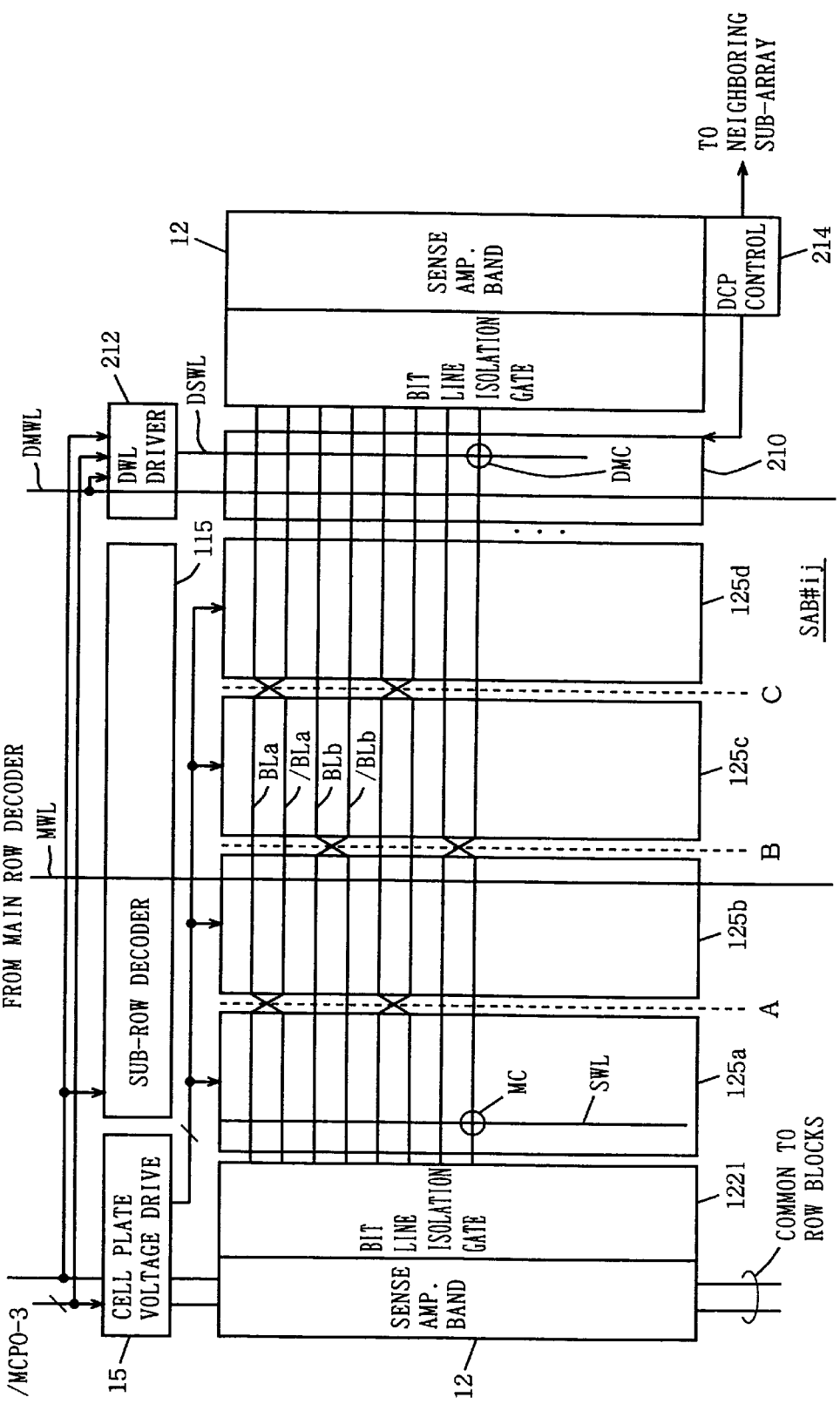
FIG. 54 schematically shows a structure of a main portion of a semiconductor memory device according to an embodiment of the invention.

FIG. 54 schematic shows a structure of a main portion of a semiconductor memory device according to an embodiment 12 of the invention. More specifically, FIG. 54 shows a structure related to one sub-array SAB#ij. Sub-array SAB#ij shown in FIG. 54 is provided with dummy cells DMC in addition to the components shown in FIG. 38.

Dummy cells DMC, of which arrangement will be described later, are usually arranged at predetermined crossings between a dummy sub-word line DSW and the columns of memory cells MC, i.e., bit line pairs BLa and /BLa, and BLb and /BLb . . .

Dummy sub-word line DSWL is driven by a dummy sub-word line driver (DWL driver) 212 in accordance with the signal potential on a dummy main word line DMWL, which in turn extends in parallel with main word lines MWL in the row direction and is arranged commonly to the sub-arrays included in the row block, as well as cell plate designating signals MCP0–MCP3 and word line sub-decode signal SDi.

In the memory cell array, there are arranged quadrisecting regions A, B and C, where bit lines in pairs cross each other in alternate positions. In this quadrisecting twist bit line structure, four dummy sub-word lines DSWL are required. For example, four dummy sub-word lines DSWL are selected in accordance with main cell plate designating signals MCP0–MCP3, respectively. Dummy cell DMC is provided with a dummy cell cell plate electrode layer 210 similar to cell plate electrode layers 125a–125d. Dummy cell cell plate electrode layer 210 has a voltage thereon controlled by a dummy cell cell plate electrode layer controllcircuit (DCP control circuit) 214 arranged neighboring to sense amplifier band 12. DCP control circuit 214 also controls the voltage on a cell plate electrode layer provided for the dummy cells included in a neighboring sub-array (not shown). An operation of the semiconductor memory device shown in FIG. 54 will now be described below with reference to a signal waveform diagram of FIG. 55.

When ending of a memory cycle is instructed, for example, in accordance with the externally applied row address strobe signal, the voltage level on a selected word line WL (main word line MWL and sub-word line SWL) is first lowered from power supply voltage VDD level to cell plate precharge voltage (reference voltage) VCP level. Dummy cell cell plate electrode layer 210 is held at the voltage level of (VCP/2).

At time tb, the voltage level on cell plate electrode node CP for the selected memory cell rises from ground voltage VSS to reference voltage VCP level. Thereby, the voltage level on storage node SN(H) storing H-level data rises from the former voltage level of (VDD−Vth) to the voltage level of (VDD−Vth+α·VDD) through the capacitive coupling of the memory cell capacitor. Meanwhile, the voltage level on storage node SN(L) holding L-level data temporarily rises in accordance with rising of voltage on this cell plate electrode node. However, since the corresponding sub-word line is in the selected state, storage nodes SN(L) is connected to the sense amplifier through a corresponding access transistor, and clamped at ground voltage VSS level.

Dummy cell cell plate electrode layer 210 is held at the predetermined voltage level of (VCP/2). A storage node DSN(H) of the dummy cell storing H-level data holds the voltage level of (VDD−Vth), and a storage node DSN(L) of the dummy cell holding L-level data holds ground voltage VSS level. Even if the voltage level on storage node SN(H) of the memory cell storing H-level data rises at time tb, the corresponding access transistor is off, and the voltage level on the bit line is at the level of (VDD−Vth). Therefore, even if the dummy sub-word line is in the selected state, the voltage level on storage node DSN(H) of the dummy cell storing H-level data does not change, and is held at the voltage level of (VDD−Vth).

At subsequent time tc, selected word line WL (MWL and SWL) is driven from reference voltage VCP to negative voltage VB. Thereby, the selected memory cells (i.e., memory cells connected to the selected sub-word line) are isolated from the corresponding sub-word line, and the voltage level on each storage node is held constant.

At time td, the voltage level on the cell plate electrode layer provided for the selected memory cells is driven from reference voltage VCP level to ground voltage VSS level, and storage node SN(H) of a memory cell holding H-level data lowers from the voltage level of (VDD−Vth+α·VCP) to the voltage level of (VDD−Vth). The voltage level on storage node SN(L) storing L-level data lowers from ground voltage VSS level to the level of (−αVCP) through the capacitive coupling of the memory cell capacitor. Also, the sense amplifier is deactivated at time td, and then the bit line equalizing operation is performed. In this state, dummy word lines DWL (DMWL and DSWL) are in the selected state so that the voltage on the bit line, which is precharged to the level of intermediate voltage (VDD−Vth)/2 between the bit line voltage (VDD−Vth) and the ground voltage VSS, is written into the dummy cell, and storage nodes DSN (H, L) of the dummy cells are driven to the intermediate voltage level of (VDD−Vth)/2.

At time te, the voltage levels on selected dummy word line DWL (dummy main word line DMWL and dummy sub-word line DSWL) is driven from power supply voltage VDD level to negative voltage VB level, and dummy cells DMC are isolated from the corresponding dummy sub-word line DSWL. In this state, the voltage level on the storage node of the dummy cell is equal to the level of intermediate voltage (VDD−Vth)/2.

At time tf, the next memory cycle starts so that the voltage on dummy cell cell plate electrode layer 210 provided for a selected row block, i.e., the voltage on cell plate node DCP of the dummy cell lowers from precharge voltage VCP/2 to ground voltage VSS. Thereby, the voltage levels on storage nodes DSN (H, L) of the dummy cells DMC attain the voltage level of ((VDD−Vth)/2−α·VCP/2).

At time tg, the main row decoder and sub-row decoder 115 select a main word line MWL and a sub-word line SWL, respectively, and the voltage level on the selected sub-word line SWL rises from negative voltage VB level to power supply voltage VDD level. At this time, the voltage levels on the dummy word line (dummy main word line DMWL and dummy sub-word line DSWL) provided for the selected row block rise from negative voltage VB level to power supply voltage VDD level. In the memory cell array, the data of memory cell MC connected to selected sub-word line SWL is read onto a corresponding bit line, and the data of dummy cell DMC is read onto a reference bit line which applies a reference voltage for the bit line receiving the data read from the selected memory cell MC. Storage node SN(H) storing H-level data is at the voltage level of (VDD−Vth), and storage node SN(L) of the memory cell storing L-level data is at the voltage level of (−α·VCP). Therefore, the voltage levels of the data stored on storage nodes DSN (H, L) of the dummy cells are intermediate the H- and L-levels, and consequently a voltage which is exactly intermediate the H- and L-level data can be applied to the reference bit line. Thereby, the sense amplifier senses the read voltage of the same magnitude with respect to the H- and L-level data, and the sensing margin is increased.

Then, the sense amplifier is activated at time th, and the voltage levels on storage nodes SN(H) and SN(L) are driven to the voltage level of (VDD−Vth) and ground voltage VSS level, respectively, and the voltage on the storage node of the dummy cell is likewise driven to the voltage level of (VDD−Vth) or ground voltage VSS level in accordance with the memory cell data read onto the corresponding bit line.

At time ti after completion of the operation of the sense amplifier, the voltage level on cell plate electrode node DCP of dummy cell DMC is driven to the initial reference voltage of VCP/2.

As shown in FIG. 54, the dummy cell is used, and the dummy word line selecting the dummy cell is driven to the unselected state after equalizing the bit lines. Thereby, storage nodes DSN (H, L) of the dummy cell each keep the voltage level equal to a level intermediate the H-level data and the L-level data. Thus, the voltage level of central value of the bit line amplitude is stored in the dummy cell, and the sense amplifier can have the same margins with respect to H- and L-level data so that the sense operation can be performed accurately.

Figure 55:
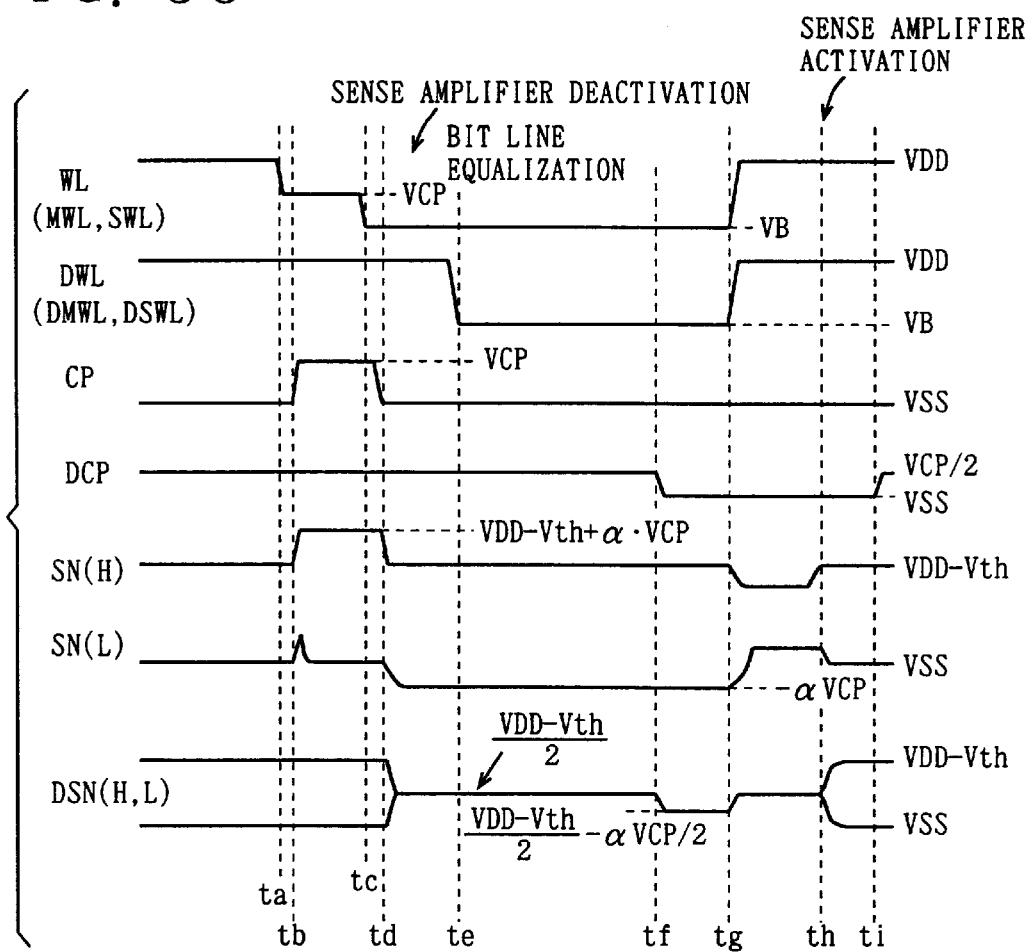
FIG. 55 is a signal waveform diagram representing an operation of the semiconductor memory device shown in FIG. 54.

In the structure shown in FIGS. 54 and 55, the voltage level on cell plate CP of a selected memory cell may be driven to reference voltage VCP level at time tf, as is done in the foregoing embodiment 11. In this case, the voltage level on storage node SN(L) storing L-level data does not lower, and has ground voltage VSS level. Meanwhile, the voltage level on storage node SN(H) storing H-level data rises to the level of (VDD−Vth+α·VCP). In this operation, when the voltage level on cell plate node DCP of dummy cell DMC rises from the level of VCP/2 to the level of VCP, the voltage levels on storage nodes DSN (H, L) of dummy cells go to (VDD−Vth+α·VCP)/2, and are set to an intermediate level between the H-level data and the L-level data. Therefore, the sensing margin can be increased, and the sensing operation can be performed accurately.

Figure 56:
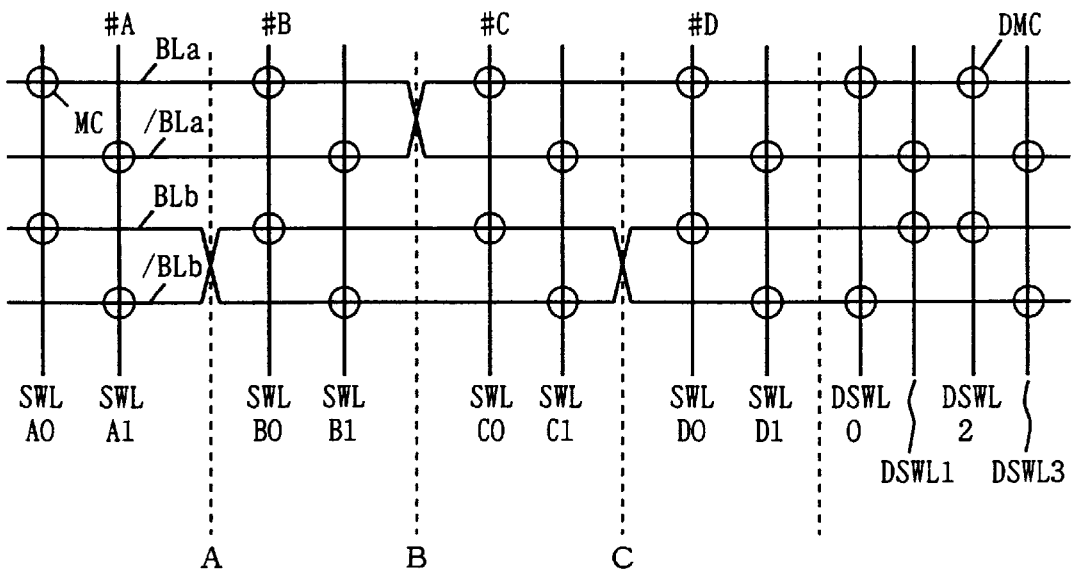
FIG. 56 shows an example of arrangement of dummy cells and memory cells shown in FIG. 54.

FIG. 56 schematically shows an arrangement of the memory cells and the dummy-cells in one sub-array. FIG. 56 representatively shows two bit line pairs BLa and /BLa, and BLb and /BLb.

In FIG. 56, bit lines pairs BLa and /BLa, and BLb and /BLb are divided by quadrisecting regions A, B and C into four regions #A, #B, #C and #D. Sub-word lines SWLA0 and SWLA1 are arranged in region #A, and sub-word lines SWLB0 and SWLB1 are arranged in region #B. Sub-word lines SWLC0 and SWLC1 are arranged in region #C, and sub-word lines SWLD0 and SWLD1 are arranged in region #D.

When sub-word line SWLA0 is selected, data stored in memory cells MC are transmitted onto bit lines BLa and BLb. When sub-word line SWLA1 is selected, data stored in memory cells MC are read onto complementary bit lines /BLa and /BLb. When sub-word line SWLB0 is selected, data stored in memory cells MC are read onto bit lines BLa and /BLb. When sub-word line SWLB1 is selected, data stored in memory cells MC are read onto bit lines /BLa and BLb. When sub-word line SWLC0 is selected, data stored in memory cells MC are read onto bit lines /BLa and /BLb. When sub-word line SWLC1 is selected, data stored in memory cells MC are read onto bit lines BLa and BLb. When sub-word line SWLB0 is selected, data stored in memory cells MC are read onto bit lines /BLa and BLb. When sub-word line SWLB1 is selected, data stored *nn in memory cells MC are read onto bit lines BLa and /BLb.

In regions #A–#D, therefore, memory cell data are read onto different sets of the bit lines depending on the position of a selected sub-word line. Dummy cells DMC are arranged such that data of dummy cells DMC are read onto reference bit lines in accordance with the above combination of bit lines.

The combinations of the bit lines onto which data of selected memory cells are read are four in number, and therefore four dummy sub-word lines DSWL0–DSWL3 are employed. For dummy sub-word line DSWL0, dummy cells DMC are arranged corresponding to the crossings with bit lines /BLa and /BLb. For dummy sub-word line DSWL1, dummy cells DMC are arranged corresponding to the crossings with bit lines BLa and BLb. For dummy sub-word line DSWL2, dummy cells DMC are arranged corresponding to the crossings with bit lines /BLa and BLb. For dummy sub-word line DSWL3, dummy cells DMC are arranged corresponding to the crossings with bit lines BLa and /BLb. Dummy sub-word lines DSWL0–DSWL3 are selectively driven to the selected state depending on the position of a selected sub-word line.

FIG. 57 shows a correspondence between selected sub-word lines and correspondingly selected dummy sub-word lines. When sub-word line SWLA0 or SWLC1 is selected, memory cell data are read onto bit lines BLa and BLb. In this case, therefore, dummy sub-word line DSWL0 is driven to the selected state for reading the data of dummy cell DMC onto reference bit lines /BLa and /BLb. When sub-word line SWLB0 or SWLD1 is selected, dummy sub-word line DSWL1 is selected. When sub-word line SWLC0 or SWLA1 is selected, dummy sub-word line DSWL2 is selected. When sub-word line SWLD0 or SWLB1 is selected, dummy sub-word line DSWL3 is selected.

The structure for selecting a dummy sub-word line in the above manner depends on the positional relationship between main word line MWL and sub-word line SWL. One dummy main word line DMWL is provided for dummy sub-word lines DSWL0–DSWL3. This dummy main word line DMWL is provided for driving a dummy sub-word line to the selected state for the sub-arrays included in a selected row block.

FIG. 58 schematically shows an arrangement of the memory cells provided for sub-word lines SWLa and SWLb arranged for one main word line MWL. FIG. 58 representatively shows bit lines BLa and /BLa–BLc and /BLc. In the arrangement of memory cells MC shown in FIG. 58, the same arrangement of the memory cells are employed for sub-word lines SWLa and SWLb arranged corresponding to main word line MWL. When sub-word line SWLa or SWLb is selected, data of memory cells MC are read onto true bit lines BLa, BLb and BLc. In this case, a dummy sub-word line is selected depending on the position of main word line MWL.

FIG. 59 schematically shows a structure of a dummy sub-word line drive circuit (DWL driver) in the memory cell arrangement shown in FIG. 58. In FIG. 59, an NAND circuit 212a, which receives the signal on dummy main word line DMWL, main cell plate voltage control signal (cell plate electrode designating signal) MCPi and address signal bit Am representing the position of a selected main word line, is provided for dummy sub-word line DSWLj. When all of these signals MCPi, DMWL and Am are in the selected state, corresponding dummy sub-word line DSWLj is driven to the selected state. Main cell plate voltage control signal MCPi is a cell plate electrode layer designating signal, and specifies any one of the region #A–#D to which the selected main word line belongs. Address signal bit Am specifies whether the selected main word line is an even-numbered one or an odd-numbered one in each of region #A–#D. Dummy main word line DMWL represents that the corresponding sub-array includes the selected main word line. Dummy sub-word line DSWLj can be driven to the selected state upon selection of sub-word line SWLa or SWLb depending on the position of selected main word line MWL. The signal for driving dummy main word line DMWL is produced from row block designating signal BSi.

Figure 60:
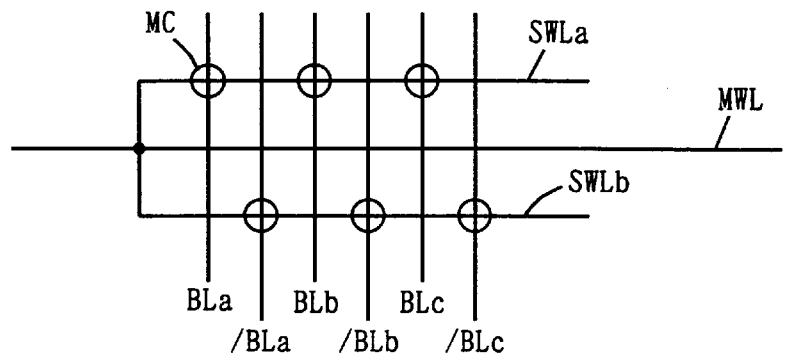
FIG. 60 shows another example of the arrangement of memory cells for the sub-word lines.

FIG. 60 schematically shows another example of the arrangement of the memory cells for the sub-word lines. The structure shown in FIG. 60 likewise includes two sub-word lines SWLa and SWLb for main word line MWL. Memory cells MC are arranged in different manners for different sub-word lines SWLa and SLWb. When sub-word line SWLa is selected, data of memory cells MC are read onto true bit lines BLa, BLb and BLc. When sub-word line SWLb is selected, data of memory cells MC are read onto complementary bit lines /BLa, /BLb and /BLc. In the arrangement of the memory cells shown in FIG. 60, the dummy word line to be selected depends on the position of a selected sub-word line.

Figure 61:
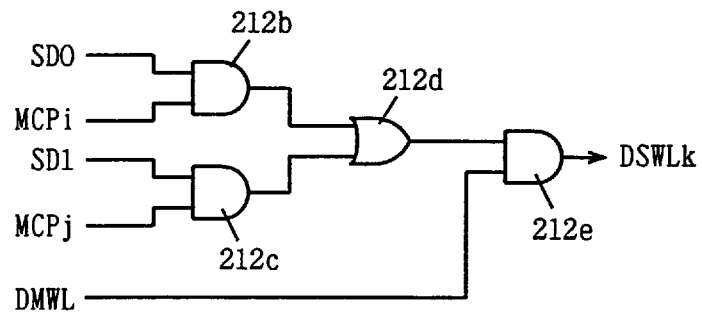
FIG. 61 schematically shows a structure of a dummy sub-word line selection control portion for the arrangement of memory cells shown in FIG. 60.

FIG. 61 schematically shows an example of the structure of a dummy word line select drive portion (WL driver) for the memory cell arrangement shown in FIG. 60. In FIG. 61, the word line select drive circuit includes an AND circuit 212b receiving word line sub-decode signal SD0 and cell plate voltage control signal MCPi, an AND circuit 212c receiving word line sub-decode signal SD1 and cell plate voltage control signal MCPj, an OR circuit 212d receiving the output signals of AND circuits 212b and 212c, and an AND circuit 212e receiving the output signal of OR circuit 212d and the signal on dummy main word line DMWL. AND circuit 212e generates a signal for selecting a corresponding dummy sub-word line DSWLk.

In the structure shown in FIG. 61, cell plate voltage control signals MCPi and MCPj designate the region to which a selected main word line belongs, and word line sub-decode signals SD0 and SD1 represent a selected one between sub-word lines SWLa and SWLb. Therefore, dummy sub-word line DSWLk can be selected depending on the position of a selected sub-word line (see FIG. 57).

In the structures shown in FIGS. 58 and 60, two sub-word lines SWLa and SWLb are provided for one main word line MWL. The structure shown in FIG. 59 or 61 may be expanded for the structure wherein more (e.g., four) sub-word lines are connected to one main word line MWL, whereby the dummy sub-word line corresponding to a selected sub-word line can be driven to the selected state.

Figure 62:
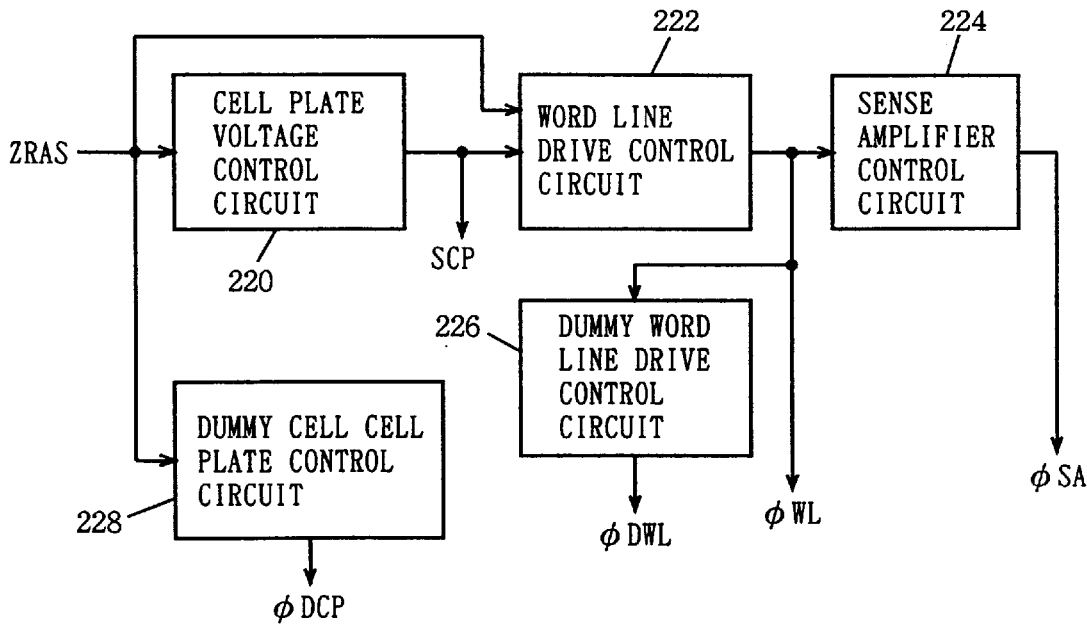
FIG. 62 schematically shows a structure of a control generating portion in the semiconductor memory device of the embodiment 12 of the invention.

FIG. 62 schematically shows a structure of a control portion of a semiconductor memory device of an embodiment 12 of the invention. In FIG. 62, the control circuit includes a cell plate voltage control circuit 220 generating cell plate voltage control signal SCP made active for a predetermined period in response to deactivation of row address strobe signal ZRAS, a word line drive control circuit 222 which receives row address strobe signal ZRAS and cell plate voltage control signal SCP for driving a word line WL (main word line and sub-word line), a sense amplifier control circuit 224 which activates the sense amplifier at a predetermined timing in accordance with the output signal of word line drive control circuit 222, a dummy word line drive control circuit 226 which drives a dummy word line DWL (dummy main word line and dummy sub-word line) to the selected state in response to the output signal of word line drive control circuit 222, and a dummy cell plate voltage control circuit 228 which lowers the cell plate voltage of the dummy cell in response to activation of row address strobe signal ZRAS for a predetermined period. The control signal from dummy cell cell plate voltage control circuit 228 is applied to the cell plate electrode node of a dummy cell.

Dummy cell cell plate voltage control circuit 228 drives the cell plate voltage of a dummy cell from reference voltage VCP/2 level to ground voltage VSS level after activation of row address strobe signal ZRAS, and keeps it until a predetermined time elapses from activation of sense amplifier activating signal from sense amplifier control circuit 224.

Dummy word line drive control circuit 226 drives a dummy main word line and a dummy sub-word line to the selected state at the same timing as driving of a main word line and a sub-word line to the selected state performed under the control of word line drive control circuit 222, and also drives a dummy word line DWL (dummy main word line and dummy sub-word line) to the unselected state after elapsing of a predetermined time since the word line WL (main word line and sub-word line) is driven to the unselected state under the control of word line drive control circuit 222.

Sense amplifier control circuit 224 activates sense amplifier activating signal SA after a predetermined period elapses since a word line WL is driven to the selected state under the control by word line drive control circuit 222. By utilizing the control circuits shown in FIG. 62, the signal waveforms shown in FIG. 55 can be achieved.

Figure 63:
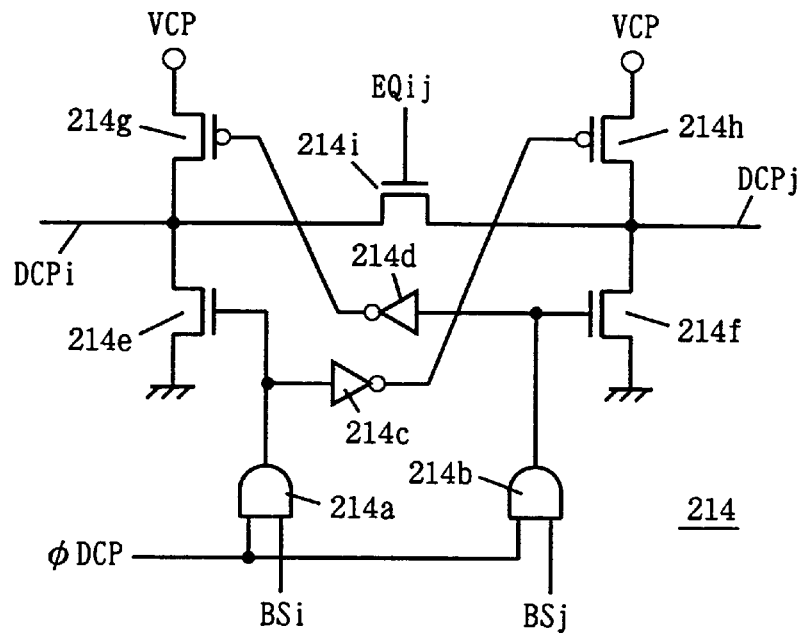
FIG. 63 shows an example of a structure of a DCP control circuit shown in FIG. 54.

FIG. 63 shows an example of a structure of the dummy cell cell plate voltage control circuit (DCP control) shown in FIG. 54. In FIG. 63, DCP control circuit 214 includes an AND circuit 214a receiving row block designating signal BSi and a control signal φDCP from dummy cell plate voltage control circuit 228 shown in FIG. 62, an AND circuit 214b receiving control signal (DCP and row block designating signal BSj, an inverter 214c inverting the output signal of AND circuit 214a, an inverter 214d inverting the output signal of AND circuit 214b, an n-channel MOS transistor 214e which is turned on to drive dummy cell cell plate electrode layer DCPi to the ground voltage level in response to the output signal of AND circuit 214a, an n-channel MOS transistor 214f which is turned on to drive dummy cell cell plate electrode layer DCPj in the neighboring sub-array to the ground voltage level in response to the output signal of AND circuit 214e, a p-channel MOS transistor 214g which is turned on to charge dummy cell cell plate electrode layer DCPi to reference voltage VCP level in response to the output signal of inverter 214d, a p-channel MOS transistor 214h which is turned on to precharge dummy cell cell plate electrode layer DCPj to reference voltage VCP level in response to the output signal of inverter 214c, an n-channel MOS transistor 214i which is turned on to connect the dummy cell cell plate electrode layers DCPi and DCPj in response to an equalize instructing signal EQij.

Equalize instructing signal EQij is produced by NORing the output signals of AND circuits 214a and 214b. Now, an operation of DCP control circuit 214 shown in FIG. 63 will be described below with reference to a waveform diagram of FIG. 64.

When row address strobe signal ZRAS falls from H-level to L-level and attains the active state, control signal φDCP from dummy cell cell plate voltage control circuit 228 shown in FIG. 62 is driven to the active state of H-level for a predetermined period. This control signal φDCP is held active at least until the sense amplifier operates and a memory cell data read onto a bit line is amplified and latched.

Figure 64:
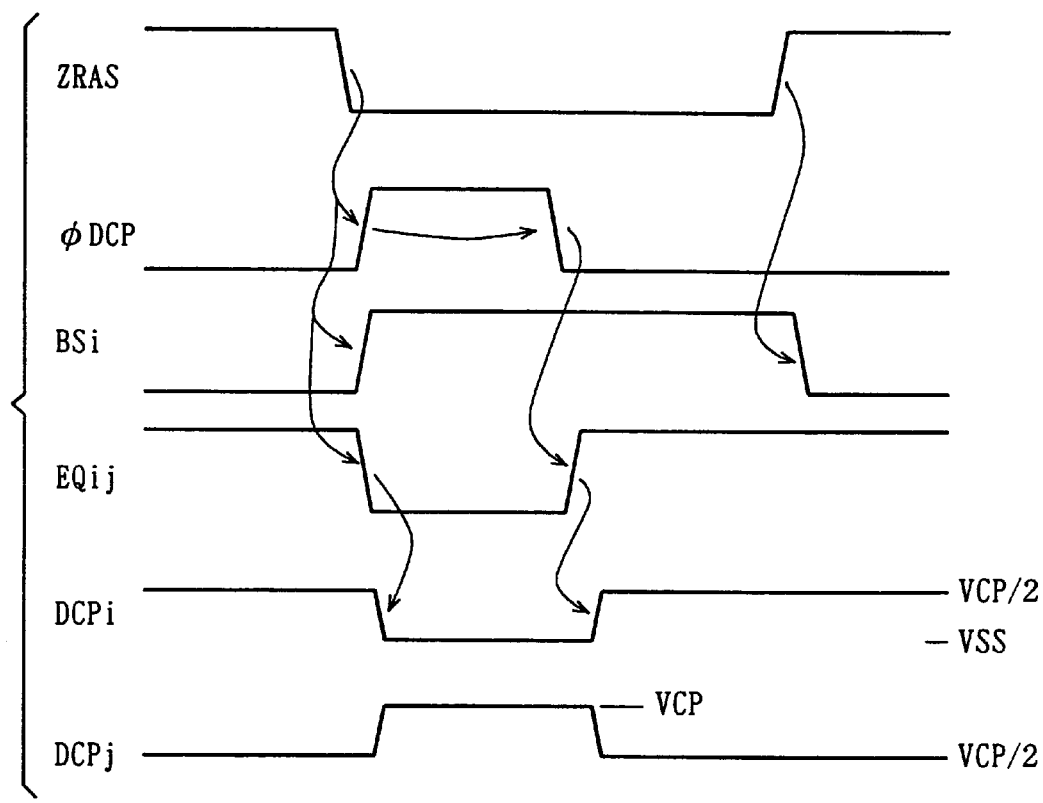
FIG. 64 is a signal waveform diagram representing an operation of the circuit shown in FIG. 63.
Figure 65:
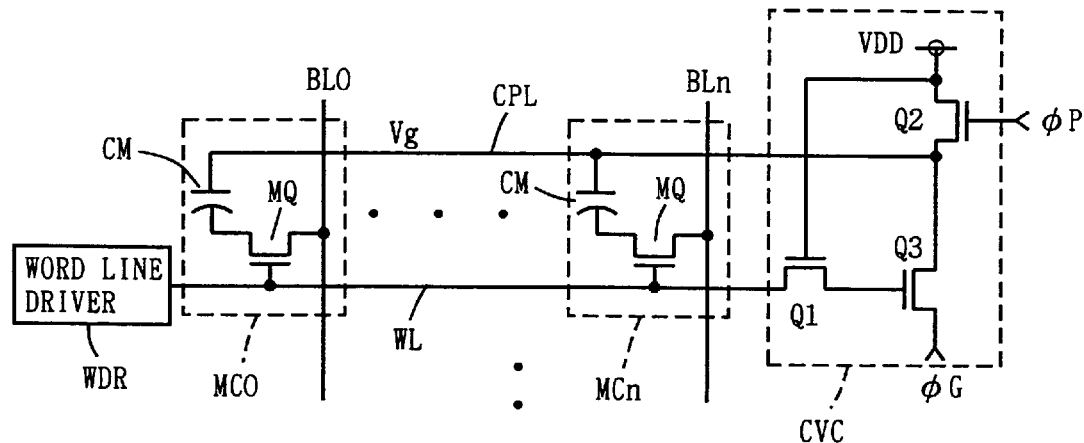
FIG. 65 schematically shows a structure of a main portion of a dynamic semiconductor memory device in the prior art.
Figure 66:
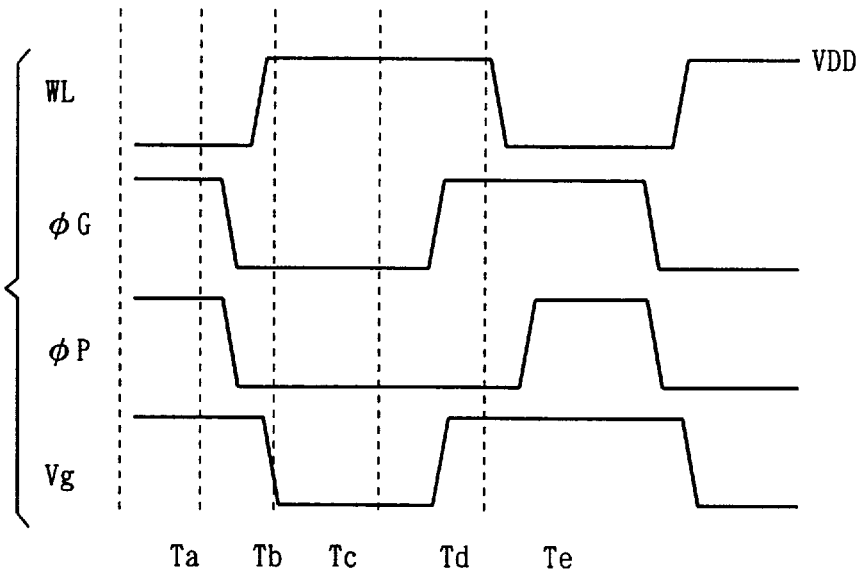
FIG. 66 is a signal waveform diagram representing an operation of the circuit shown in FIG. 65.
Figure 67:
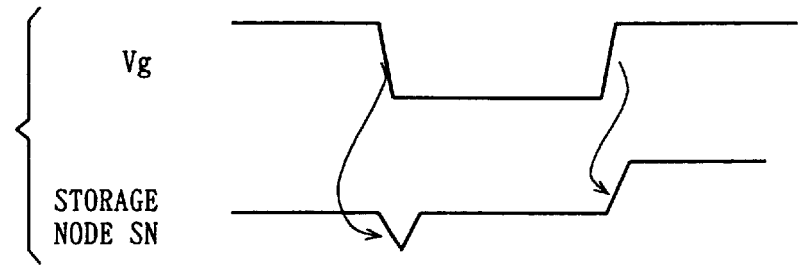
FIG. 67 shows a relationship between a voltage on a storage node and a cell plate voltage shown in FIG. 65.
Figure 68:
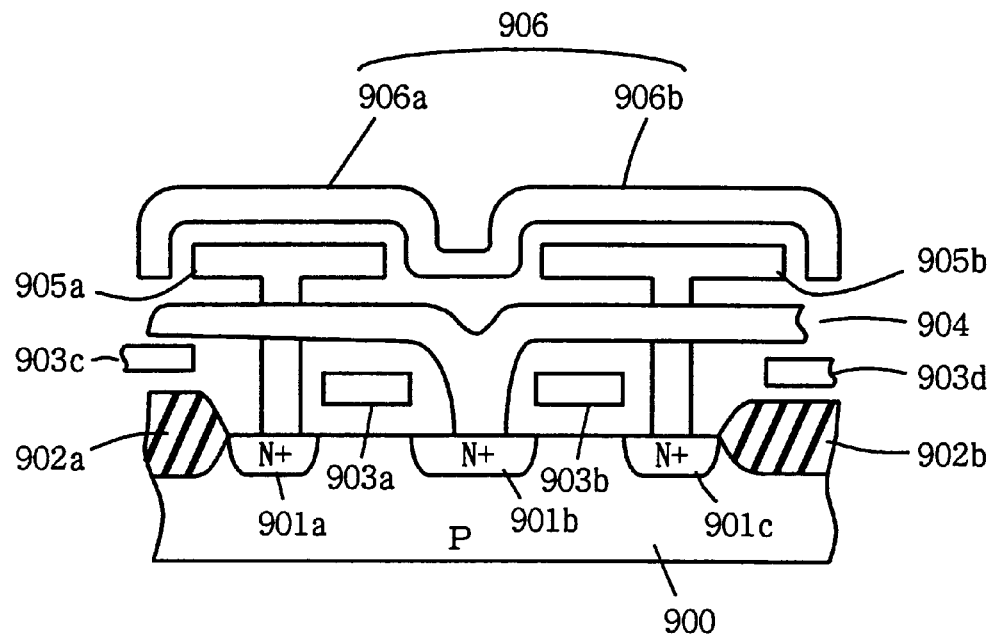
FIG. 68 schematically shows a cross sectional structure of memory cells in a conventional semiconductor memory device.

In response to the activation of row address strobe signal ZRAS, an applied address signal is decoded, and row block designating signal BS designating a row block rises to H-level. FIG. 64 shows an example in which row block designating signal BSi is selected. In this state, row block designating signal BSj maintains the unselected state of L-level.

In response to activation of row address strobe signal ZRAS, equalize instructing signal EQij attains L-level, and MOS transistor 214i is turned off so that dummy cell cell plate electrode layers DCPi and DCPj are isolated. Then, the output signal of AND circuit 214a attains H-level, and MOS transistor 214e is turned on so that dummy cell cell plate electrode layer DCPi is driven to the ground voltage level. Simultaneously, MOS transistor 214h is turned on, and dummy cell cell plate electrode layer DCPj in the neighboring sub-array is precharged to reference voltage VCP level.

When control signal φDCP falls from H-level to L-level, both MOS transistors 214e and 214h change from the on state to the off state. At the same time, equalize instructing signal EQij attains the active state of H-level in response to falling of control signal φDCP, and MOS transistor 214i is turned on. Thereby, dummy cell cell plate electrode layer DCPi at ground voltage VSS level is electrically connected to dummy cell cell plate electrode layer DCPj already precharged to reference voltage VCP. These dummy cell cell plate electrode layers DCPi and DCPj have the same parasitic capacitances, and are equalized to an intermediate voltage level of (VCP/2).

According to the embodiment 12, as described above, the dummy cell is utilized and the cell plate voltage on a dummy cell is changed by the same magnitude as the change in voltage on the storage node of a memory cell. When reading a memory cell data, the dummy cell generates the voltage intermediate the H- and L-level data onto a reference bit line, and thereby the margins of a sense amplifier with respect to the H- and L-level data increase so that accurate sensing operation is ensured.

According to the invention, as described above, an unselected word line is held at the voltage level different in polarity from the voltage of a selected word line. In a memory cell connected to an unselected word line, therefore, changing the voltage on the cell plate electrode node can boost the voltage on the storage node. Accordingly, data at H-level higher than the power supply voltage can be reliably stored on the storage node of a memory cell without using a boosted voltage in a semiconductor memory device having a high density and a high integration. Thereby, it is possible to provide the semiconductor memory having a high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device comprising:
   a memory cell array having a plurality of memory cells arranged in rows and columns, each of said plurality of memory cells including a capacitor having a cell plate electrode node for receiving a cell plate voltage and a storage node for storing information;
   a plurality of word lines provided corresponding to said rows and each connected to the memory cells in a corresponding row;
   row select circuitry for driving a selected word line arranged corresponding an addressed row to a non-boosted first voltage level for setting in a selected state, and holding an unselected word line at a second voltage level different in polarity from the first voltage; and
   cell plate drive circuits each provided corresponding to a set of the memory cells arranged in a predetermined number of rows for changing voltages on the cell plate electrode nodes of the capacitors of the memory cells in a corresponding set in a pulse form when said corresponding set includes the addressed row, after said row select circuitry drives the selected word line to the selected state and sensing operation on data of the memory cells in the addressed row is completed.

2. A dynamic semiconductor memory device comprising:

a memory cell array having a plurality of memory cells arranged in rows and columns, each of said plurality of memory cells including a capacitor having a cell plate electrode node for receiving a cell plate voltage and a storage node for storing information;

a plurality of word lines provided corresponding to said rows and each connected to the memory cells in a corresponding row;

row select circuitry for driving a selected word line arranged corresponding an addressed row to a non-boosted first voltage level for setting in a selected state, and holding an unselected word line at a second voltage level different in polarity from the first voltage; and cell plate drive circuits each provided corresponding to a set of the memory cells arranged in a predetermined number of rows for changing voltages on the cell plate electrode nodes of the capacitors of the memory cells in a corresponding set in a pulse form when said corresponding set includes the memory cell array having a plurality of memory cells arranged in rows and columns, each of said plurality of memory cells including a capacitor having a cell plate electrode node for receiving a cell plate voltage and a storage node for storing information, a plurality of word lines provided corresponding to said rows and each connected to the memory cells in a corresponding row;

row select circuitry for driving a selected word line arranged corresponding an addressed row to a non-boosted first voltage level for setting in a selected state, and holding an unselected word line at a second voltage level different in polarity from the first voltage; and cell plate drive circuits each provided corresponding to a set of the memory cells arranged in a predetermined number of rows for changing voltages on the cell plate electrode nodes of the capacitors of the memory cells in a corresponding set in a pulse form when said when said corresponding set includes the addressed row;

wherein said memory array is divided into a plurality of sub-arrays in row and column directions, each of said plurality of sub-arrays including memory cells arranged in rows and columns;

said plurality of word lines include (i) a plurality of sub-word lines arranged corresponding to respective rows of the memory cells in each of said plurality of sub-arrays and each connected to the memory cells in a corresponding row, and (ii) a plurality of main word lines each provided commonly for the sub-arrays aligned in said row direction and each provided corresponding to a predetermined number of the sub-word lines in each of said sub-arrays aligned in said row direction;

said row select circuitry includes means for coupling a sub-word line in a sub-array including the addressed row to a corresponding main word line; and said cell plate drive circuits include a plurality of drive circuits each provided corresponding to a set of the predetermined number of row(s) in each of said sub-arrays for changing the cell plate voltages of the capacitors of the memory cells in the rows of a corresponding set in the sub-arrays when the corresponding set of the rows in the sub-arrays includes said addressed row.

3. The dynamic semiconductor memory device according to claim 2, wherein each of said plurality of drive circuits commonly controls the cell plate voltages of the capacitors of the memory cells included in a corresponding sub-array.

4. The dynamic semiconductor memory device according to claim 2, wherein each of said plurality of sub-arrays is divided into a predetermined number of sets of the sub-word lines, said predetermined number is two or more, said drive circuits are provided corresponding to the sets of the sub-word lines, respectively, and each of said plurality of drive circuits changes the cell plate voltages of the capacitors of memory cells connected to the sub-word lines of a corresponding set when said sub-word lines of the corresponding set include the addressed row.

5. The dynamic semiconductor memory device according to claim 2, further comprising:

a plurality of bit line pairs arranged corresponding to the columns of said plurality of sub-arrays, respectively, each of said plurality of bit lines connected to the memory cells in a corresponding column;

a plurality of first sense amplifiers provided corresponding to the bit line pairs in each of the sub-arrays, respectively, each of said plurality of first sense amplifiers for driving and holding a bit line at a higher level in a corresponding bit line pair to and at a predetermined high voltage level;

a plurality of second sense amplifiers shared between adjacent sub-arrays neighboring thereto in the column direction, arranged corresponding to neighboring columns of the adjacent sub-arrays, each of said plurality of second sense amplifiers provided for driving a bit line at a lower potential in the bit line pair of a corresponding column to a predetermined low level; and a plurality of connection gates arranged between the bit line pairs and corresponding second sense amplifiers for connecting the bit line pairs to the corresponding second sense amplifiers in response to a connection instruction signal at said first voltage level, respectively.

6. The dynamic semiconductor memory device according to claim 2, further comprising:

a plurality of bit line pairs arranged corresponding to the columns of the sub-arrays, respectively, each of said plurality of bit line pairs connected to the memory cells in a corresponding column;

a plurality of sense amplifiers provided corresponding to the columns of the sub-arrays and including sense amplifiers each commonly used by a corresponding column of adjacent sub-arrays neighboring thereto in said column direction, for differentially amplifying potentials on the bit line pairs in corresponding columns;

a plurality of connection gates arranged between said plurality of sense amplifiers and corresponding bit line pairs for connecting the corresponding bit line pairs to corresponding sense amplifiers in response to a connection instruction signal at said first voltage level, respectively, each of said plurality of connection gates including a field effect transistor having a threshold voltage; and a bit line potential holding circuit for setting and holding the bit lines of each of said plurality of bit line pairs at a voltage level substantially equal to half a difference in absolute value between the first voltage and said threshold voltage at least in a standby cycle.

7. The dynamic semiconductor memory device according to claim 1, wherein
said cell plate drive circuits includes means for setting the cell plate voltage to a first reference voltage level smaller in absolute value than said first and second voltages in a standby cycle, and, in the change in the pulse form, changing said cell plate voltage to said first reference voltage level after changing said cell plate voltage from said first reference voltage level to a second reference voltage level higher than said second voltage level.

8. The dynamic semiconductor memory device according to claim 2, further comprising:
a plurality of bit line pairs arranged corresponding to the columns of said plurality of sub-arrays, respectively, each of said plurality of bit line pairs connected to the memory cells in a corresponding column;
a plurality of sense amplifiers arranged being commonly used by the columns of adjacent sub-arrays neighboring thereto in said column direction for differentially amplifying potentials on the bit line pairs in corresponding columns; and
a plurality of connection gates arranged between said plurality of sense amplifiers and corresponding bit line pairs for connecting the corresponding bit line pairs to corresponding sense amplifiers in response to a connection instruction signal at said first voltage level, respectively, each of said plurality of connection gates including a field effect transistor having a threshold voltage, wherein
said cell plate drive circuits includes means for setting said cell plate voltage to a first reference voltage level smaller in absolute value than said first voltage at least in a standby cycle, and, in the change of the cell plate voltage in the pulse form, changing said cell plate voltage to said first reference voltage level after changing said cell plate voltage from said first reference voltage level to a second reference voltage level higher than said second voltage level.

9. The dynamic semiconductor memory device according to claim 7, wherein
said row select circuitry includes means for lowering the voltage level on said selected word line on the addressed row from said first voltage level at the time of change of said cell plate voltage in the pulse form.

10. The dynamic semiconductor memory device according to claim 1, wherein
said row select circuitry includes row select circuits provided corresponding to the word lines for driving corresponding word lines to the first voltage level when the corresponding word lines are arranged corresponding to addressed rows, respectively, and
each of said row select circuits includes (i) a first insulated gate field effect transistor of a first conductivity type connected between a node supplied with the first voltage and a corresponding word line and receiving on a gate thereof a word line select signal, (ii) a second insulated gate field effect transistor of a second conductivity type receiving on a gate thereof first voltage and transmitting the word line select signal, and (iii) a third insulated gate field effect transistor of the second conductivity type connected between the corresponding word line and a node supplied with the second voltage, and receiving on a gate thereof a voltage signal transmitted through said second insulated gate field effect transistor of the second conductivity type.

11. The dynamic semiconductor memory device according to claim 1, wherein
said cell plate drive circuits include means configured to be responsive to a memory cycle ending instruction of a memory access instructing signal instructing start and end of the memory cycle for accessing a memory cell for setting said cell plate voltage to a reference voltage level between the first and second voltages in the change of the cell plate voltage in the pulse form, and subsequently changing said cell plate voltage to a predetermined low voltage level between said reference voltage and said second voltage.

12. The dynamic semiconductor memory device according to claim 10, wherein each of the row selects circuits further comprises
an insulated gate field effect transistor arranged in series with said first insulated gate field effect transistor of said first conductivity type, connected between a node outputting a word line drive signal to be transmitted on a corresponding word line and a node receiving said first voltage, for relaxing a voltage applied to said first insulated gate field effect transistor of said first conductivity type.

13. The dynamic semiconductor memory device according to claim 1, wherein said row select circuitry includes a plurality of row select circuits provided corresponding to the word lines for driving a word line corresponding to the addressed row to the selected state,
a plurality of local voltage transmission lines arranged corresponding to predetermined sets of the word lines for transmitting said second voltage to corresponding row select circuits;
a main voltage transmission line arranged commonly to said plurality of local voltage transmission lines for transmitting said second voltage; and
a fusible and electrically conductive link element arranged between each of said plurality of local voltage transmission lines and said main voltage transmission line.

14. The dynamic semiconductor memory device according to claim 6, further comprising:
a plurality of dummy cells each including a transistor and a capacitor having with a cell plate node and a storage node, arranged in rows and columns, and arranged in common columns with said plurality of memory cells;
a plurality of dummy word lines arranged corresponding to said plurality of rows of said dummy cells, respectively, each of said plurality of dummy word lines connected to the dummy cells in a corresponding row;
dummy word line select circuitry for selecting a dummy word line from said plurality of dummy word lines in accordance with an address signal, said dummy word line select circuitry including means for driving the selected dummy word line to the unselected state after completion of the change in cell plate voltage of the memory cell and after setting of the bit line voltage on the bit lines by said bit line potential holding circuit; and
dummy cell plate voltage drive circuitry provided for said plurality of dummy cells for driving the voltage on the cell plate node of at least a dummy cell connected to said selected dummy word line among said plurality of dummy cells from a predetermined low voltage level between the first and second voltages to a reference voltage level between said predetermined low voltage level and the second voltage level for a predetermined period in response to a memory access instructing signal instructing start of selection of a memory cell.

15. The dynamic semiconductor memory device according to claim 9, further comprising:

a plurality of bit line pairs arranged corresponding to the columns of said plurality of memory cells, respectively, each of the bit line pairs connected to the memory cells in a corresponding column;

a plurality of dummy cells each including a capacitor having a cell plate node and a storage node and a transistor for access to said capacitor, arranged in rows and columns, and arranged in common columns with said plurality of memory cells;

a plurality of dummy word lines arranged corresponding to said plurality of rows of said dummy cells, respectively, each of said plurality of dummy cells connected to the dummy cells in a corresponding row;

bit line potential holding circuitry for setting said plurality of bit line pairs to a predetermined voltage level in response to a memory cycle ending instruction of a memory access instructing signal instructing start and end of access to a memory cell;

dummy word line select circuitry for selecting a corresponding dummy word line from said plurality of dummy word lines in accordance with an address signal designating a row of memory cells, said dummy word line select circuitry including means for driving the selected dummy word line to the unselected state after completion of the change in cell plate voltage of the memory cells from the first voltage level to the second voltage level and after setting of the bit line potential by said bit line potential holding circuit; and dummy cell plate voltage drive circuitry provided for said plurality of dummy cells for driving the cell plate voltage of a dummy cell provided for a dummy word line designated by said address signal from said second reference voltage level to said first reference voltage level for a predetermined period in response to memory cycle start instruction of said memory access instructing signal.

16. The dynamic semiconductor memory device according to claim 13, further comprising:

a plurality of main word lines arranged corresponding to predetermined sets of the word lines for selecting word lines in the corresponding sets, wherein first sets each including a plurality of local voltage transmission lines and second sets each including a plurality of main word lines are arranged alternately to each other.

17. The dynamic semiconductor memory device according to claim 8, wherein said row select circuitry includes means for lowering the voltage level on a word line corresponding to the addressed row from said first voltage level at the time of change of said cell plate voltage to said low voltage level.

18. The dynamic semiconductor memory device according to claim 17, further comprising:

a plurality of bit line pairs arranged corresponding to the columns of said plurality of memory cells, respectively, each of the bit line pairs connected to the memory cells in a corresponding column;

a plurality of dummy cells each including a capacitor having a cell plate node and a storage node and a transistor for access to said capacitor, arranged in rows and columns, and arranged in common columns with said plurality of memory cells;

a plurality of dummy word lines arranged corresponding to the rows of said plurality of dummy cells, respectively, each of said plurality of dummy word lines connected to the dummy cells in a corresponding row;

bit line potential holding circuitry for setting said plurality of bit line pairs to a predetermined voltage level in response to a memory cycle ending instruction of a memory access instructing signal instructing start and end of access to a memory cell;

dummy word line select circuitry for select a dummy word line from said plurality of dummy word lines in accordance with an address signal designating a row of memory cells, said dummy word line select circuitry including means for driving the selected dummy word line to the unselected state after completion of the change in cell plate voltage of the memory cells from the first voltage level to the second voltage level and after setting of the bit line potential by said bit line potential holding circuitry; and dummy cell plate voltage drive circuitry provided for said plurality of dummy cells for driving the cell plate voltage of the dummy cells provided for a dummy word line corresponding to a row designated by said address signal from said first reference voltage level to said second reference voltage level for a predetermined period in response to a memory cycle start instruction of said memory access instructing signal.

19. The semiconductor memory device according to claim 1, wherein the columns of said plurality of memory cells have bit line pairs arranged corresponding thereto, and the bit line pairs are divided into a plurality of groups by division regions in the column direction and have twisted portions arranged on said division regions, and the cell plate nodes of the memory cells are grouped into said plurality of groups by said division regions, and said cell plate drive circuits are provided corresponding to the respective groups.

20. The semiconductor memory device according to claim 2, wherein the columns of the memory cells in each of said plurality of sub-arrays are divided into a plurality of groups by division regions in the column direction, and have bit line pairs arranged corresponding thereto, said bit line pairs have twisted portions on the division regions, and the cell plate nodes of the memory cells are grouped into said plurality of groups, and said cell plate drive circuits drive the cell plate voltage on a group unit.

* * * * *